US012347777B2

(12) United States Patent
Lee et al.

(10) Patent No.: US 12,347,777 B2
(45) Date of Patent: Jul. 1, 2025

(54) SEMICONDUCTOR DEVICE AND A DATA STORAGE SYSTEM INCLUDING THE SAME

(71) Applicant: SAMSUNG ELECTRONICS CO., LTD., Suwon-si (KR)

(72) Inventors: Jaeshin Lee, Hwaseong-si (KR); Sunil Shim, Seoul (KR); Juyoung Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 665 days.

(21) Appl. No.: 17/701,097

(22) Filed: Mar. 22, 2022

(65) Prior Publication Data

US 2022/0310515 A1 Sep. 29, 2022

(30) Foreign Application Priority Data

Mar. 24, 2021 (KR) ........................ 10-2021-0038071

(51) Int. Cl.
*H01L 23/535* (2006.01)
*H01L 23/532* (2006.01)
*H10B 43/27* (2023.01)
*H10B 43/40* (2023.01)

(52) U.S. Cl.
CPC ........ *H01L 23/535* (2013.01); *H01L 23/5329* (2013.01); *H10B 43/27* (2023.02); *H10B 43/40* (2023.02)

(58) Field of Classification Search
CPC ... H01L 23/535; H01L 23/5329; H10B 43/27; H10B 43/40; H10B 41/27; H10B 41/50; H10B 43/10; H10B 43/50; H10B 41/10; H10B 43/35; H10B 43/30; H10B 43/20
See application file for complete search history.

(56) References Cited

U.S. PATENT DOCUMENTS

| | | | |
|---|---|---|---|
| 10,224,373 B2 | 3/2019 | Sel et al. | |
| 10,319,680 B1* | 6/2019 | Sel | .................. H10B 41/27 |
| 10,553,606 B2 | 2/2020 | Kim et al. | |
| 10,680,010 B2 | 6/2020 | Hua | |
| 10,854,621 B2 | 12/2020 | Hua et al. | |

(Continued)

FOREIGN PATENT DOCUMENTS

KR 10-2017-0142774 12/2017

*Primary Examiner* — Wasiul Haider
(74) *Attorney, Agent, or Firm* — MORGAN, LEWIS & BOCKIUS LLP

(57) ABSTRACT

A semiconductor device includes a structure including a stack structure including a first stack structure and a second stack structure on the first stack structure; a memory vertical structure penetrating the structure; a support vertical structure including a portion penetrating the structure and including an air gap; and a peripheral contact plug, wherein the first and second stack structures includes interlayer insulating layers and gate layers alternately stacked, a side of the memory vertical structure includes a slope changing portion, the peripheral contact plug includes an upper region disposed on a level higher than an upper surface of an uppermost gate layer, the upper region of the peripheral contact plug includes a first region, a second region and a connection region between the first and second regions, and the connection region has a slope different from a slope of at least one of the first and second regions.

20 Claims, 35 Drawing Sheets

(56) References Cited

U.S. PATENT DOCUMENTS

| | | |
|---|---|---|
| 2017/0365616 A1 | 12/2017 | Kang et al. |
| 2020/0272373 A1 | 8/2020 | Yada |
| 2020/0273873 A1 | 8/2020 | Hua et al. |
| 2020/0328223 A1 | 10/2020 | Lai et al. |

* cited by examiner

SEMICONDUCTOR DEVICE AND A DATA STORAGE SYSTEM INCLUDING THE SAME

CROSS TO REFERENCE TO RELATED APPLICATION(S)

This application claims priority under 35 U.S.C. 119 to Korean Patent Application No. 10-2021-0038071 filed on Mar. 24, 2021 in the Korean intellectual Property Office, the disclosure of which is incorporated by reference herein in its entirety.

TECHNICAL FIELD

Example embodiments of the present disclosure relate to a semiconductor device and a data storage system including the same.

DISCUSSION OF RELATED ART

There is increasing demand for a semiconductor device that offers higher-capacity storage potential than a semiconductor device including cells arranged two-dimensionally. Accordingly, a semiconductor device including memory cells arranged three-dimensionally, has been developed.

SUMMARY

An example embodiment of the present disclosure is to provide a semiconductor device which may increase integration density and reliability.

An example embodiment of the present disclosure is to provide a data storage system including a semiconductor device.

According to an example embodiment of the present disclosure, a semiconductor device includes: a first structure; a second structure including a stack structure including a first stack structure on the first structure and a second stack structure on the first stack structure, and an intermediate insulating layer covering at least a portion of the stack structure; an insulating structure on the second structure; a memory vertical structure penetrating the second structure; a support vertical structure penetrating the second structure and including an air gap and a support layer defining at least a lower portion and a sidewall of the air gap; a peripheral contact plug penetrating the second structure; and gate contact plugs, wherein each of the first and second stack structures includes interlayer insulating layers and gate layers alternately stacked, wherein the gate layers are spaced apart from each other in a vertical direction in a first region and include gate pads arranged in a second region adjacent to the first region, wherein the gate contact plugs are electrically connected to the gate pads, wherein the memory vertical structure penetrates the stack structure in the first region, wherein the memory vertical structure includes a slope changing portion between an uppermost gate layer among the gate layers of the first stack structure and a lowermost gate layer among the gate layers of the second stack structure, wherein the support vertical structure penetrates at least a portion of the gate layers in the second region, wherein the air gap of the support vertical structure includes a portion disposed on the same level as the slope changing portion of the memory vertical structure, wherein the peripheral contact plug is spaced apart from the gate layers, wherein the peripheral contact plug includes an upper region disposed on a level higher than an upper surface of an uppermost gate layer among the gate layers of the stack structure and a lower region disposed on a level lower than the upper surface of the uppermost gate layer among the gate layers of the stack structure, wherein the upper region of the peripheral contact plug includes a first portion, a second portion and a connection portion disposed between the first portion and the second portion, and wherein the connection portion has a slope different from a slope of at least one of the first portion and the second portion.

According to an example embodiment of the present disclosure, a semiconductor device includes: a pattern structure including a silicon layer; a stack structure including a first stack structure and a second stack structure on the first stack structure on the pattern structure, wherein each of the first and second stack structures includes interlayer insulating layers and gate layers alternately stacked, and in the first and second stack structures, the gate layers are vertically stacked and spaced apart from each other in a first region, and include gate pads arranged in a staircase shape in a second region adjacent to the first region; an insulating structure on the stack structure; separation structures penetrating the stack structure and extending in the insulating structure in the first region and the second region; a memory vertical structure penetrating the stack structure between the separation structures in the first region; a support vertical structure penetrating the stack structure and including an air gap between the separation structures in the second region; gate contact plugs in contact with the gate pads; a peripheral contact plug spaced apart from the gate layers; and bit line contact plugs on the memory vertical structure, wherein the peripheral contact plug includes an upper region disposed on a level higher than an upper surface of an uppermost gate layer among the gate layers of the stack structure and a lower region disposed on a level lower than the upper surface of the uppermost gate layer among the gate layers of the stack structure, wherein the upper region of the peripheral contact plug includes a first portion, a connection portion disposed below the first portion, and a second portion disposed below the connection portion, wherein a side of the connection portion has a slope different from a slope of at least one of a side of the first portion and the second portion, wherein a side of the memory vertical structure includes a slope changing portion in which a slope of the side of the memory vertical structure changes on a level between an uppermost gate layer among the gate layers of the first stack structure and a lowermost gate layer among the gate layers of the second stack structure, and wherein a side of the lower region of the peripheral contact plug is substantially vertical on the level between the uppermost gate layer among the gate layers of the first stack structure and the lowermost gate layer among the gate layers of the second stack structure.

According to an example embodiment of the present disclosure, a data storage system includes: a main board; a semiconductor device on the main board; and a controller electrically connected to the semiconductor device on the main board, wherein the semiconductor device includes: a pattern structure including a silicon layer; a stack structure including a first stack structure and a second stack structure on the first stack structure on the pattern structure, wherein each of the first and second stack structures includes interlayer insulating layers and gate layers alternately stacked, and in the first and second stack structures, the gate layers are vertically stacked and spaced apart from each other in a first region, and include gate pads arranged in a staircase shape in a second region adjacent to the first region an insulating structure on the stack structure; separation structures penetrating the stack structure and extending into the insulating structure in the first region and the second region;

a memory vertical structure penetrating the stack structure between the separation structures in the first region; a support vertical structure penetrating the stack structure and including an air gap between the separation structures in the second region; gate contact plugs in contact with the gate pads; a peripheral contact plug spaced apart from the gate layers; and bit line contact plugs on the memory vertical structure, wherein the peripheral contact plug includes an upper region disposed on a level higher than an upper surface of an uppermost gate layer among the gate layers of the stack structure and a lower region disposed on a level lower than the upper surface of the uppermost gate layer the gate layer among of the stack structure, wherein the upper region of the peripheral contact plug includes a first portion, a connection portion disposed below the first portion, and a second portion disposed below the connection portion, wherein a side of the connection portion has a slope different from a slope of at least one of a side of the first portion and a side of the second portion, wherein a side of the memory vertical structure includes a slope changing portion on a level between an uppermost gate layer among the gate layers of the first stack structure and a lowermost gate layer among the gate layers of the second stack structure, and wherein a side of the lower region of the peripheral contact plug is substantially vertical on the level between the uppermost gate layer among the gate layers of the first stack structure and the lowermost gate layer among the gate layers of the second stack structure.

BRIEF DESCRIPTION OF THE DRAWINGS

The above and other features of the present disclosure will be more clearly understood from the following detailed description, taken in conjunction with the accompanying drawings, in which.

DETAILED DESCRIPTION OF THE EMBODIMENTS

Figure 1:
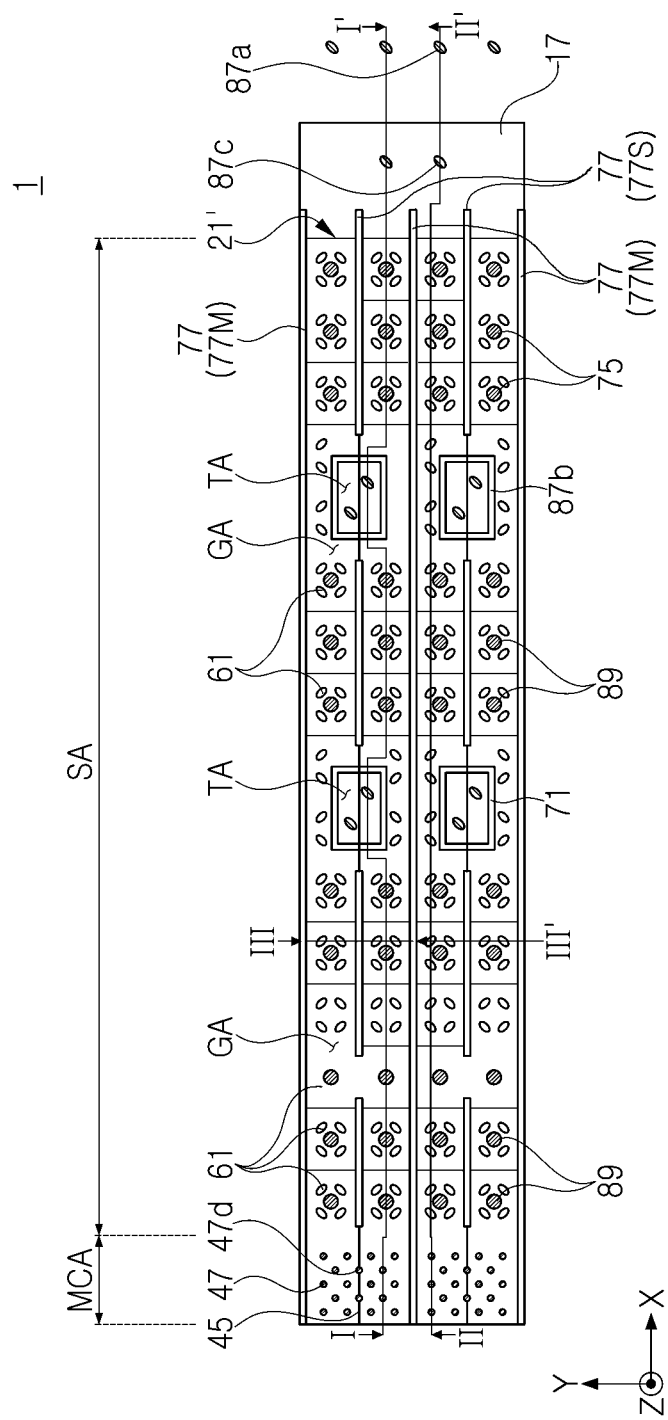
FIGS. 1, 2A, 2B, 2C, 3A, 3B, 3C and 3D are diagrams illustrating a semiconductor device according to an example embodiment of the present disclosure.

Hereinafter, example embodiments of the present disclosure will be described with reference to the accompanying drawings. In the drawings, like reference numerals may refer to like elements.

Figure 2A:
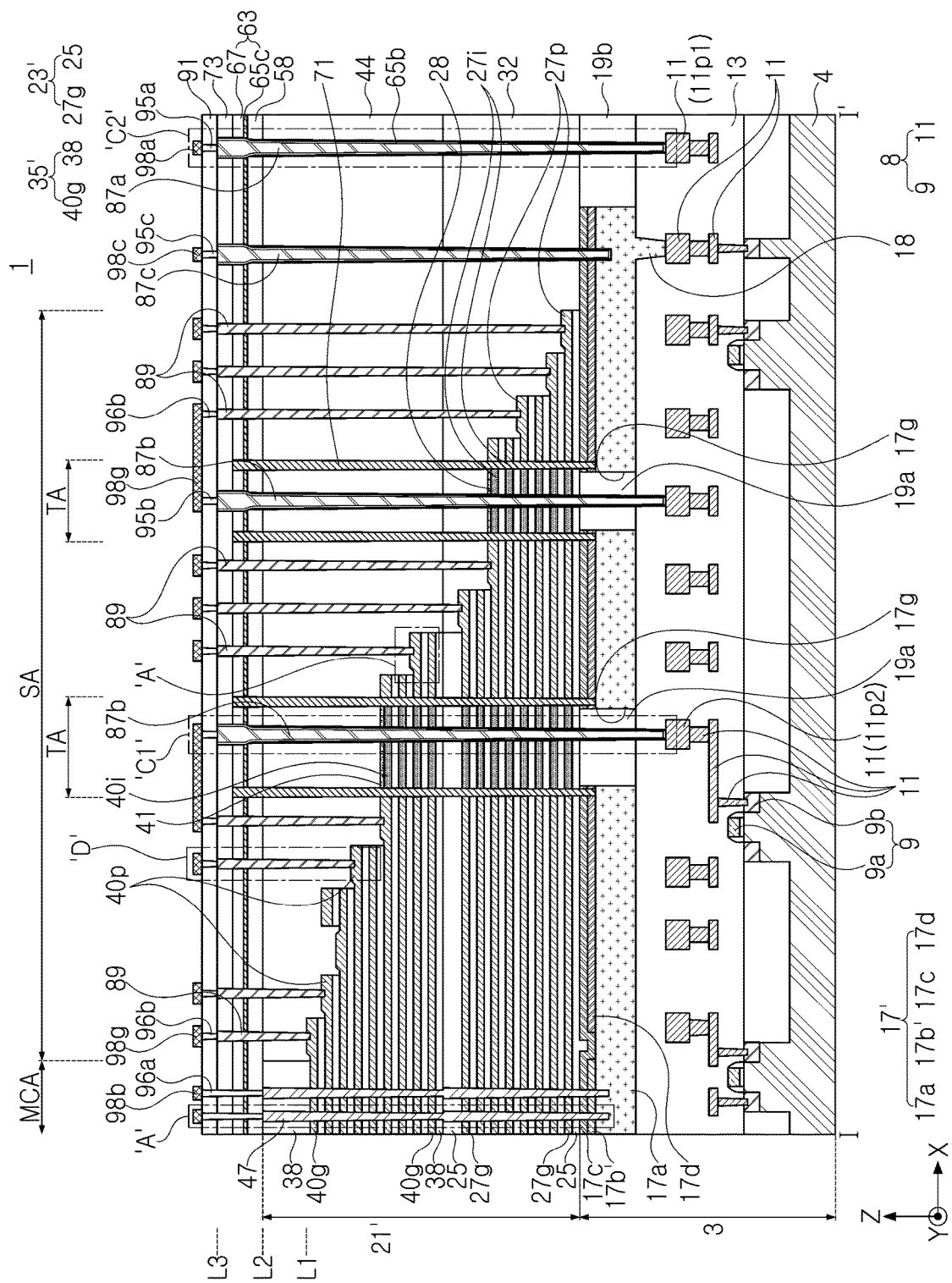
Figure 2B:
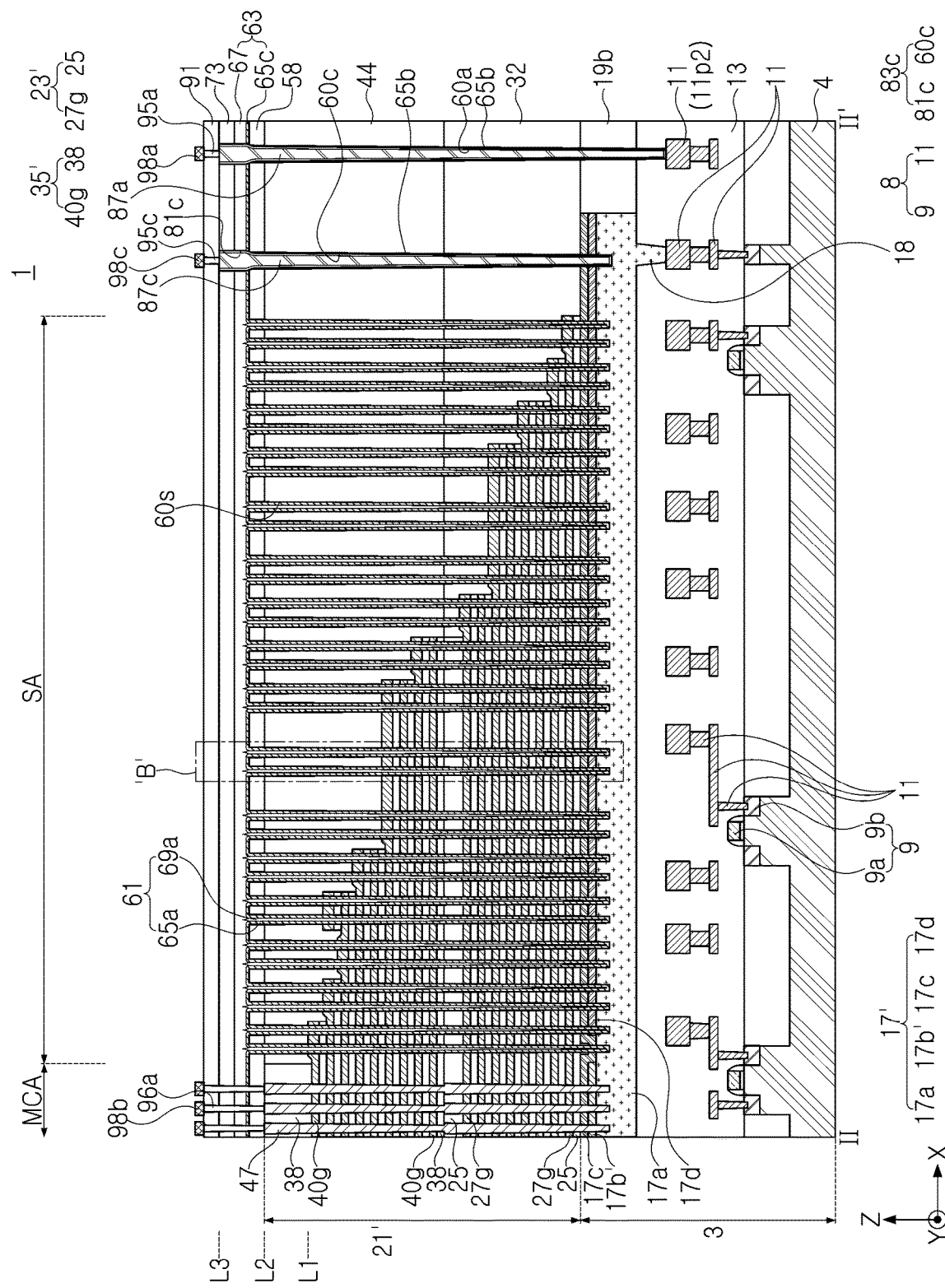

An example of a semiconductor device according to an example embodiment of the present disclosure will be described with reference to FIGS. 1 to 2C. FIG. 1 is a plan diagram illustrating a semiconductor device according to an example embodiment of the present disclosure, FIG. 2A is a cross-sectional diagram illustrating the region taken along line I-I' in FIG. 1. FIG. 2B is a cross-sectional diagram illustrating the region taken along line II-II' in FIG. 1, and FIG. 2C is a cross-sectional diagram illustrating the region taken along line III-III' in FIG. 1.

Figure 2C:
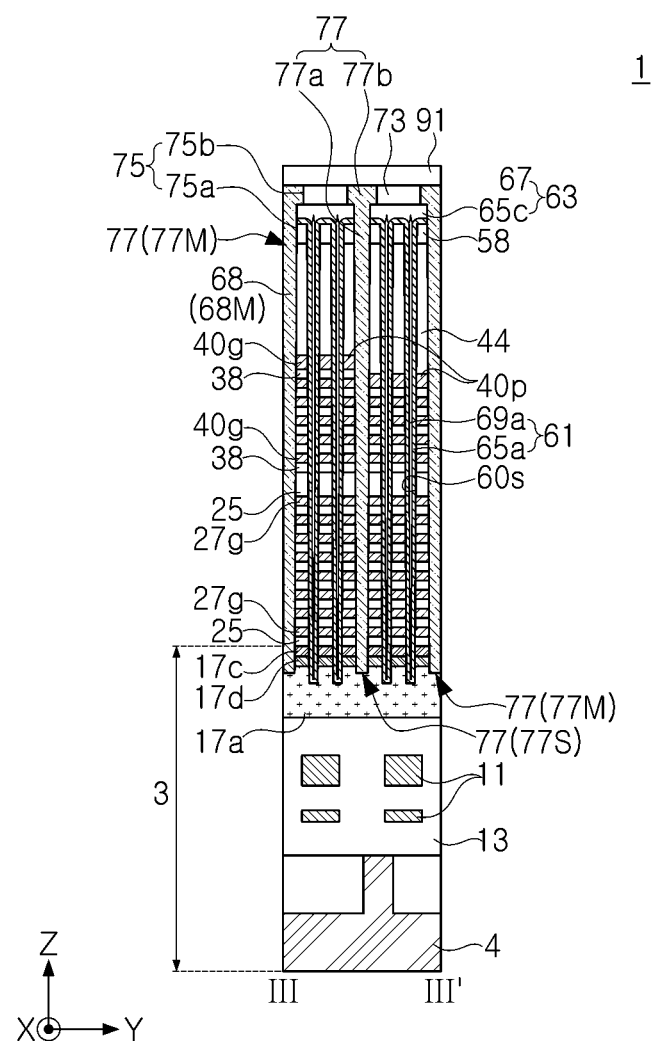

Referring to FIGS. 1 to 2C, a semiconductor device 1 according to an example embodiment of the present disclosure may include a first structure 3 and a second structure 21' overlapping the first structure 3 in the vertical direction Z.

The first structure 3 may include a pattern structure 17'. The pattern structure 17' may include at least one silicon layer.

The pattern structure 17' may include a first pattern layer 17a, a second pattern layer 17b', a third pattern layer 17c, and a fourth pattern layer 17d. The second pattern layer 17b' and the fourth pattern layer 17d may be spaced apart from each other on the first pattern layer 17a. In other words, the second pattern layer 17b' and the fourth pattern layer 17d may be disposed on the first pattern layer 17a. The third pattern layer 17c may cover the second pattern layer 17b' and the fourth pattern layer 17d on the first pattern layer 17a. The third pattern layer 17c may contact the first pattern layer 17a between the second and fourth pattern layers 17b' and 17d. The first pattern layer 17a may have a thickness greater than a thickness of each of the second pattern layer 17b', the third pattern layer 17c, and the fourth pattern layer 17d. At least one of the first pattern layer 17a, the second pattern layer 17b', the third pattern layer 17c, and the fourth pattern layer 17d may include a silicon layer. For example, the first pattern layer 17a, the second pattern layer 17b', and the third pattern layer 17c may include a silicon layer, such as, for example, a silicon layer having N-type conductivity, and the fourth pattern layer 17d may include a material different from that of the silicon layer. For example, the fourth pattern layer 17d may include a plurality of layers stacked in order, a silicon oxide layer, a silicon nitride layer, and a silicon oxide layer, for example.

The first structure 3 may include a semiconductor substrate 4, a peripheral circuit 8 on the semiconductor substrate 4, and a lower insulating layer covering the peripheral circuit 8 on the semiconductor substrate 4. The peripheral circuit 8 may include a circuit device 9 such as a transistor including a peripheral gate 9a and a peripheral source/drain 9b, and a circuit interconnection 11 electrically connected to the circuit device 9. A portion of the circuit interconnection 11 may be first and second peripheral circuit pads 11p1 and 11p2.

The pattern structure 17' may be disposed on a lower insulating layer 13.

The pattern structure 17' may further include a ground pattern 18. For example, the ground pattern 18 may be disposed below the first pattern layer 17a and may be grounded to the semiconductor substrate 4 through a portion of the circuit interconnection 11. The ground pattern 18 may extend from the first pattern layer 17a. For example, when the first pattern layer 17a is formed of a silicon layer, the ground pattern 18 may be formed of a silicon layer extending from the silicon layer.

The pattern structure 17' may have gaps 17g. Each of the gaps 17g may be implemented as a slit or an opening penetrating the pattern structure 17'.

The first structure 3 may further include an internal insulating layer 19a filling the gaps 17g and an external insulating layer 19b disposed on an external side of the pattern structure 17'.

The second structure 21' may include a first region MCA and a second region SA. The second structure 21' may include stack structures 23' and 35' disposed in the first region MCA and extending from the first region MCA into the second region SA.

In example embodiments of the present disclosure, the first region MCA may be a memory cell region, and the second region SA may be a staircase region, an extension region, or a contact region. Hereinafter, for ease of description, the first region MCA will be referred to as a memory cell region and the second region SA will be referred to as a staircase region.

The stack structures 23' and 35' may include a first stack structure 23' and a second stack structure 35' on the first stack structure 23'. The first stack structure 23' may include first interlayer insulating layers 25 and first gate layers 27g alternately stacked in the vertical direction Z. The vertical direction Z may be disposed in a direction perpendicular to an upper surface of the pattern structure 17'. The first gate layers 27g may have first gate pads 27p arranged in a staircase shape in the staircase region SA.

The second stack structure 35' may include second interlayer insulating layers 38 and second gate layers 40g alternately stacked in the vertical direction Z. The second gate layers 40g may have second gate pads 40p arranged in a staircase shape in the staircase region SA.

The first interlayer insulating layers 25 and the second interlayer insulating layers 38 may form interlayer insulating layers 25 and 38, and the first gate layers 27g and the second gate layer 40g may form gate layers 27g and 40g. Accordingly, the first and second stack structures 23' and 35' may include the interlayer insulating layers 25 and 38 and the gate layers 27g and 40g alternately stacked in the vertical direction Z. The gate layers 27g and 40g may have the first and second gate pads 27p and 40p arranged in a staircase shape in the staircase region SA.

In example embodiments of the present disclosure, the "gate pad" may be a region of the gate layer of which an upper portion is not covered by another gate layer disposed thereon in the staircase region SA.

In example embodiments of the present disclosure, the first and second gate pads 27p and 40p may be arranged in the staircase shape illustrated in the drawings, and also in various staircase shapes.

Each of the first and second gate pads 27p and 40p may have a thickness greater than a thickness of each of the first and second gate layers 27g and 40g disposed in the memory cell array region MCA.

The first and second gate layers 27g and 40g may include a conductive material. For example, each of the first and second gate layers 27g and 40g may be formed of two or more materials among a doped polysilicon, a metal-semiconductor compound (e.g., TiSi, TaSi, CoSi, NiSi, WSi, or the like), a metal nitride (e.g., TiN, TaN or WN, or the like) or a metal (e.g., Ti or W, or the like). The interlayer insulating layers 25 and 38 may be formed of an insulating material such as silicon oxide.

The first and second stack structure or multi layer structures 23' and 35' may further include one or a plurality of through regions TA. Each of the through regions TA may further include insulating horizontal layers 27i and 40i disposed on the same level as a level of first and second gate layers 27g and 40g adjacent to the through regions TA among the first and second gate layers 27g and 40g. For example, among the through regions TA, a portion of the through region TA adjacent to the first gate layers 27g may include first insulating horizontal layers 27i disposed on the same level as a level of the first gate layers 27g, and a portion of the through region TA adjacent to the second gate layers 40g may include second insulating horizontal layers 40i disposed on the same level as a level of the second gate layers 40g.

In an example embodiment of the present disclosure, each of the through regions TA may further include reinforcing horizontal layers 28 and 41 in contact with an uppermost insulating horizontal layer on an uppermost insulating horizontal layer among the insulating horizontal layers 27i and 40i. For example, the through region TA in a position spaced apart from the second stack structure 35' may include a first reinforcing horizontal layer 28 in contact with the uppermost first insulating horizontal layer among the first insulating horizontal layers 27i. For example, the first reinforcing horizontal layer 28 may cover the uppermost first insulating horizontal layer among the first insulating horizontal layers 27i. The through region TA disposed in the first and second stack structures 23' and 35' may include a second reinforcing horizontal layer 41 in contact with an uppermost second insulating horizontal layer among the second insulating horizontal layers 40i. For example, the second reinforcing horizontal layer 41 may cover the uppermost second insulating horizontal layer among the second insulating horizontal layers 40i.

The first and second insulating horizontal layers 27i and 40i may be formed of an insulating material different from that of the first and second interlayer insulating layers 25 and 38. For example, the first and second insulating horizontal layers 27i and 40i may be formed of first silicon nitride, and the first and second interlayer insulating layers 25 and 38 may be formed of silicon oxide.

The first and second reinforcing horizontal layers 28 and 41 may be formed of a second silicon nitride having an etch rate different from that of the first silicon nitride of the first and second insulating horizontal layers 27i and 40i. The second silicon nitride may be a material having an etch rate higher than that of the first silicon nitride.

When viewed in on the same plane as in FIG. 1, in the stack structures 23' and 35', each of the through regions TA may be surrounded by a gate region GA (in FIG. 1). In the gate region GA, the first and second gate layers 27g and 40g may be disposed. Accordingly, each of the through regions TA may be surrounded by adjacent first and second gate layers 27g and 40g. The second structure 21' may further include intermediate insulating layers 32 and 44. The intermediate insulating layers 32 and 44 may include a first intermediate insulating layer 32 and a second intermediate insulating layer 44. The first intermediate insulating layer 32 may include the first gate pads 27p, a portion of the pattern structure 17' not covered by the first stack structure 23', and the external insulating layer 19b. The second intermediate insulating layer 44 may cover the second gate pads 40p and the first intermediate insulating layer 32. The first and second intermediate insulating layers 32 and 44 may be formed of an insulating material such as silicon oxide.

The semiconductor device 1 according to an example embodiment of the present disclosure may further include a memory vertical structure 47 including a portion penetrating the second structure 21'. The memory vertical structure 47 may include a portion penetrating the first and second stack structures 23' and 35' in the memory cell array region MCA. The memory vertical structure 47 may extend into the pattern structure 17' from a portion penetrating the second structure 21' and may be in contact the pattern structure 17'. For example, the memory vertical structure 47 may penetrate the third pattern layer 17c and the second pattern layer 17b' in order and may extend into the first pattern layer 17a. The memory vertical structure 47 may be in contact with at least one of the first to third pattern layers 17a, 17b', and 17c formed as a silicon layer.

The semiconductor device 1 according to an example embodiment of the present disclosure may further include a string separation pattern 45 penetrating one or a plurality of upper gate layers disposed thereon among the second gate layers 40g. The string separation pattern 45 may be formed of silicon oxide. The string separation pattern 45 may be disposed on a level higher than a second gate layer, which may be a word line, among the second gate layers 40g.

The semiconductor device 1 according to all example embodiment of the present disclosure may include a dummy vertical structure 47d penetrating the string separation pattern 45 and also penetrating the second structure 21', and in contact with the pattern structure 17'. The dummy vertical structure 47d may have the same cross-sectional structure as that of the memory vertical structure 47 and may be formed of the same material as that of the memory vertical structure 47.

The semiconductor device 1 according to an example embodiment of the present disclosure may further include a first upper insulating layer 58 on the second structure 21'. The first upper insulating layer 58 may include silicon oxide.

The semiconductor device 1 according to an example embodiment of the present disclosure may further include support holes 60s penetrating the first upper insulating layer 58 and the second structure 21' and exposing a portion of the pattern structure 17', and support vertical structures 61 disposed in the support holes 60s. Each of the support vertical structures 61 may include a portion penetrating at least a portion of the first and second gate layers 27g and 40g of the second structure 21' in the staircase region SA. When viewed on the plane, each of the support vertical structures 61 may have a circular shape or an elliptical shape.

At least a portion of the support vertical structures 61 may penetrate the third pattern layer 17c and the fourth pattern layer 17d of the pattern structure 17' in order, and may extend into the first pattern layer 17a. One of the support vertical structures 61 may be spaced apart from the fourth pattern layer 17d, may penetrate the third pattern layer 17c, and may extend into the first pattern layer 17a.

Hereinafter, a single support hole 60s and a single support vertical structure 61 will be mainly described for ease of description.

An upper surface of the support vertical structure 61 may be disposed on a level higher than the upper surface of the memory vertical structure 47.

In example embodiments, "level" may refer to a level when viewed with respect to the upper surface of the pattern structure 17' or a level when viewed with respect to the upper surface of the semiconductor substrate 4.

The support vertical structure 61 may include an air gap 69a and a support layer 65a defining at least a portion of the air gap 69a.

The semiconductor device 1 according to an example embodiment of the present disclosure may further include a capping layer 63 disposed on the first upper insulating layer 58 and covering the support vertical structure 61.

The capping layer 63 may include a lower capping layer 65c and an upper capping layer 67 on the lower capping layer 65c.

The semiconductor device 1 according to an example embodiment of the present disclosure may further include dam structures 71. Each of the dam structures 71 may penetrate the capping layer 63, the first upper insulating layer 58, and the second structure 21', and may surround each of the through regions TA. Accordingly, when viewed on the plane, each of the dam structures 71 may be disposed between the gate region GA (in FIG. 1) and each of the through regions TA (in FIG. 1).

The semiconductor device 1 according to an example embodiment of the present disclosure may further include a second upper insulating layer 73 on the capping layer 63. The second upper insulating layer 73 may be in direct contact with the upper capping layer 67.

The semiconductor device 1 according to an example embodiment of the present disclosure may further include separation structures 77 penetrating the second upper insulating layer 73, the capping layer 63, the first upper insulating layer 58, and the second structure 21'. Each of the separation structures 77 may be formed of silicon oxide or silicon oxide having a void therein. In another example, each of the separation structures 77 may include a conductive pattern in contact with the pattern structure 17' and an insulating layer covering a side surface of the conductive pattern.

Each of the separation structures 77 may include a lower separation portion 77a penetrating the capping layer 63, the first upper insulating layer 58 and the second structure 21' and an upper separation portion 77b penetrating the second upper insulating layer 73. The lower separation portion 77a and the upper separation portion 77b may be integrated with each other.

In at least one of the separation structures 77, the upper separation portion 77b may have a width different from a width of the lower separation portion 77a. For example, in at least one of the separation structures 77, the upper separation portion 77b may have a width greater than a width of the lower separation portion 77a.

In at least one of the separation structures 77, at least a portion of a side surface of the upper separation portion 77b may not be vertically aligned with at least a portion of a side surface of the lower separation portion 77a.

The separation structures 77 may include a plurality of main separation structures 77M parallel to each other, and auxiliary separation structures 77S disposed between the main separation structures 77M. Each of the separation structures 77 may include a line portion extending in the first horizontal direction X. The first horizontal direction X may be parallel to an upper surface of the pattern structure 17'. The first horizontal direction X may be a direction from the memory cell array region MCA toward the staircase region SA. Each of the auxiliary separation structures 77S may have a length shorter than that of each of the main separation structures 77M. For example, a plurality of the auxiliary separation structures 77S may be arranged in the first direction X next to a single main separation structure 77M arranged in the first direction X. The main separation structures 77M may penetrate the second structure 21' and may separate the first and second stack structures 23' and 35' in the second horizontal direction Y. The second horizontal direction Y may be parallel to the upper surface of the pattern structure 17' and may be perpendicular to the first horizontal direction X. Each of the separation structures 77 may be in contact with the first and second gate layers 27g and 40g adjacent to the separation structure 77.

The separation structures 77 may extend downwardly from a portion penetrating the second structure 21' and may be in contact the pattern structure 17'. At least one of the separation structures 77 may be in contact with the first pattern layer 17a.

The semiconductor device 1 according to an example embodiment of the present disclosure may further include peripheral contact plugs 87. The peripheral contact plugs 87 may include a first peripheral contact plug 87a, a second peripheral contact plug 87b, and a third peripheral contact plug 87c. The peripheral contact plugs 87 may penetrate the second upper insulating layer 73, the capping layer 63, the first upper insulating layer 58, and the second structure 21', and may extend into the lower structure 3.

The first peripheral contact plug 87a may be spaced apart from the first and second gate layers 27g and 40g, may penetrate the first and second intermediate insulating layers 32 and 44, may be in contact with the first peripheral circuit pad 11p1, and may be electrically connected to the first peripheral circuit pad 11p1.

The second peripheral contact plug 87b may be spaced apart from the first and second gate layers 27g and 40g, may penetrate the first and second insulating horizontal layers 27i and 40i of the through regions TA, may be in contact with the second peripheral circuit pad 11p2, and may be electrically connected to the second peripheral circuit pad 11p2.

The third peripheral contact plug 87c may be spaced apart from the first and second gate layers 27g and 40g, may penetrate the first and second intermediate insulating layers 32 and 44, and may be in contact with the first pattern layer 17a, and may be electrically connected to the first pattern layer 17a. In the pattern structure 17', the first pattern layer 17a, which may be formed as a polysilicon layer having N-type conductivity, may be a common source, and the third peripheral contact plug 87c may be a common source contact plug electrically connected to the common source.

The semiconductor device 1 according to an example embodiment of the present disclosure may further include a spacer layer 65b covering a side surface of each of the first to third peripheral contact plugs 87a, 87b, and 87c.

The semiconductor device 1 according to an example embodiment of the present disclosure may further include gate contact plugs in contact with the first and second gate pads 27p and 40p and electrically connected to the first and second gate pads 27p and 40p. Gate contact plugs 89 may penetrate the second upper insulating layer 73, the capping layer 63 and the first upper insulating layer 58, may extend into the second structure 21', and may be in contact with the first and second gate pads 27p and 40p.

The semiconductor device 1 according to an example embodiment of the present disclosure may further include a third upper insulating layer 91 disposed on the second upper insulating layer 73. The first, second, and third upper insulating layers 58, 73, and 91 may include silicon oxide.

The semiconductor device 1 according to an example embodiment of the present disclosure may further include peripheral upper plugs 95a, 95b, and 95c penetrating the third upper insulating layer 91. The peripheral upper plugs 95a, 95b, and 95c may further include a first peripheral upper plug 95a electrically connected to the first peripheral contact plug 87a, a second peripheral upper plug 95b electrically connected to the second peripheral contact plug 87b, and a third peripheral upper plug 95c electrically connected to the third peripheral contact plug 87c.

The first peripheral upper plug 95a may include a side surface not vertically aligned with the side surface of the first peripheral contact plug 87a. The second peripheral upper plug 95b may include a side surface not vertically aligned with a side surface of the second peripheral contact plug 87b. The third peripheral upper plug 95c may include a side surface not vertically aligned with a side surface of the third peripheral contact plug 87c.

A width of each of the first to third peripheral upper plugs 95a, 95b, and 95c may be different from a width of each of the first to third peripheral contact plugs 87a, 87b, and 87c. In one example, a width of each of the first to third peripheral upper plugs 95a, 95b, and 95c may be smaller than a width of each of the first to third peripheral contact plugs 87a, 87b, and 87c. In another example, a width of each of the first to third peripheral upper plugs 95a, 95b and 95c may be greater than a width of each of the first to third peripheral contact plugs 87a, 87b and 87c. The semiconductor device 1 according to an example embodiment of the present disclosure may further include a bit line contact plug 96a penetrating the first to third upper insulating layers 58, 73, and 71 and the capping layer 63, and electrically connected to the memory vertical structure 47.

The semiconductor device 1 according to an example embodiment of the present disclosure further may include gate upper plugs 96b penetrating the third upper insulating layer 91 and electrically connected to the gate contact plugs 89.

The semiconductor device 1 according to an example embodiment of the present disclosure may further include wirings 98b, 98g, 98a, and 98c disposed on the third upper insulating layer 91. The wirings 98b, 98g, 98a, and 98c may include bit lines 98b electrically connected to the bit line contact plugs 96a, gate connection wirings 98g electrically connecting each of the gate upper plugs 96b to the plurality of second peripheral upper plugs 95b, a first peripheral wiring 98a electrically connected to the first peripheral upper plug 95a, and a second peripheral wiring 98c electrically connected to the third peripheral upper plug 95c.

Hereinafter, a level on which the upper surface of the uppermost gate layer among the first and second gate layers 27g and 40g is disposed may be referred to as a first level L1, a level on which the upper surface of the memory vertical structure 47 is disposed may be referred to as a second level L2, and a level on which the upper surface of the second upper insulating layer 73 is disposed may be referred to as a third level L3.

Figure 3A:
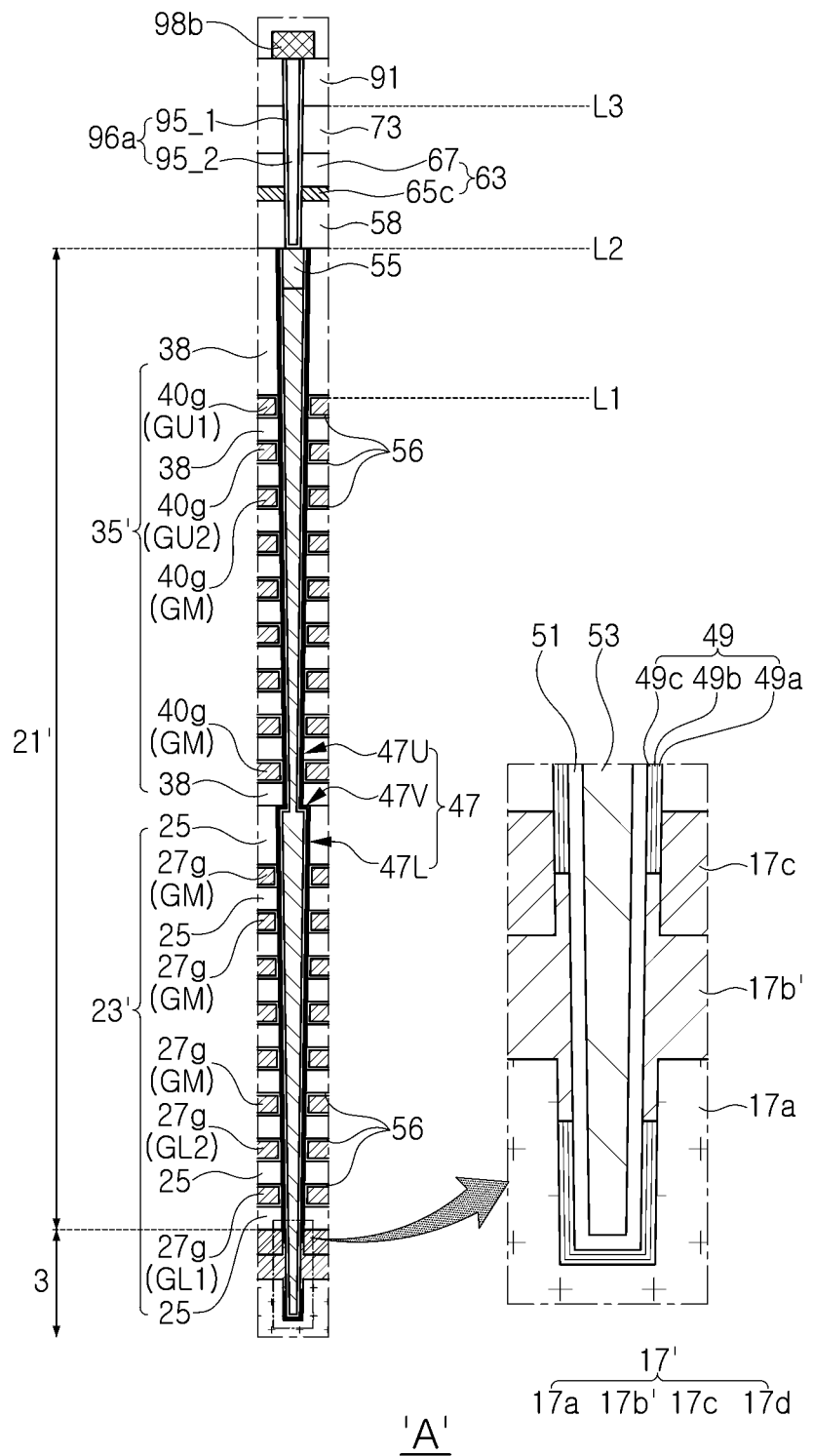

In the description below, examples of the first and second gate layers 27g and 40g and the memory vertical structure 47 described in the aforementioned example embodiment will be described with reference to FIG. 3A. FIG. 3A is an enlarged diagram illustrating region "A" in FIG. 2A.

Referring to FIGS. 2A and 3A, the first and second gate layers 27g and 40g also just referred to as the gate layers may include one or a plurality of lower gate layers GL1 and GL2, one or the plurality of upper gate layers GU1 and GU2, and plurality of intermediate gate layers GM disposed between the one or the plurality of lower gate layers GL1 and GL2 and the one or the plurality of upper gate layers GU1 and GU2. The one or the plurality of upper gate layers GU1 and GU2 may be spaced apart from each other in the vertical direction Z. For example, the plurality of upper gate layers GU1 and GU2 may include a first upper gate layer GU1 and a second upper gate layer GU2 disposed below the first upper gate layer GU1.

The one or the plurality of lower gate layers GL1 and GL2 may be spaced apart from each other in the vertical direction Z. For example, the plurality of lower gate layers GL1 and GL2 may include a first lower gate layer GL1 and a second lower gate layer GL2 disposed on the first lower gate layer GL1.

A portion of the plurality of intermediate gate layers GM may be word lines.

In one example, the first lower gate layer GL1 may be a ground select gate line of a ground select transistor, and the second lower gate layer GL2 may be a dummy gate line.

In another example, the first lower gate layer GL1 may be an erase control gate line of an erase control transistor which may be used for an erase operation for removing data stored in memory cells using a gate induce drain leakage (GIDL) phenomenon, and the second lower gate layer GL2 may be a ground select gate line of a ground select transistor.

In an example, the plurality of upper gate layers GU1 and GU2 may be string select gate lines of string select transistors.

In another example, the first upper gate layer GU1 of the plurality of upper gate layers GU and GU2 may be an erase control gate line of an erase control transistor, and the second upper gate layer can of the plurality of upper gate layers GU1 and GU2 may be a string select gate line of the string select transistor.

The memory vertical structure 47 may include a lower vertical portion 47L penetrating the first stack structure 23' and an upper vertical portion 47U penetrating the second stack structure 35'.

A width of an upper region of the lower vertical portion 47L may be different from a width of a lower region of the upper vertical portion 47U. For example, a width of an upper region of the lower vertical portion 47L may be greater than a width of a lower region of the upper vertical portion 47U. In other words, the width of the lower vertical portion 47L where the lower vertical portion 47L and the upper vertical portion 47U meet may be greater than that of the upper vertical portion 47U.

A side surface of the lower vertical portion 47L and a side surface of the upper vertical portion 47U, adjacent to each other, may not be aligned in the vertical direction Z.

A middle side surface of the memory vertical structure 47 disposed on a level between an uppermost first gate layer among the first gate layers 27g of the first stack structure 23' and a lowermost second gate layer of the second gate layers 40g of the second stack structure 35' may include a slope changing portion 47V in which a slope may change.

In example embodiments of the present disclosure, the "slope changing portion" may be a side-surface portion of the memory vertical structure 47 having a third slope different from a first slope and a second slope between an upper side-surface portion having the first slope and a lower side-surface portion having the second slope. The third slope may be gentler (e.g., not as steep) than the first slope and the second slope, and the first slope and the second slope may be a vertical slope or an almost vertical slope. Therefore, the "slope changing portion" may be a portion having a gentle slope between the upper portion and the lower portion. For example, in the memory vertical structure 47, the lower vertical portion 47L may have a side surface having the first slope which may be vertical or almost vertical, the upper vertical portion 47U may have a side surface having the second slope which may be vertical or almost vertical, and the slope changing portion 47V may have a slope gentler than the first slope and the second slope.

On the same level as a level of the slope changing portion 47V of the middle side surface of the memory vertical structure 47, a side surface of each of the support vertical structure 61, the first to third peripheral contact plugs 87a, 87b, and 87c, the separation structures 77, and the dam structure 71, described above, may have a substantially linear shape or a monotonically changing shape with regularity.

The memory vertical structure 47 may include an insulating gap-fill layer 53, a channel layer 51 covering an external side surface and a bottom surface of the insulating gap-fill layer 53, a data storage structure 49 covering an external side surface and a bottom surface of the channel layer 51, and a pad material layer 55 on the insulating gap-fill layer 53.

The data storage structure 49 may include a first dielectric layer 49c covering the external side surface and the bottom surface of the channel layer 51, a data storage material layer 49b covering the external side surface and the bottom surface of the first dielectric layer 49c, and a second dielectric layer 49a covering the external side surface and the bottom surface of the storage material layer 49b. The first dielectric layer 49c may be in contact with the channel layer 51, and the data storage material layer 49b may be spaced apart from the channel layer 51. The insulating gap-fill layer 53 may include silicon oxide, such as for example, silicon oxide formed by an atomic layer deposition process, or silicon oxide having voids formed therein. The first dielectric layer 49a may include silicon oxide or silicon oxide doped with impurities. The second dielectric layer 49c may include at least one of silicon oxide and a high-k dielectric. The data storage material layer 49b may include a material for trapping charges and storing data, such as, for example, silicon nitride.

The data storage material layer 49b of the data storage structure 49 of the memory vertical structure 47 may include regions for storing data in a semiconductor device such as a flash memory device. The channel layer 51 may include polysilicon. The pad material layer 55 may include at least one of doped polysilicon, metal nitride (e.g., TiN, or the like), a metal (e.g., W, or the like), and a metal-semiconductor compound (e.g., TiSi, or the like). The pad material layer 55 may be electrically connected to and in contact with the bit line contact plug 96a.

The memory vertical structure 47 may penetrate the third pattern layer 17c and the second pattern layer 17b' of the pattern structure 17' in order, and may extend into the first pattern layer 17a. In the pattern structure 17', the second pattern layer 17b' may penetrate the data storage structure 49 and may be in contact with the channel layer 51.

The semiconductor device 1 according to an example embodiment of the present disclosure may further include a dielectric layer 56 covering an upper surface and a lower surface of each of the first and second gate layers 27g and 40g and disposed between a side surface of the memory vertical structure 47 and a side surface of each of the first and second gate layers 27g and 40g. The dielectric layer 56 may include a high-k dielectric having a dielectric constant higher than that of silicon oxide. For example, the dielectric layer 56 may be formed of a high-k dielectric such as aluminum oxide, lanthanum oxide, or hafnium oxide.

Figure 3B:
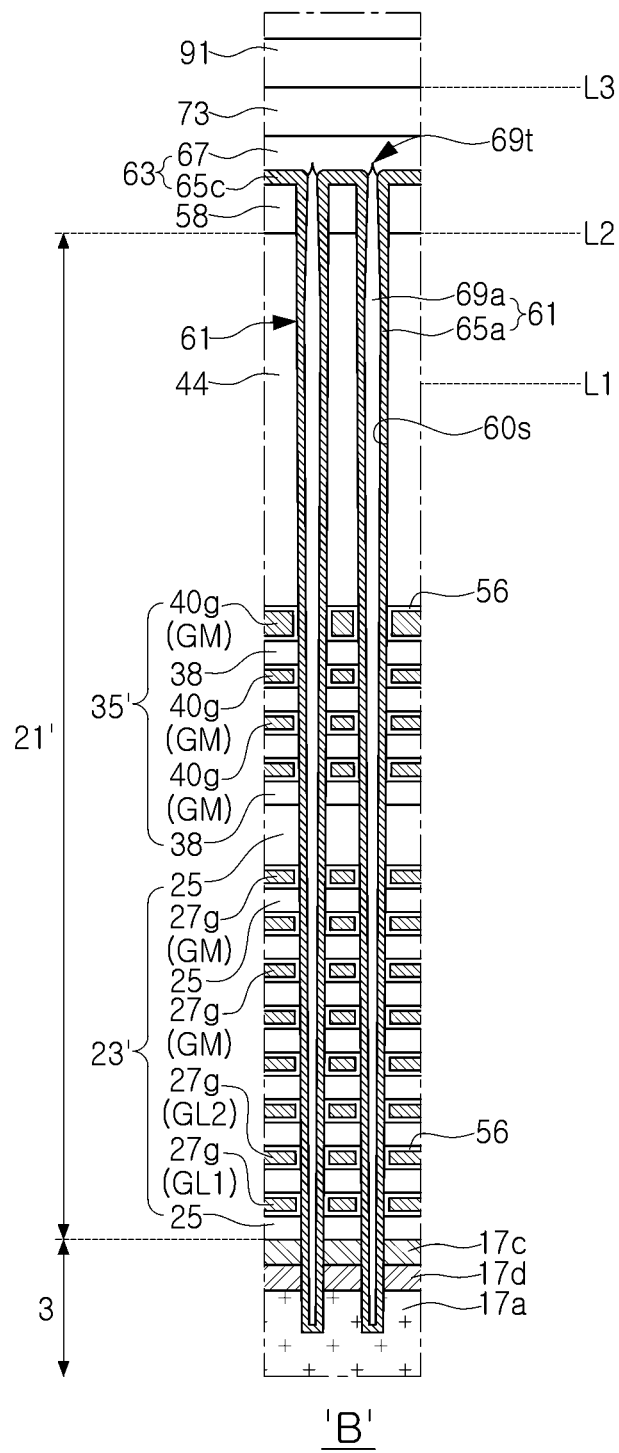

In the description below, with reference to FIG. 3B, an example of the support vertical structure 61 and the capping layer 63 described above will be described. FIG. 3B is an enlarged diagram illustrating region "B" in FIG. 2B.

Referring to FIGS. 2B and 3B, as described above, the support vertical structure 61 may include the air gap 69a and the support layer 65a defining at least a portion of the air gap 69a, and the capping layer 63 may include the lower capping layer 65c and the upper capping layer 67. For example, the support layer 65a may limit at least a lower portion and a sidewall of the air gap 69a.

The support layer 65a may extend continuously from the lower capping layer 65c. The upper capping layer 67 may limit an upper portion of the air gap 69a.

The lower capping layer 65c and the support layer 65a may be formed of the same material. The lower capping layer 65c and the support layer 65a may be integrated with each other. For example, the lower capping layer 65c and the support layer 65a may be formed of a material layer continuously extending without a boundary surface. For example, the lower capping layer 65c and the support layer 65a may include an insulating material layer.

In an example, the lower capping layer 65c and the support layer 65a may be formed of a silicon oxide layer.

In another example, the lower capping layer 65c and the support layer 65a may be formed of a silicon nitride layer.

In another example, the lower capping layer 65c and the support layer 65a may be formed in a multilayer structure, such as, for example, a multilayer structure of a silicon oxide layer and a silicon nitride layer.

A maximum thickness of the lower capping layer 65c may be greater than a minimum thickness of the support layer 65a. The support layer 65a may have a maximum thickness in a portion adjacent to the lower capping layer 65c. The support layer 65a may have a minimum thickness in a portion far from the lower capping layer 65c.

The upper capping layer 67 may include a material layer formed by a method different from a method of forming the lower capping layer 65c. For example, the lower capping layer 65c may include a silicon oxide layer formed by an atomic layer deposition process (ALD), and the upper capping layer 67 may include a silicon oxide layer formed by a chemical vapor deposition process (CVD).

In one example, an upper end of the air gap 69a may be disposed on a level higher than a level of the upper surface of the memory vertical structure 47. In one example, the air gap 69a may extend upwardly from a portion disposed in the support hole 60s, and an upper end 69t of the air gap 69a may be disposed on a level higher than a level of the upper surface of the first upper insulating layer 58. The upper end 69t of the air gap 69a may come to point and be narrower than other portions of the air gap 69a therebelow.

In an example, the upper end 69t of the air gap 69a may be disposed on a level higher than a level of the upper surface of the lower capping layer 65c.

Figure 3C:
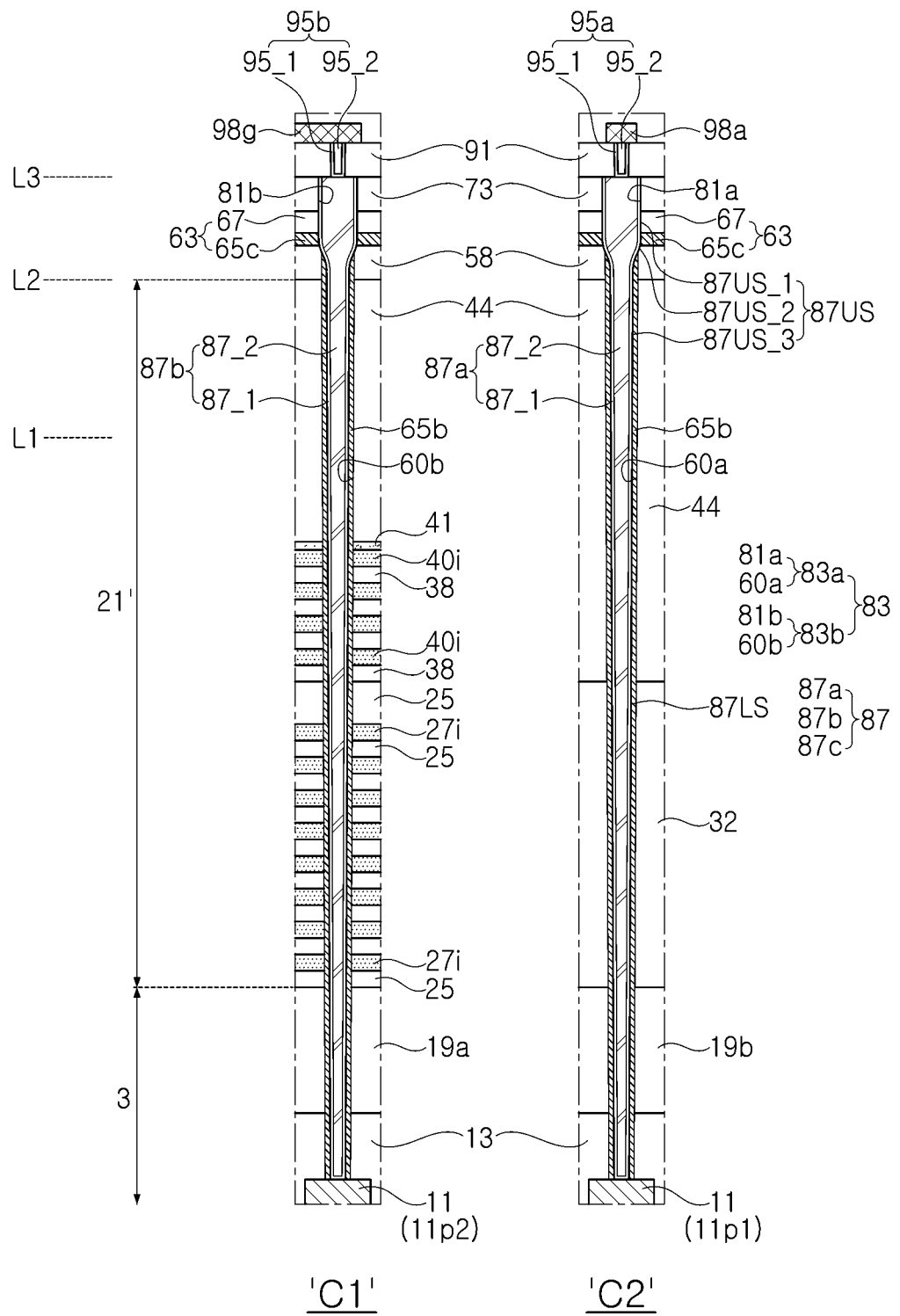

In the description below, examples of the peripheral contact plugs 87, the first to third peripheral upper plugs 95a, 95b, and 95c, and the spacer layer 65b, and the gate contact plugs 89, described above, will be described with reference to FIGS. 3C and 3D. FIG. 3C is an enlarged diagram illustrating regions "C1" and "C2" in FIG. 2A, and FIG. 3D is an enlarged diagram illustrating region "D" in FIG. 2A.

Figure 3D:
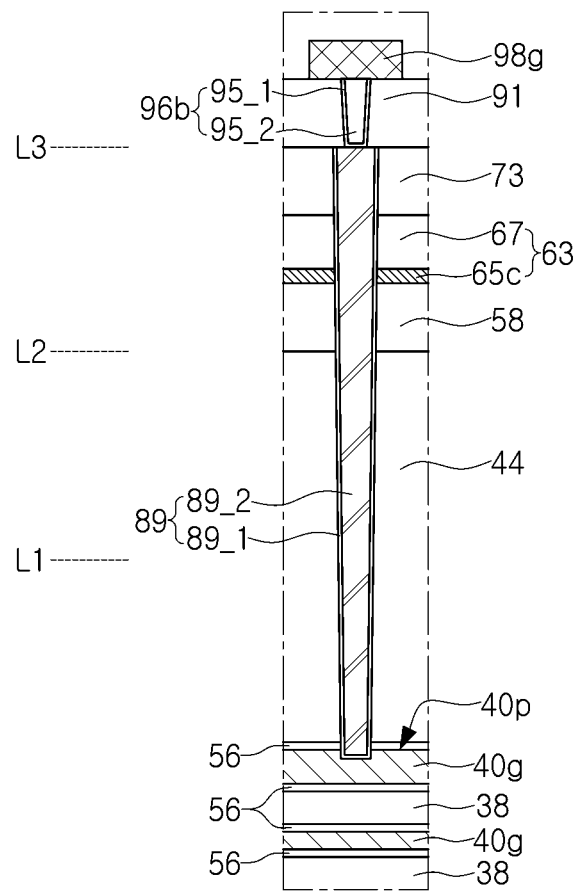

Referring to FIGS. 2A, 3C and 3D, each of the peripheral contact plugs 87 may include a lower region 87LS disposed below a first level L1 and an upper region 87US disposed above the first level L1. For example, in each of the peripheral contact plugs 87, the upper region 87US may be disposed on a level higher than a level of the upper surface of the uppermost gate layer 40g among the first and second gate layers 27g and 40g, the lower region 87LS may be disposed on a level lower than a level of the upper surface of the uppermost gate layer 40g.

In the description below, the lower region 87LS and the upper region 87US of one of the peripheral contact plugs 87 will be mainly described.

A side-surface profile of the lower region 87LS may be different from a side-surface profile of the upper region 87US. For example, the lower region 87LS may have a substantially vertical side surface, and the upper region 87US may have at least one curved side surface. For example, the upper region 87US may include a first region 87US_1, a connection region 87US_2 disposed below the first region 87US_1, and a second region 87US_3 disposed below the connection region 87US_2. A side surface of the connection region 87US_2 may have a slope different from at least one of a side surface of the first region 87US_1 and a side surface of the second region 87US_2. For example, a side surface of the connection region 87US_2 may have a slope different from a side surface of the first region 87US_1 having a first slope and a side surface of the second region 87US_2 having a second slope. For example, the side surface of the first region 87US_1 and the side surface of the second region 87US_2 may have a vertical slope or an almost vertical slope which may be steep, and the side surface of the connection region 87US_2 may have a gentle slope. In example embodiments of the present disclosure, the expression "substantially perpendicular" may indicate the configuration of being substantially perpendicular to the upper surface of the lower structure 3 or the upper surface of the semiconductor substrate 4. For example, forming the plug may include forming a hole by an anisotropic etching process and forming a plug in the hole, and the side surface profile of the plug may be a side-surface profile of the hole formed by the anisotropic etching process. The side surface of the hole formed by the anisotropic etching process may be perpendicular to or may be almost perpendicular to the upper surface of the semiconductor substrate 4. Accordingly, the expression "substantially perpendicular" may indicate the configuration of being perpendicular to the upper surface of the semiconductor substrate 4, but the present disclosure is not limited thereto, and the expression may refer to a shape of a side surface of the hole formed within a range of a process margin of an anisotropic etching process, which may be, for example, a shape almost perpendicular to the upper surface of the semiconductor substrate 4, such as a shape almost perpendicular to the upper surface of the semiconductor substrate 4 and having a constant slope or a shape almost perpendicular to the upper surface of the semiconductor substrate 4 and having a slope that changes.

At least a portion of the first region 87US_1 may be in contact with the second upper insulating layer 73 and the upper capping layer 67.

The first region 87US_1 may be in contact with the second upper insulating layer 73, the upper capping layer 67, and the lower capping layer 65c. The first region 87US_1 may extend from the connection region 87US_2 and contact the lower capping layer 65c, the upper capping 67 and the second upper insulating layer 73 in sequence.

The side surface of the first region 87US_1 and the side surface of the second region 87US_3 may not be aligned in the vertical direction Z.

At least a portion of the connection region 87US_2 may be disposed on a level lower than that of the lower capping layer 65c.

At least a portion of the connection region 87US_2 may be disposed on a level higher than that of the second level L2.

A maximum width of the upper region 87US may be greater than a maximum width of the lower region 87LS.

In the upper region 87US, the first region 87US_1 may have a minimum width greater than a minimum width of the connection region 87US_2, and the second region 87US_3 may have a maximum width less than a maximum width of the connection region 87US_2.

The gate contact plugs 89 disposed on the same level as a level of the upper region 87US may have a side-surface profile different from that of the upper region 87US. For example, each region of the gate contact plugs 89 disposed on the same level as a level of the upper region 87US of the peripheral contact plug 87 may have a side surface having a substantially vertical slope.

The spacer layer 65b may surround a side surface of the lower region 87LS, may extend upwardly, and may cover a portion of a side surface of the upper region 87US. For example, the spacer layer 65b may cover a side surface of the second region 87US_3 of the upper region 87US, and may be disposed on a level lower than the first region 87US_1 of the upper region 87US and may be spaced apart from the first region 87US_1.

The spacer layer 65b may cover at least a portion of the connection region 87US_2 of the upper region 87US. For example, the spacer layer 65b may cover a side surface of a lower portion of the connection region 87US_2 and may not cover a side surface of an upper portion of the connection region 87US_2.

Each of the first to third peripheral upper plugs 95a, 95b, and 95c may have a width different from each of the peripheral contact plugs 87. For example, a width of each of the first to third peripheral upper plugs 95a, 95b and 95c may be smaller than a width of each of the peripheral contact plugs 87.

Each of the peripheral contact plugs 87 may include a plug pattern 87_2 and a conductive liner 87_1 covering a side surface and a bottom surface of the plug pattern 87_2. Each of the gate contact plugs 89 may include a plug pattern 89_2 and a conductive liner 89_1 covering a side surface and a bottom surface of the plug pattern 89_2.

In an example, the peripheral contact plugs 87 and the gate contact plugs 89 may be simultaneously formed. Accordingly, the peripheral contact plugs 87 and the gate contact plugs 89 may be formed of the same material.

In an example, upper surfaces of the peripheral contact plugs 87 may be coplanar with upper surfaces of the gate contact plugs 89. For example, the upper surfaces of the peripheral contact plugs 87 and the gate contact plugs 89 may be disposed on the third level L3.

In example embodiments of the present disclosure, the bit line contact plug 96a, the gate upper plugs 96b, and the first to third peripheral upper plugs 95a, 95b, and 95c may be formed simultaneously and may include the same material. For example, each of the bit line contact plug 96a, the gate upper plugs 96b, and the first to third peripheral upper plugs 95a, 95b and 95c may include a plug pattern 95_2 and a conductive liner 95_1 covering a bottom surface and a side surface of the plug pattern 95_2. The conductive line 95_1 may be in direct contact with the peripheral contact plug 87 or the gate contact plug 89 therebelow. The bit line contact plug 96a, the gate upper plugs 96b, and the first to third peripheral upper plugs 95a, 95b, and 95c may have upper surfaces coplanar with each other.

In the description below, various modifications of the support vertical structure 61 and the capping layer 63 described above will be described with reference to FIGS. 4A, 4B, 5A and 5B. FIGS. 4A, 4B, 5A and 5B are enlarged diagrams illustrating a modified portion of the example in the enlarged diagram in FIG. 3B. Various modified structures described below with reference to FIGS. 4A, 4B, 5A, and 5B may replace the structure in FIG. 3B.

Figure 4A:
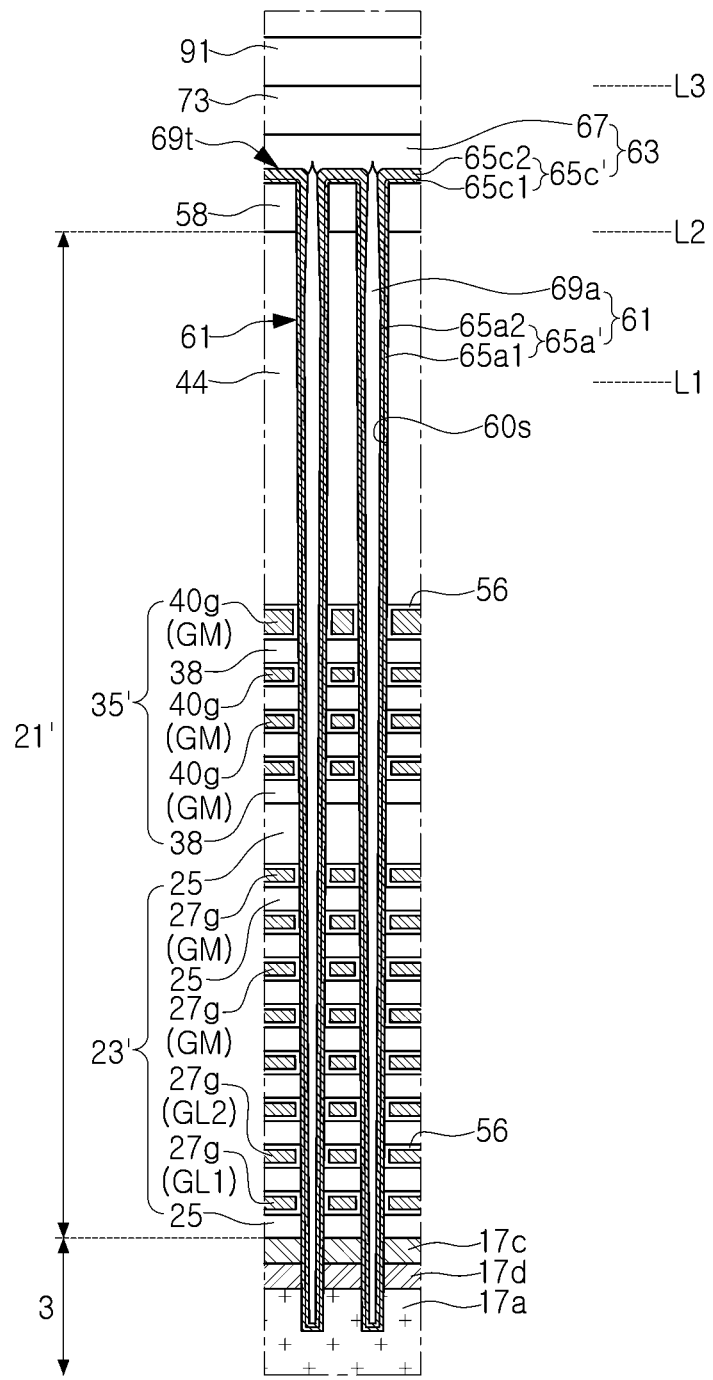
FIG. 4A is an enlarged diagram illustrating a modified example of a semiconductor device, illustrating a portion of the semiconductor device according to an example embodiment of the present disclosure.

In a modified example, referring to FIG. 4A, the lower capping layer 65c described with reference to FIG. 3B may be replaced with a lower capping layer 65c' including a first layer 65c1 and a second layer 65c2 on the first layer 65c1. The support layer 65a described with reference to FIG. 3B may be replaced with a support layer 65a' including a first layer 65a1 and a second layer 65a2 on the first layer 65a1. The first layer 65a1 of the support layer 65a' and the first layer 65c1 of the lower capping layer 65c' may be integrated with each other, and the second layer 65a2 of the support layer 65a' and the second layer 65c2 of the lower capping layer 65c' may be integrated with each other.

In an example, the first layers 65a1 and 65c1 and the second layers 65a2 and 65c2 may be formed as material layers having different step coverages. For example, one of the first layers 65a1 and 65c1 and the second layers 65a2 and 65c2 may have a step coverage higher than the other. For example, one of the first layers 65a1 and 65c1 and the second layers 65a2 and 65c2 may be formed to have a uniform thickness as compared to a thickness of the other layer.

In an example, the first layers 65a1 and 65c1 and the second layers 65a2 and 65c2 may be formed of the same type of material. For example, the first layers 65a1 and 65c1 may be formed of a silicon oxide layer having a uniform thickness as compared to that of the second layers 65a2 and 65c2, and the second layers 65a2 and 65c2 may be formed of silicon oxide layer having a non-uniform thickness as compared to that of the first layers 65a1 and 65c1. In another example, the first layers 65a1 and 65c1 and the second layers 65a2 and 65c2 may be formed of different materials. For example, the first layers 65a1 and 65c1 may be formed of a silicon oxide layer, and the second layers 65a2 and 65c2 may be formed of a different material from the silicon oxide layer, such as, for example, a silicon nitride layer, a silicon oxynitride layer, or a silicon nitride layer including carbon. The spacer layer 65b (in FIG. 3C) described above may be formed of the same material as that of the support layer 65a'. Accordingly, the spacer layer 65b (in FIG. 3C) may be modified to include the same first layer and the second layer as those of the support layer 65a'.

Figure 4B:
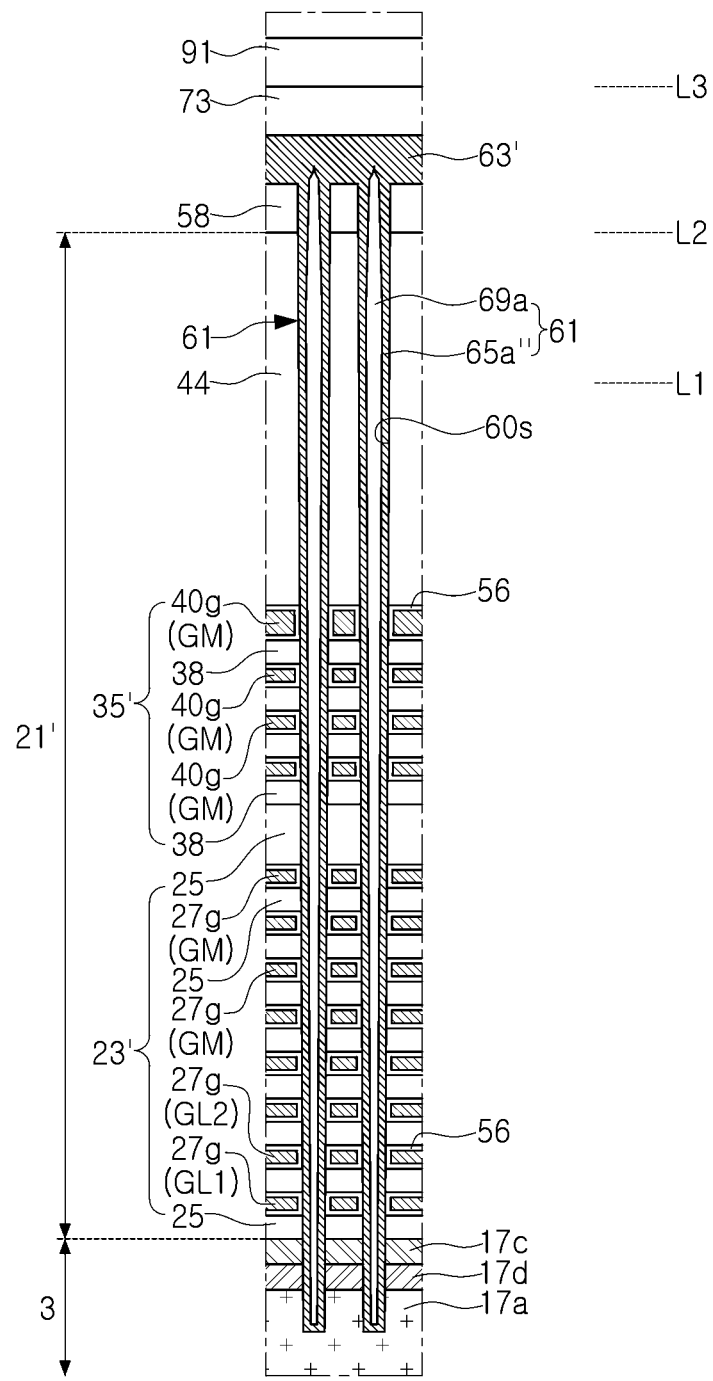
FIG. 4B is an enlarged diagram illustrating a modified example of a semiconductor device, illustrating a portion of the semiconductor device according to an example embodiment of the present disclosure.

In another modified example, referring to FIG. 4B, the capping layer 63 including the lower capping layer 65c and the upper capping layer 67 described with reference to FIG. 3B, and the support layer 65a may be replaced by a capping layer 63' and a support layer 65a'', which may limit the air gap 69a by a single material layer. For example, the support layer 65a'' may be integrated with the capping layer 63'. For example, in FIG. 3B, the upper capping layer 67 formed by a process different from the process of forming the support layer 65a may limit an upper portion of the air gap 69a, but in FIG. 4B, the capping layer 63' formed by the same process as the process of forming the support layer 65a'' may limit an upper portion of the air gap 69a.

Figure 5A:
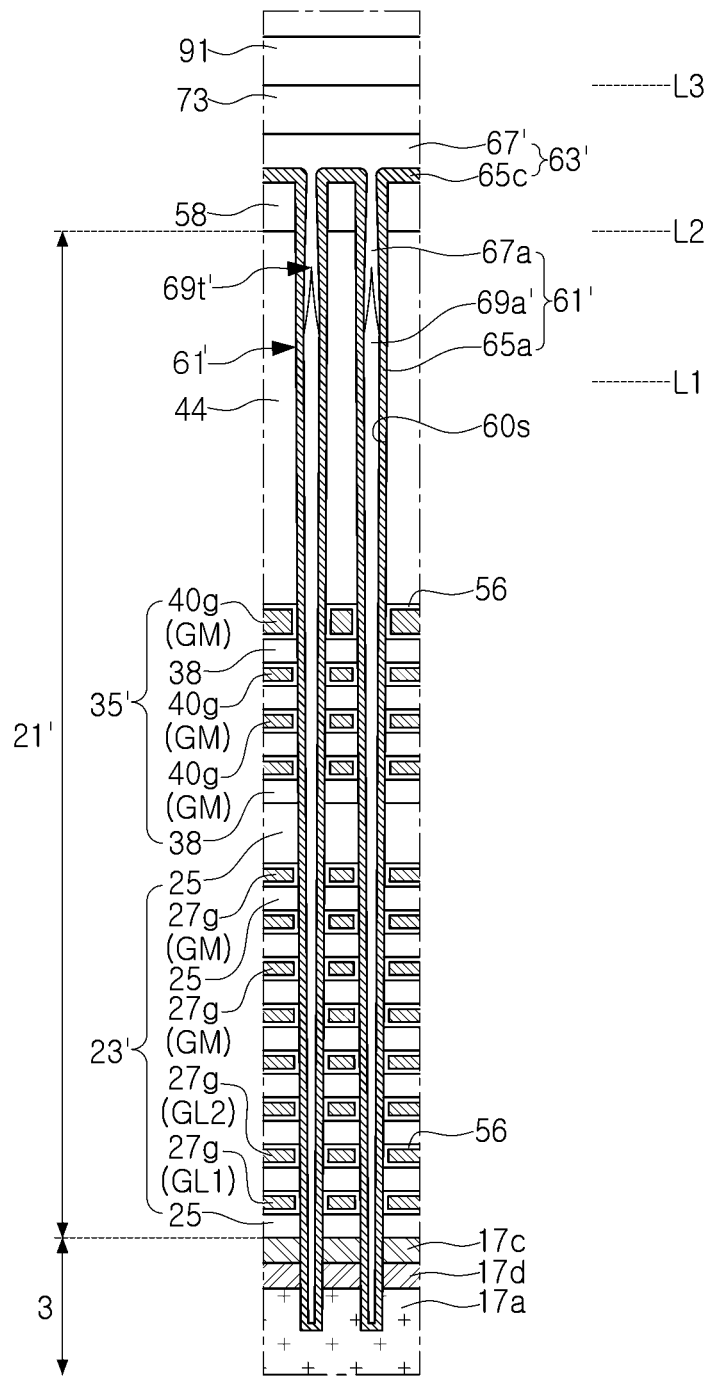
FIG. 5A is an enlarged diagram illustrating a modified example of a semiconductor device, illustrating a portion of the semiconductor device according to an example embodiment of the present disclosure.

In another modified example, referring to FIG. 5A, the support vertical structure 61 described with reference to FIG. 3B may be replaced with a support vertical structure 61' including an air gap 69a', a support layer 65a defining a portion of the air gap 69a', and an upper gap-fill layer 67a defining an upper portion of the air gap 69a'. The capping layer 63 including the lower capping layer 65c and the upper capping layer 67 described with reference to FIG. 3B may be replaced with a capping layer 63' including an upper capping layer 67' extending from the upper gap-fill layer 67a.

In an example, the upper end 69t' of the air gap 69' may be lower than the second level L2, and may be higher than the first level L1. In this case, the upper gap-fill layer 67a may be provided on the upper end 69t' of the air gap 69' between the first level L1 and the second level L2.

Figure 5B:
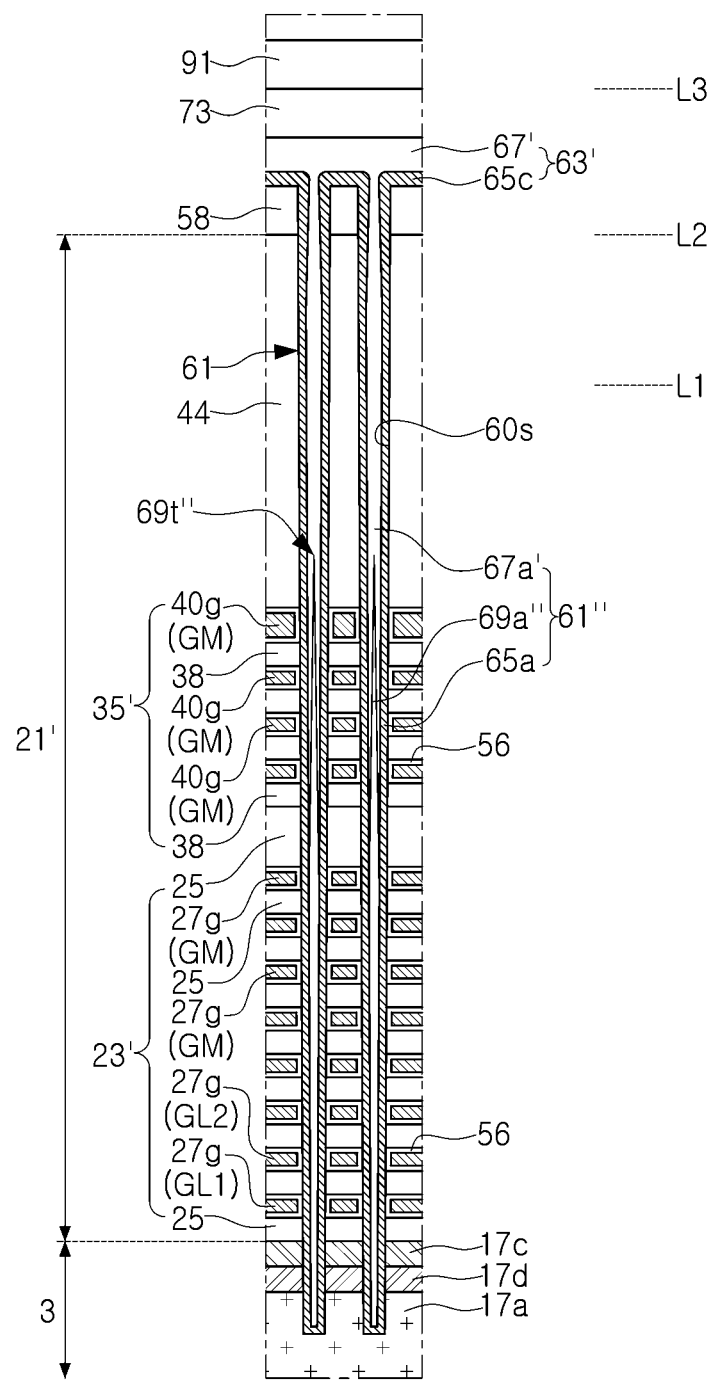
FIG. 5B is an enlarged diagram illustrating a modified example of a semiconductor device, illustrating a portion of the semiconductor device according to an example embodiment of the present disclosure.

In another modified example, referring to FIG. 5B, the support vertical structure 61' described with reference to FIG. 3A may be replaced with a support vertical structure 61'' including an air gap 69a'' having an upper end 69t''' lower than the first level L1, a support layer 65a defining a portion of the air gap 69a''', and an upper gap-fill layer 67a' defining an upper portion of the air gap 69a'''.

In the description below, various modified examples of the peripheral contact plug 87 and/or the spacer layer 65b described above will be described with reference to FIGS. 6A, 6B, 7A and 7B. FIGS. 6A, 6B, 7A and 7B are enlarged diagrams illustrating a modified portion of the example in the enlarged diagram in FIG. 3C. Various modified structures described below with reference to FIGS. 6A, 6B, 7A and 7B may replace the structure in FIG. 3C.

Figure 6A:
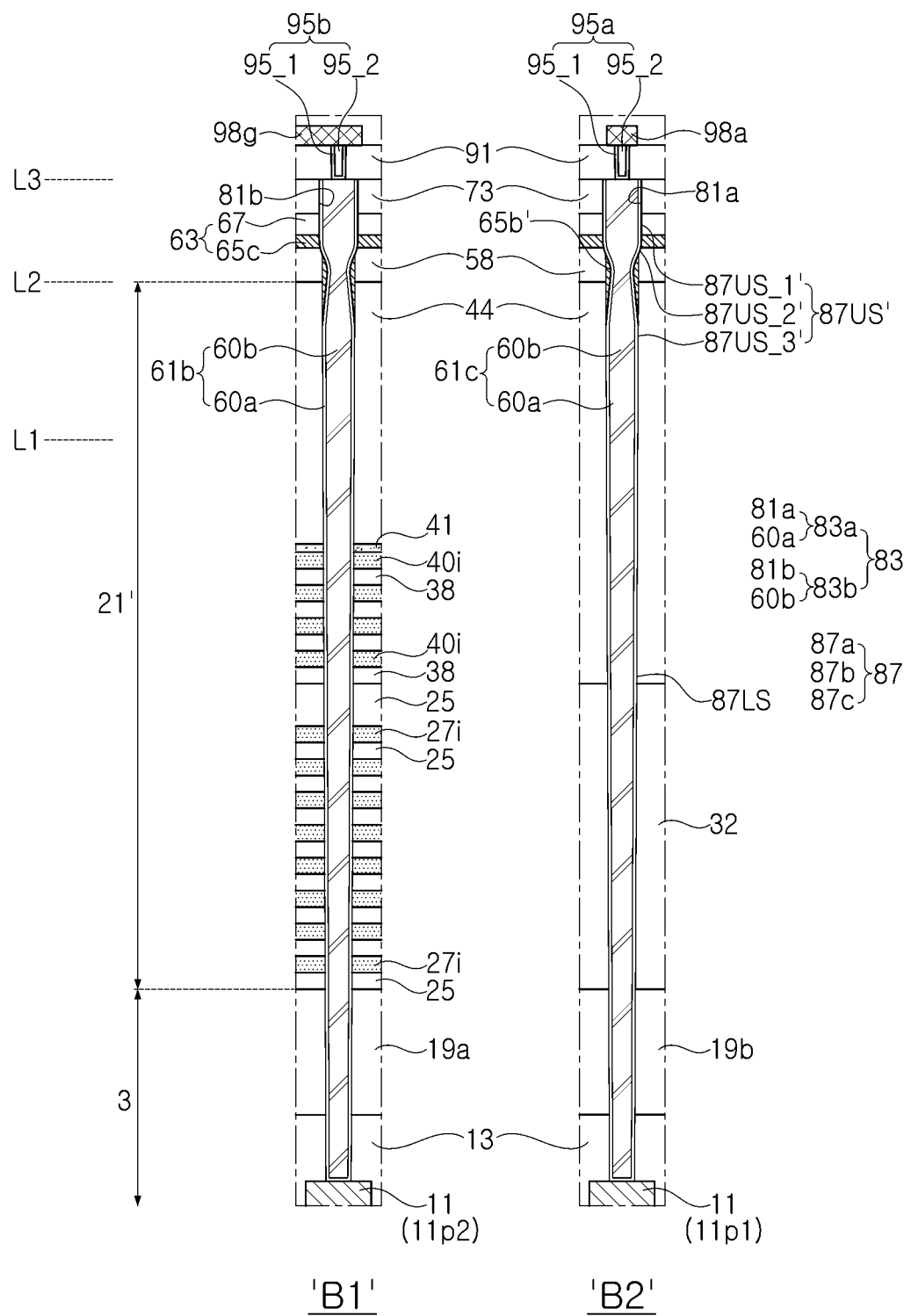
FIG. 6A is an enlarged diagram illustrating a modified example of a semiconductor device, illustrating a portion of the semiconductor device according to an example embodiment of the present disclosure.

In a modified example, referring to FIG. 6A, in the peripheral contact plug 87 including the lower region 87LS and the upper region 87US described with reference to FIG. 3C, the upper region 87US may be replaced with the same shape as that of the upper region 87US' in FIG. 6A.

The upper region 87US' may include a second region 87US_3', a connection region 87US_2' on the second region 87US_3', and a first region 87US_1' on the connection region 87US_2'. The connection region 87US_2' may have a concave side surface. For example, in the upper region 87U', the connection region 87US_2' may have a concave side surface in a direction toward a center of the upper region 87U' as compared to the first and second regions 87US_1' and 87US_3'. In the upper region 87U', a minimum width of the connection region 87US_2' may be smaller than a width of the second region 87US_3' adjacent to the connection region 87US_2'.

In the upper region 87US', a minimum width of the connection region 87US_2' may be smaller than a minimum width of the first region 87US_1'.

In the upper region 87US', a width of the first region 87US_1' may be greater than a width of the second region 87US_3'.

The spacer layer 65b described with reference to FIG. 3C may be replaced with a spacer layer 65b' which may not cover the lower region 87LS and may cover the side surface of the connection region 87US_2'. For example, the spacer layer 65b' may fill the concave side surface of the connection region 87US_2'.

Figure 6B:
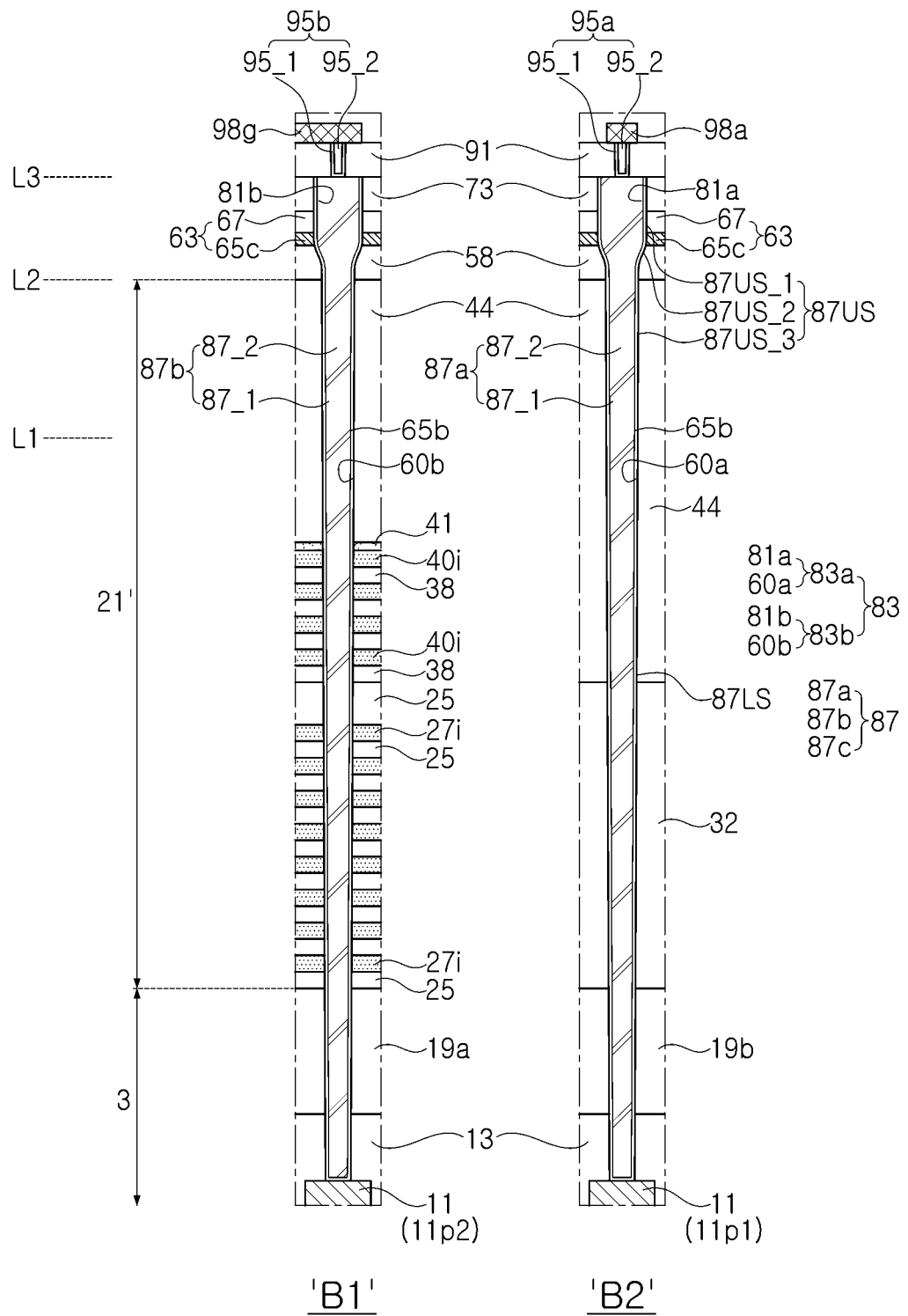
FIG. 6B is an enlarged diagram illustrating a modified example of a semiconductor device, illustrating a portion of the semiconductor device according to an example embodiment of the present disclosure.

In a modified example, referring to FIG. 6B, the spacer layer 65b describes with reference to FIG. 3C may not be provided. For example, the peripheral contact plugs 87 may include a portion in direct contact with the second structure 21'.

Figure 7A:
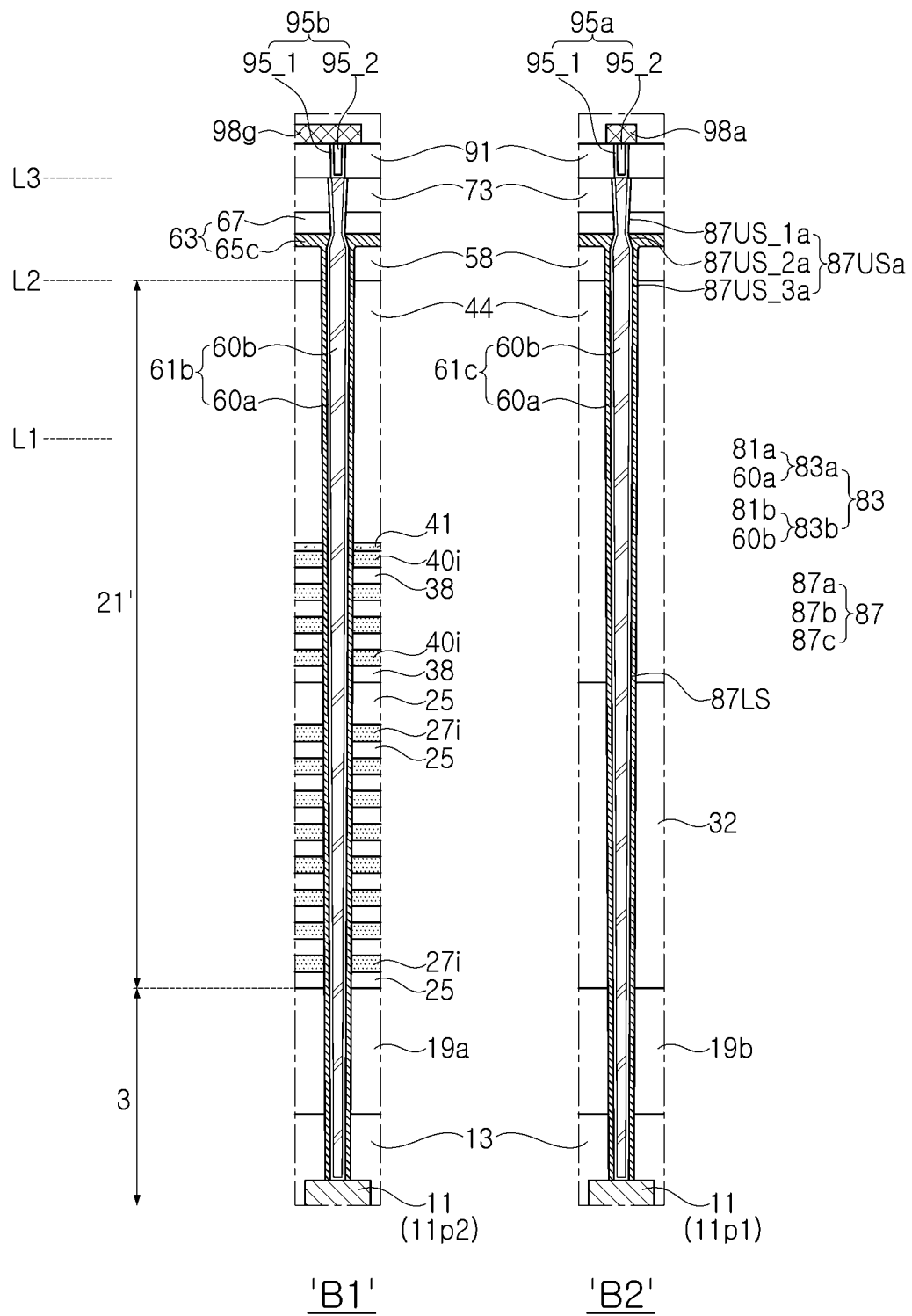
FIG. 7A is an enlarged diagram illustrating a modified example of a semiconductor device, illustrating a portion of the semiconductor device according to an example embodiment of the present disclosure.

In a modified example, referring to FIG. 7A, in the peripheral contact plug 87 including the lower region 87LS and the upper region 87US described with reference to FIG. 3C, the upper region 87US may be replaced with the same shape as that of the upper region 87USa in FIG. 7A.

The upper region 87USa may include a second region 87US_3a, a connection region 87US_2a on the second region 87US_3a, and a first region 87US_1a on the connection region 87US_2a.

In the upper region 87USa, a minimum width of the first region 87US_1a may be smaller than a maximum width of the connection region 87US_2a, a maximum width of the second region 87US_3a may be greater than a minimum width of the connection region 87US_2a, and the maximum width of the second region 87US_3a may be greater than the maximum width of the first region 87US_1a. The spacer layer 65b described with reference to FIG. 3C may be continuously connected to and integrated with the capping layer 65c.

Figure 7B:
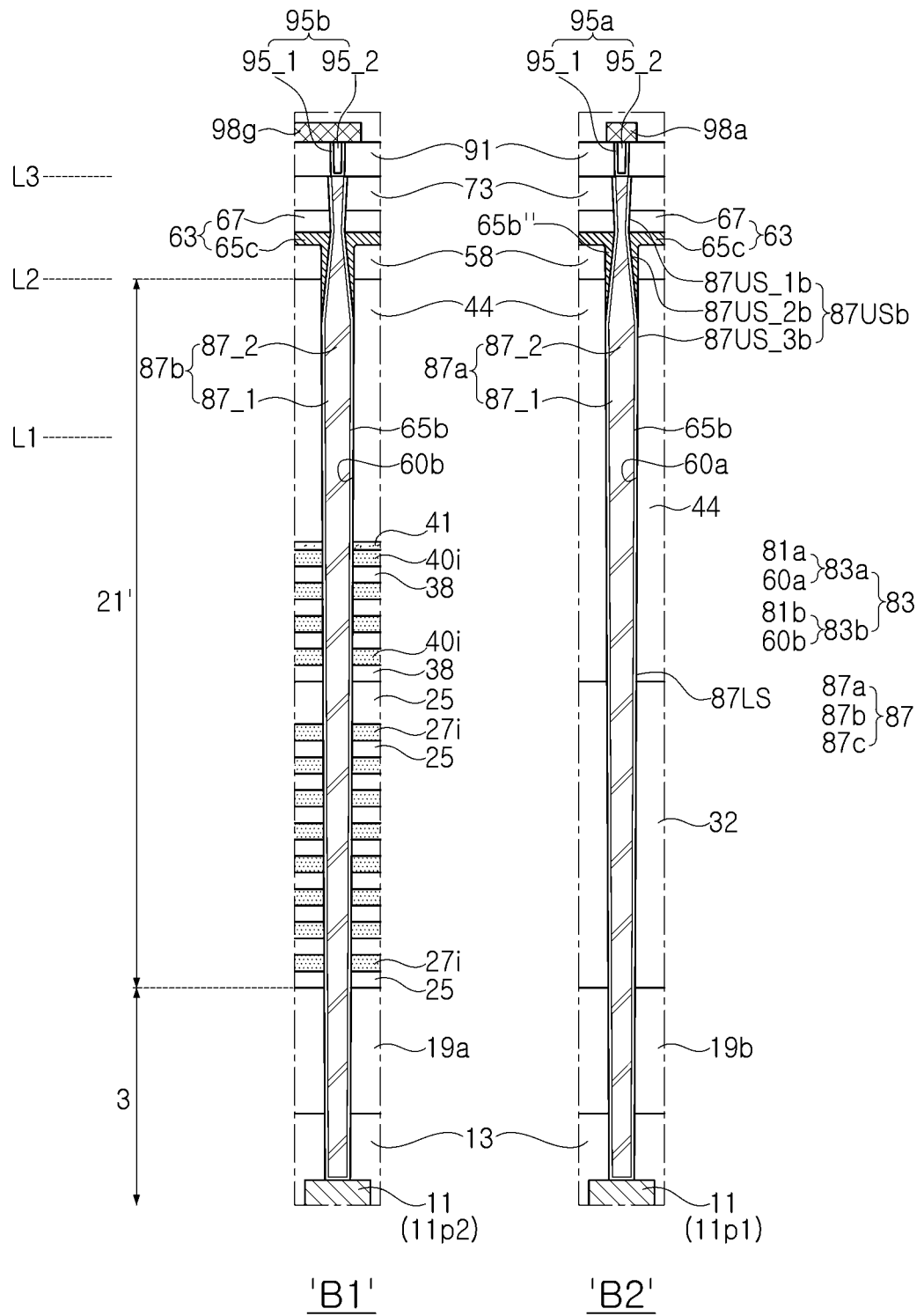
FIG. 7B is an enlarged diagram illustrating a modified example of a semiconductor device, illustrating a portion of the semiconductor device according to an example embodiment of the present disclosure.

In a modified example, referring to FIG. 7B, in the peripheral contact plug 87 including the lower region 87LS and the upper region 87US described with reference to FIG. 3C, the upper region 87US may be replaced with the same shape as that of the upper region 87USb in FIG. 7B, and the spacer layer 65b described with reference to FIG. 3C may be replaced by a spacer layer 65b" as in FIG. 7B.

The upper region 87USb may include a second region 87US_3b, a connection region 87US_2b on the second region 87US_3b, and a first region 87US_1b on the connection region 87US_2b, and a width of the first region 87US_1b may be smaller than a width of the second region 87US_3b. The connection region 87US_2b may have a tapered shape that narrows as it approaches the first region 87US_1b.

The spacer layer 65b" may cover at least a portion of the side surface of the connection region 87US_2b. The spacer layer 65b" may not cover an entire side surface of the second region 87US_3b or may not cover a portion of the side surface of the second region 87US_3b. The peripheral contact plug 87 disposed below the spacer layer 65b" may include a portion in contact with the second structure 21'. The spacer layer 65b" may be continuously connected to and integrated with the lower capping layer 65c.

Figure 7C:
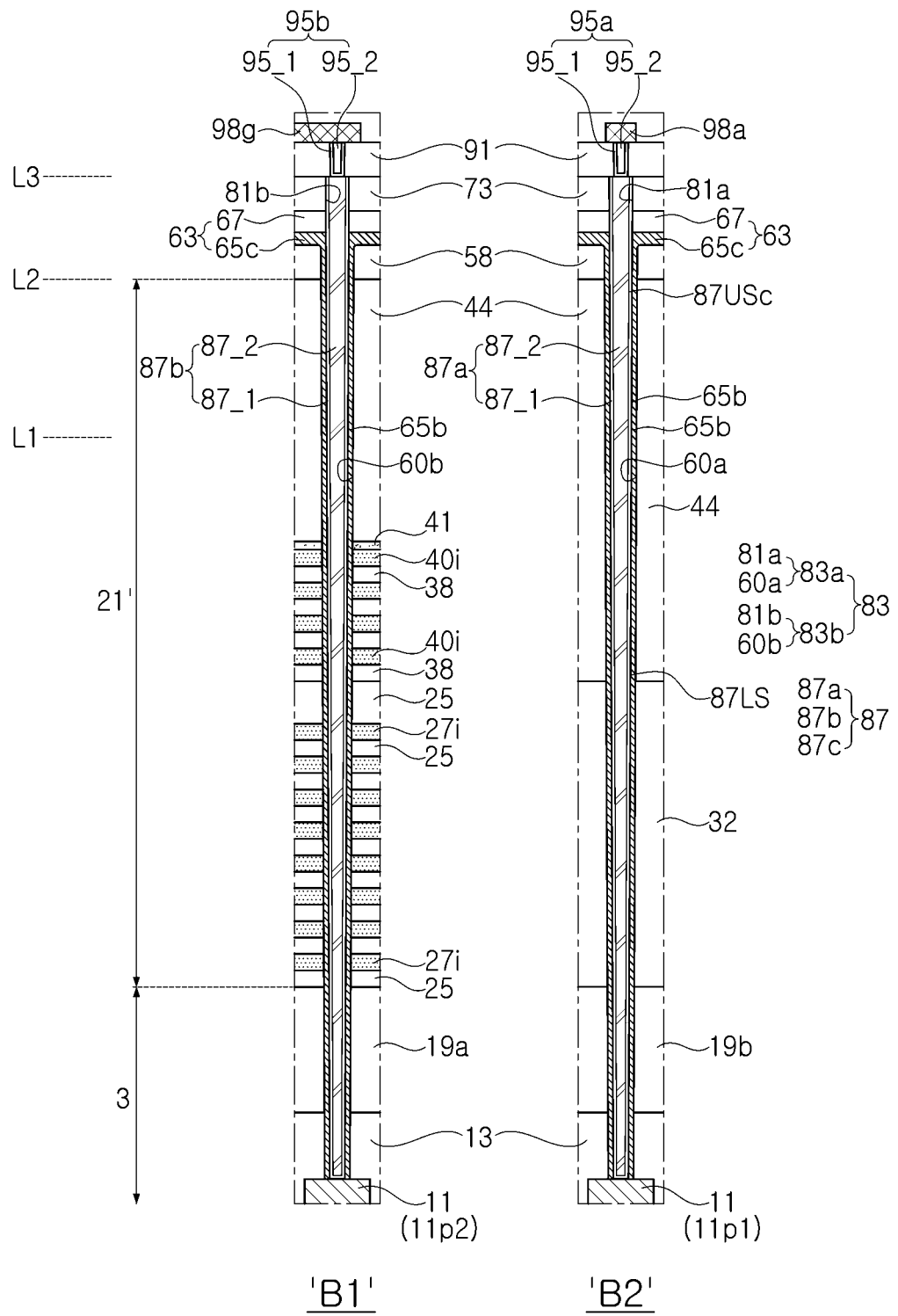
FIG. 7C is an enlarged diagram illustrating a modified example of a semiconductor device, illustrating a portion of the semiconductor device according to an example embodiment of the present disclosure.

In a modified example, referring to FIG. 7C, in the peripheral contact plug 87 including the lower region 87LS and the upper region 87US described with reference to FIG. 3C, the upper region 87US may be replaced with the upper region 87USc extending from the lower region 87LS to have a constant width or to have a monotonically changing width. For example, the side surface of the peripheral contact plug 87 including the lower region 87LS and the upper region 87USc may have a substantially linear shape or a monotonically changing shape with regularity.

Figure 8A:
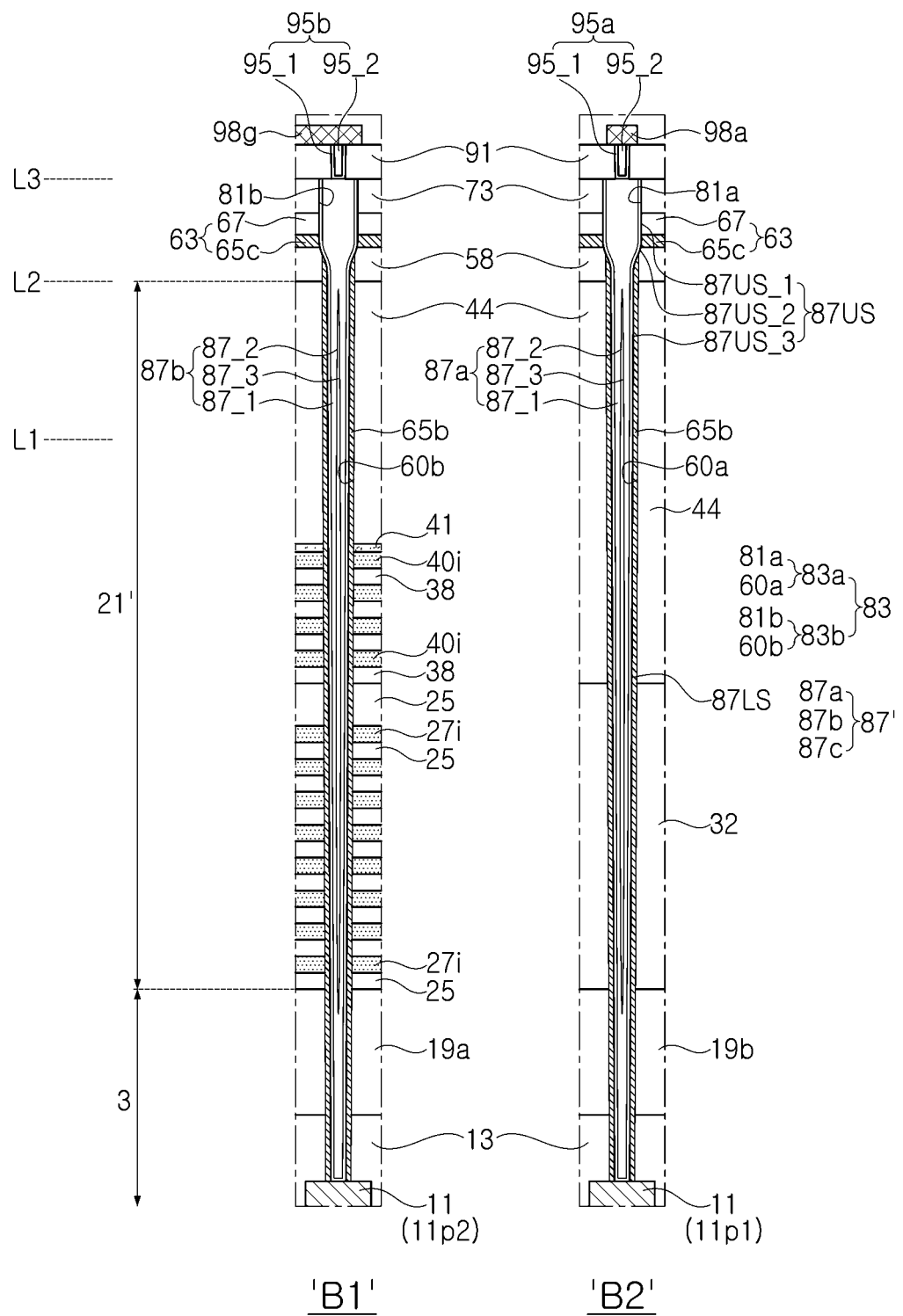
FIG. 8A is an enlarged diagram illustrating a modified example of a semiconductor device, illustrating a portion of the semiconductor device according to an example embodiment of the present disclosure.

In the description below, a modified example of the peripheral contact plug 87 described above will be described with reference to FIG. 8A. FIG. 8A is an enlarged diagram illustrating a modified portion of the example in the enlarged diagram in FIG. 3C. The modified structure of the peripheral contact plug 87 described below with reference to FIG. 8A may replace the structure of the peripheral contact plug 87 in FIG. 3C and also the structure of the peripheral contact plug 87 described with reference to FIGS. 6A to 7C.

In the modified example, referring to FIG. 8A, the peripheral contact plug 87 described with reference to FIG. 3C or the peripheral contact plug 87 described with reference to FIGS. 6A to 7C may be replaced with a peripheral contact plug 87' further including an air gap 87_3. For example, the peripheral contact plug 87' may include a plug pattern 87_2, a conductive liner 87_1 covering a side surface and a bottom surface of the plug pattern 87_2, and an air gap 87_3 in the plug pattern 87_2.

In the peripheral contact plug 87', an upper end of the air gap 87_3 may be lower than the second level L2.

In the peripheral contact plug 87', an upper end of the air gap 87_3 may be higher than the first level L1.

Figure 8B:
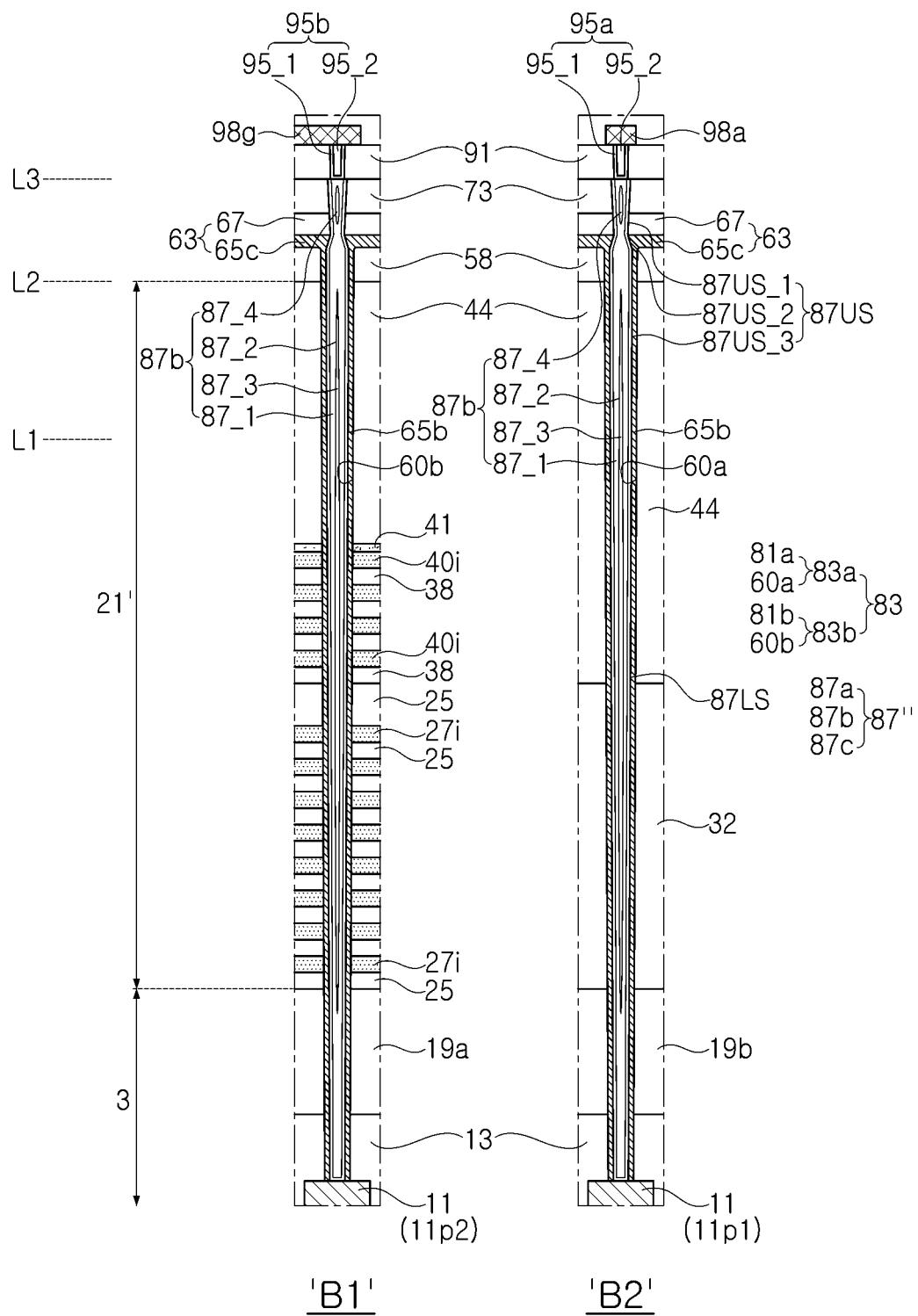
FIG. 8B is an enlarged diagram illustrating a modified example of a semiconductor device, illustrating a portion of the semiconductor device according to an example embodiment of the present disclosure.

In the description below, a modified example of the peripheral contact plug 87 described above will be described with reference to FIG. 8B. FIG. 8B is an enlarged diagram illustrating a modified portion of the example in the enlarged diagram in FIG. 7A. The modified structure of the peripheral contact plug 87 described below with reference to FIG. 8B may replace the structure of the peripheral contact plug 87 in FIG. 7A, and also the structure of the peripheral contact plug 87 described with reference to FIGS. 3C, 6A, 6B, 7B, and 7C.

In a modified example, referring to FIG. 8B, the peripheral contact plug 87 described with reference to FIG. 7A or the peripheral contact plug 87 described with reference to FIGS. 3A, 6A, 6B, 7B and 7C may be replaced with a peripheral contact plug 87" further including a lower air gap 87_3 and an upper air gap 87_4. For example, the peripheral contact plug 87" may include a plug pattern 87_2, a conductive liner 87_1 covering a side surface and a bottom surface of the plug pattern 87_2, and the lower air gap 87_3 and the upper air gap 87_4 disposed in the plug pattern 87_2 and spaced apart from each other. In other words, the lower air gap 87_3 and the upper air gap 87_4 constitute two separate air gaps.

In the peripheral contact plug 87", an upper end of the lower air gap 87_3 may be lower than the second level L2.

In the peripheral contact plug 87", the upper end of the lower air gap 87_3 may be higher than the first level L1.

In the peripheral contact plug 87", the upper air gap 87_4 may be higher than the second level L2. An upper end of the upper air gap 87_4 may be lower than the third level L3. In the alternative, the upper end of the upper air gap 87_4 may be higher than the third level L3.

Figure 9A:
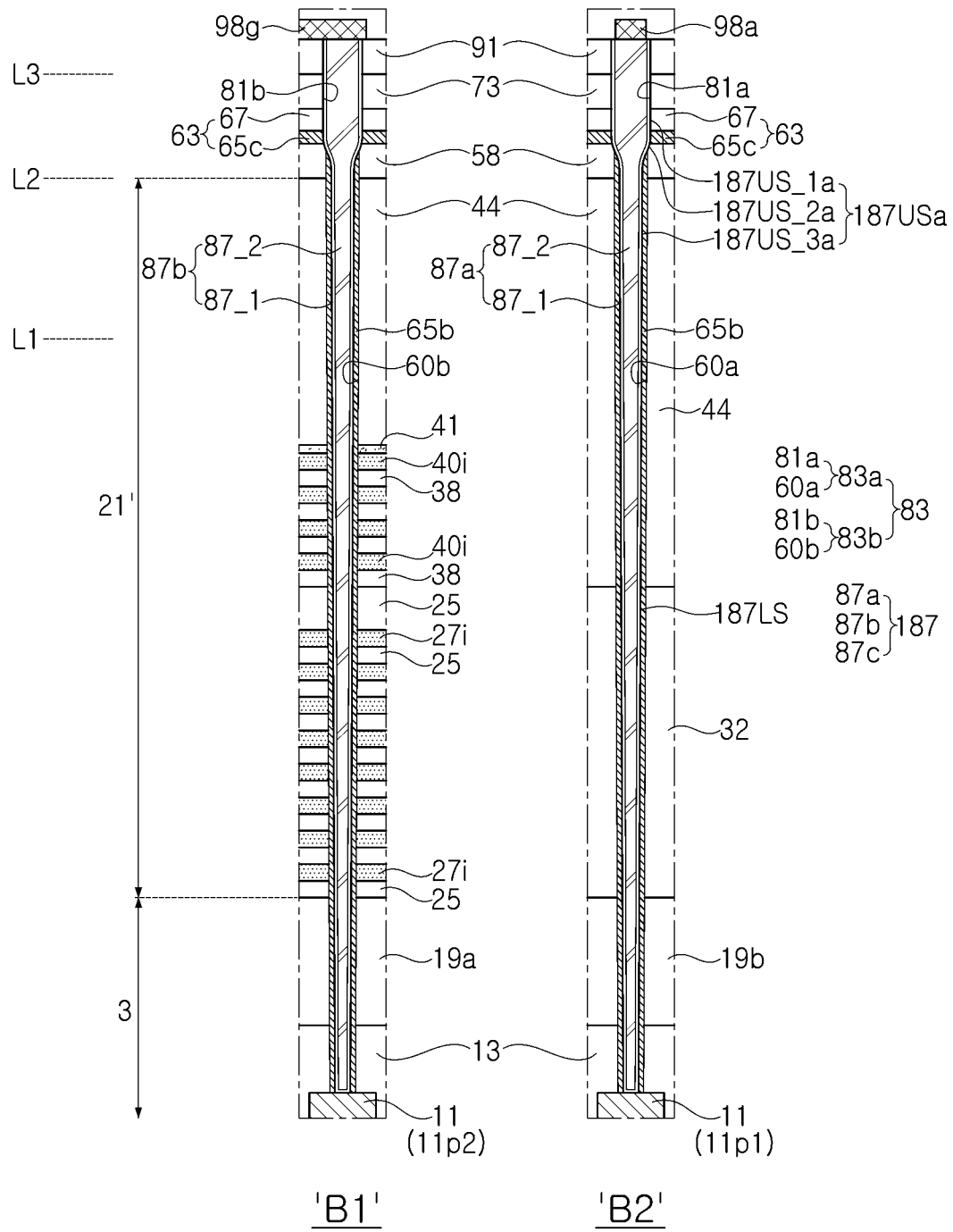
FIG. 9A is an enlarged diagram illustrating a modified example of a semiconductor device, illustrating a portion of the semiconductor device according to an example embodiment of the present disclosure.
Figure 9B:
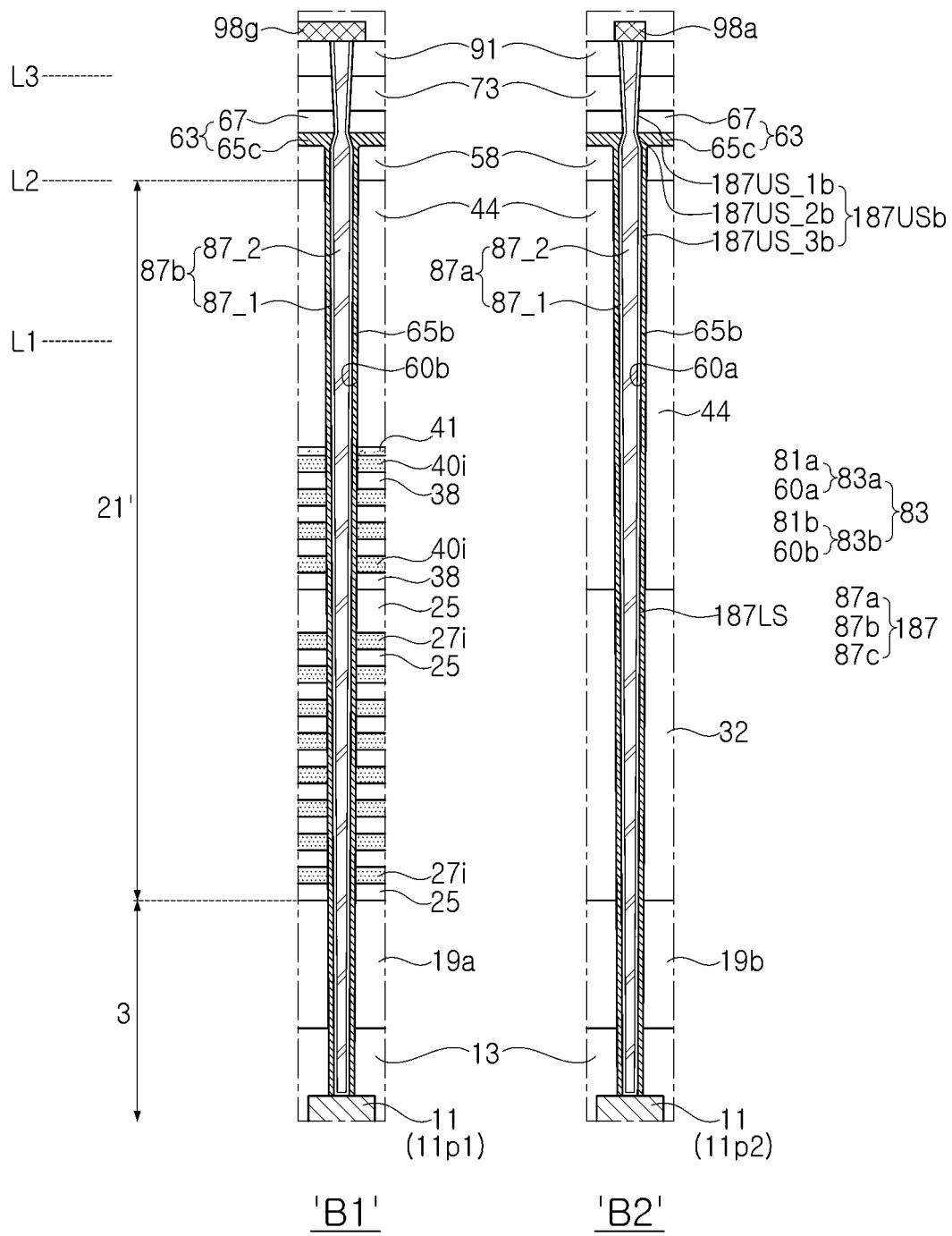
FIG. 9B is an enlarged diagram illustrating a modified example of a semiconductor device, illustrating a portion of the semiconductor device according to an example embodiment of the present disclosure.

In the description below, a modified example of the above-described peripheral contact plug 87 will be described with reference to FIGS. 9A and 9B. FIG. 9A is an enlarged diagram illustrating a modified portion of the example in the enlarged diagram in FIG. 3C, and FIG. 9B is an enlarged diagram illustrating a modified portion of the example in the enlarged diagram in FIG. 7A. The modified structure of the peripheral contact plug 87 described below with reference to FIGS. 9A and 9B, a structure in which the level of the upper surface is increased, for example, may be reflected in the structure of the peripheral contact plug 87 in FIGS. 3C and 7A and also in the peripheral contact plugs 87, 87' and 87" described with reference to FIGS. 6A, 6B, 7B, 7C, 8A, and 8B. For example, the level of the upper surfaces of the peripheral contact plugs 87, 87', and 87" described with reference to FIGS. 6A, 6B, 7B, 7C, 8A, and 8B may be modified to increase.

In a modified example, referring to FIG. 9A, the peripheral contact plug 87 including the upper region 87US described with reference to FIG. 3C may be replaced with a peripheral contact plug 187 including an upper region 187USa including an upper surface disposed on a higher level than previously described peripheral contact plugs. The peripheral contact plug 187 may include a lower region 187LS substantially the same as the lower region 87LS described with reference to FIG. 3C.

The upper region 187USa may include a second region 187US_3a and a connection region 187US_2a substantially the same as the second region 87US_3 and the connection region 87US_2 described with reference to FIG. 3C, and may include a first region 187US_1a disposed on a level higher than a level of the first region 87US_1 described with reference to FIG. 3C.

The upper region 187USa may have an upper surface coplanar with the upper surface of the third upper insulating layer 91. The upper surface of the upper region 187USa of the peripheral contact plug 187 may be higher than the third level L3.

The peripheral contact plug 187 may have upper surfaces disposed on a level higher than upper surfaces of the gate contact plugs 89 (in FIG. 2A).

In a modified example, referring to FIG. 9B, the peripheral contact plug 87 including the upper region 87USa described with reference to FIG. 7A may be replaced with a peripheral contact plug 187 including an pp region 187USb having an upper surface disposed on a higher level than some of the previously described peripheral contact plugs.

Similarly to the upper region 187USa described with reference to FIG. 9A, the upper region 187USb may include a second region 187US_3b and a connection region 187US_2b, which may be substantially the same as the second region 87US_3a and the connection region 87US_2a described with reference to FIG. 7A, and may include a first region 187US_1b disposed on a level higher than a level of the first region 87US_1a described with reference to FIG. 7A. The first region 187US_1b of FIG. 9B may be narrower than the first region 187US_1a of FIG. 9A.

Figure 10A:
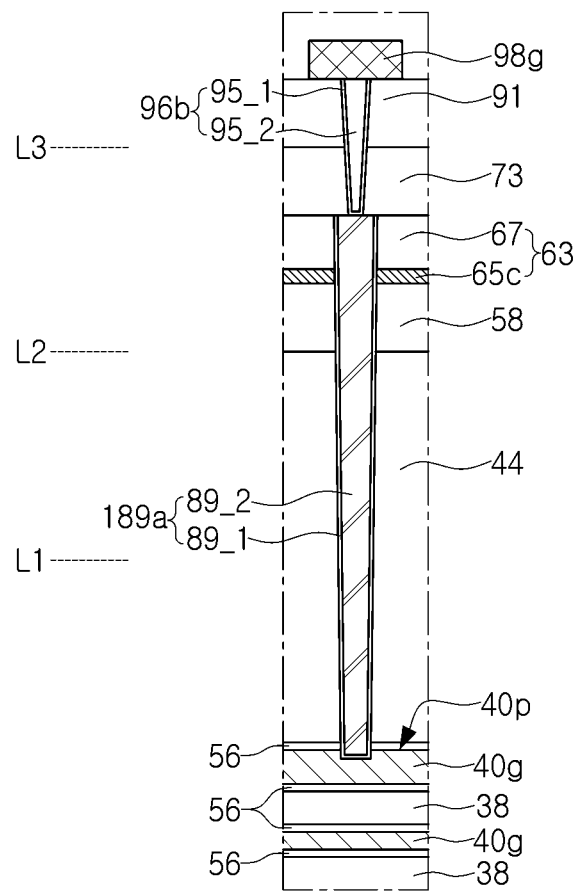
FIG. 10A is an enlarged diagram illustrating a modified example of a semiconductor device, illustrating a portion of the semiconductor device according to an example embodiment of the present disclosure.
Figure 10B:
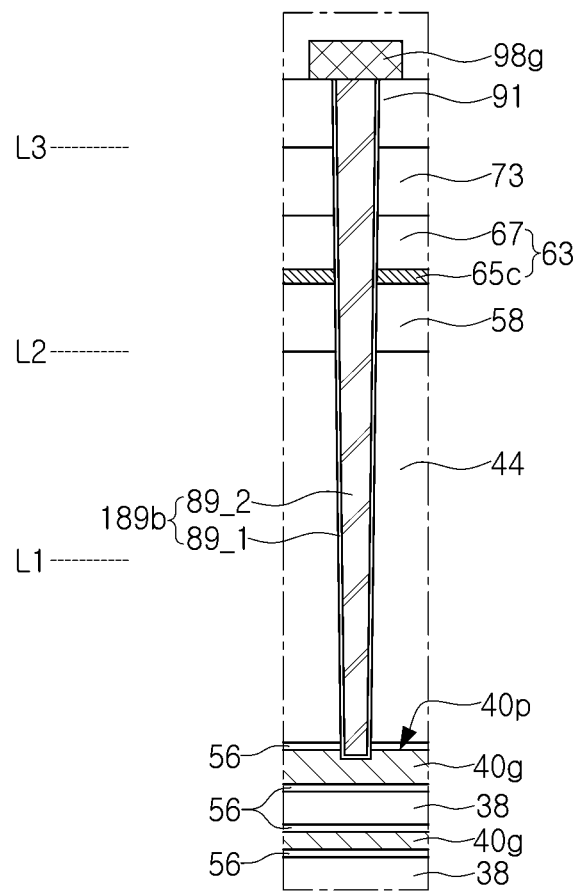
FIG. 10B is an enlarged diagram illustrating a modified example of a semiconductor device, illustrating a portion of the semiconductor device according to an example embodiment of the present disclosure.

In the description below, a modified example of the gate contact plug 89 described above will be described with reference to FIGS. 10A and 10B. FIGS. 10A and 10B are enlarged diagrams illustrating a modified portion of the example in the enlarged diagram in FIG. 3D.

In a modified example, referring to FIG. 10A, the gate contact plug 89 described with reference to FIG. 3D may be replaced with a gate contact plug 189a having an upper surface disposed on a lower level than the gate contact plug 89. The gate contact plug 189a may have an upper surface coplanar with the upper surface of the capping layer 63. In other words, the upper surface of the gate contact plug 189a may not extend beyond the second upper insulating layer 73. Accordingly, the upper surface of the gate contact plug 189a may be disposed on a level lower than a level of the upper surfaces of the peripheral contact plugs 87, 87', 87", and 187 of the various examples described in FIGS. 3C, 6A, 6B, 7A, 7B, 7C, 8A, 8B, 9A, and 9B.

In a modified example, referring to FIG. 10B, the gate contact plug 89 described with reference to FIG. 3D may be replaced with a gate contact plug 189b having an upper surface disposed on a higher level than the gate contact plug 89. The gate contact plug 189b may have an upper surface coplanar with an upper surface of the third upper insulating layer 91. In this case, the upper surface of the gate contact plug 189a may extend beyond the second upper insulating layer 73. For example, the gate contact plug 189b may have an upper surface coplanar with the upper surface of the peripheral contact plug 187 of the various examples described with reference to FIGS. 9A and 9B.

Figure 11A:
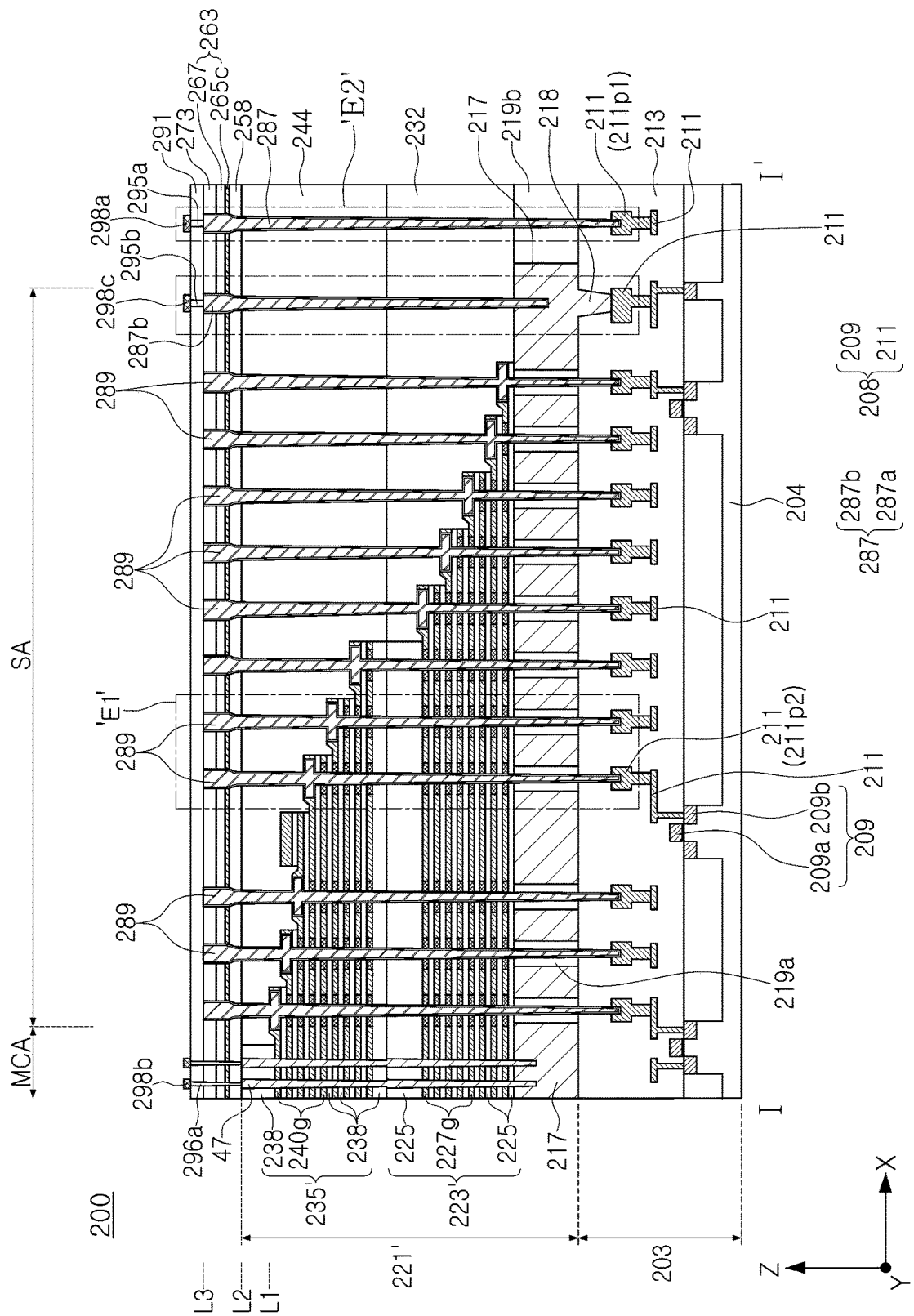
FIGS. 11A, 11B, and 12 are diagrams illustrating a modified example of a semiconductor device according to an example embodiment of the present disclosure.

A modified example of a semiconductor device according to an example embodiment will be described with reference to FIGS. 11A, 11B and 12. FIG. 11A is a cross-sectional diagram illustrating a cross-sectional structure taken in a first direction X, FIG. 11B is a cross-sectional diagram illustrating a cross-sectional structure taken in a second direction Y perpendicular to the first direction X, and FIG. 12 is an enlarged diagram illustrating regions "E1" and "E2" in FIG. 11A.

Figure 11B:
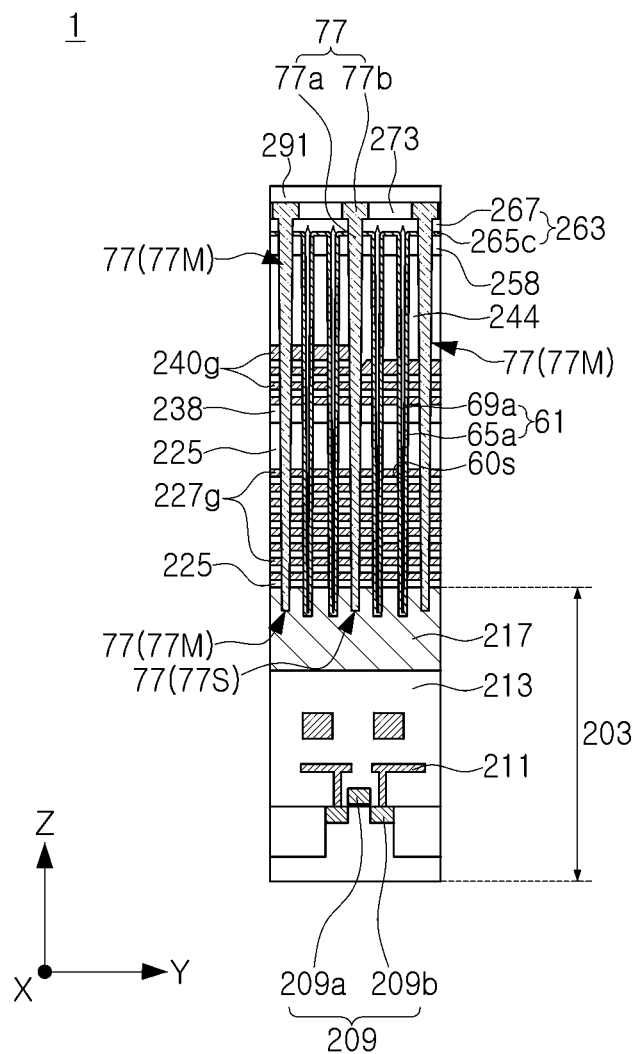
Figure 12:
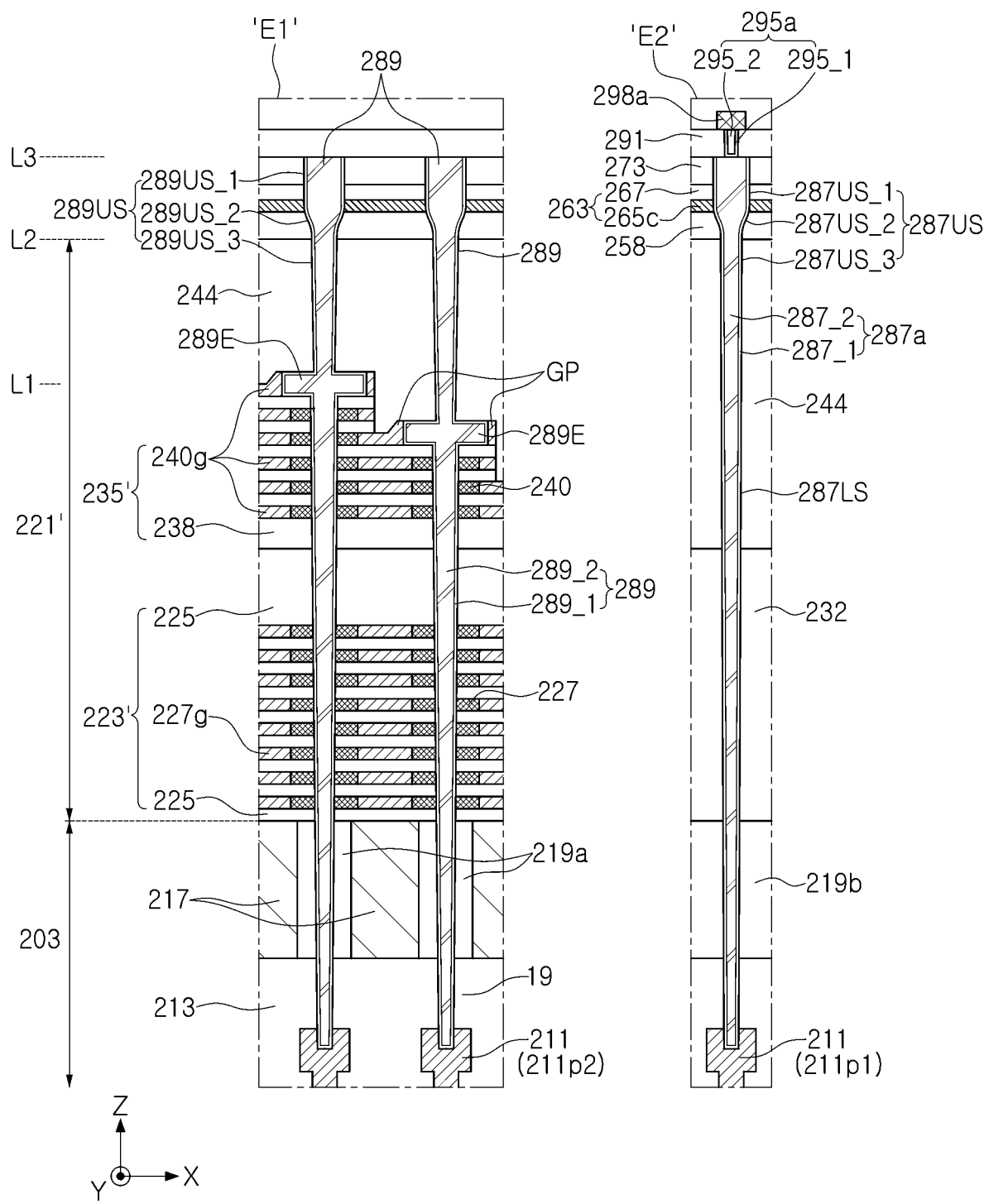

Referring to FIGS. 11A, 11B, and 12, a semiconductor device 200 according to an example embodiment of the present disclosure may include a first structure 203 and a second structure 221' overlapping the first structure 203 in the vertical direction Z.

The first structure 203 may include a pattern structure 217. The pattern structure 217 may include at least one silicon layer. The pattern structure 217 may be substantially the same as the pattern structure 17' in FIGS. 2A and 2B.

The first structure 203 may include a semiconductor substrate 204, a peripheral circuit 208 on the semiconductor substrate 204, and a lower insulating layer 213 covering the peripheral circuit 208 on the semiconductor substrate 204. The peripheral circuit 208 may include a circuit device 209 such as a transistor including a peripheral gate 209a and a peripheral source/drain 209b, and a circuit interconnection 211 electrically connected to the circuit device 209. A portion of the circuit interconnection 211 may be first and second peripheral circuit pads 211p1 and 211p2. The pattern structure 217 may be disposed on the lower insulating layer 213. The pattern structure 217 may further include a ground pattern 218. For example, the ground pattern 218 may be disposed below the pattern structure 217 and may be grounded to the semiconductor substrate 204 through a portion of the circuit interconnection 211.

The first structure 203 may further include internal insulating layers 219a penetrating the pattern structure 217 and an external insulating layer 219b disposed on an external side of the pattern structure 217.

The second structure 221' may include a memory cell region MCA and a staircase region SA. The second structure 221' may include stack structures 223' and 235' disposed in the memory cell region MCA and extending from the memory cell region MCA into the staircase region SA.

The stack structures 223' and 235' may include a first stack structure 223' and a second stack structure 235' on the first stack structure 223'. The first stack structure 223' may include first interlayer insulating layers 225 and first gate layers 227g alternately stacked in the vertical direction Z. The first gate layers 227g may have gate pads GP arranged in a staircase shape in the staircase region SA. The second stack structure 225' may include second interlayer insulating layers 238 and second gate layers 240g alternately stacked in the vertical direction Z. The second gate layers 240g may have gate pads GP arranged in a staircase shape in the staircase region SA.

The first interlayer insulating layers 225 and the second interlayer insulating layers 238 may form interlayer insulating layers 225 and 238, and the first gate layers 227g and the second gate layers 240g may form gate layers 227g and 240g. The gate pads GP of the gate layers 227g and 240g may have a thickness greater than a thickness of each of the gate layers 227g and 240g disposed in the memory cell array region MCA. The gate layers 227g and 240g may be formed of substantially the same material as that of the gate layers 27g and 40g in FIGS. 2A and 2B.

The semiconductor device 200 according to an example embodiment of the present disclosure may further include a memory vertical structure 47 penetrating the second structure 221'. The memory vertical structure 47 may be substantially the same as the memory vertical structure 47 in FIGS. 2A 2B, and 3A, and the pattern structure 217 in contact with the memory vertical structure 47 may be substantially the same as the pattern structure 17 in FIGS. 2A, 2B and 3A.

The semiconductor device 200 according to an example embodiment of the present disclosure may further include a first upper insulating layer 258 on the second structure 221'. The first upper insulating layer 258 may include silicon oxide.

The semiconductor device 200 according to an example embodiment of the present disclosure may further include support holes 60s penetrating the first upper insulating layer 258 and the second structure 221' and exposing a portion of the pattern structure 217, and support vertical structures 61 disposed in the support holes 60s. The support vertical structures 61 may be substantially the same as one of the support vertical structures 61 and 61' described in reference to FIGS. 2B, 2C, 3B, 4A, 4B, 5A and 5B, the support vertical structure 61 described with reference to FIG. 3B, for example. For example, as described with reference to FIG. 3B, the support vertical structure 61 may include an air gap 69*a* and a support layer 65*a* defining at least a portion of the air gap 69*a*.

The semiconductor device 200 according to an example embodiment of the present disclosure may further include a capping layer 263 disposed on the first upper insulating layer 258 and covering the support vertical structure 61. Similarly to the capping layer 63 described with reference to FIGS. 1 to 3D, the capping layer 263 may include a lower capping layer 265*c* and an upper capping layer 267 on the lower capping layer 265*c*.

The semiconductor device 200 according to an example embodiment of the present disclosure may further include a second upper insulating layer 273 on the capping layer 263.

A level on which an upper surface of an uppermost gate layer among the gate layers 227*g* and 240*g* is disposed may be a first level L1, a level on which an upper surface of the memory vertical structure 47 is disposed may be a second level L2, and a level on which an upper surface of the second upper insulating layer 273 is disposed may be a third level L3.

The semiconductor device 200 according to an example embodiment may include separation structures 77 penetrating the second upper insulating layer 273, the capping layer 263, the first upper insulating layer 258, and the second structure 221'. The separation structures 277 may be substantially the same as the separation structures 77 in FIGS. 1 and 2C.

The semiconductor device 200 according to an example embodiment of the present disclosure may further include peripheral contact plugs 287. The peripheral contact plugs 287 may include a first peripheral contact plug 287*a* and a second peripheral contact plug 287*b*. The peripheral contact plugs 287 may penetrate the second upper insulating layer 273, the capping layer 263, the first upper insulating layer 258, and the second structure 221', and may extend into the lower structure 203.

The first peripheral contact plug 287*a* may be spaced apart from the first and second gate layers 227*g* and 240*g*, may penetrate intermediate insulating layers 232 and 244, may be in contact with the first peripheral circuit pad 211*p*1, and may be electrically connected to the first peripheral circuit pad 211*p*1.

The second peripheral contact plug 287*b* may be spaced apart from the first and second gate layers 227*g* and 240*g*, may penetrate the intermediate insulating layers 232 and 244, and may be in contact with and electrically connected to the pattern structure 217.

The peripheral contact plugs 287 may have the same structure as that of one of the structures of the peripheral contact plugs 87, 87', 87", and 187 of the various examples described in reference to FIGS. 3C, 6A, 6B, 7A, 7B, 7C, 8A, 8B, 9A, and 9B. For example, the peripheral contact plugs 287 may have substantially the same structure as that of the peripheral contact plug 87 described with reference to FIG. 6B. For example, the peripheral contact plug 287 may include a lower region 287US and an upper region 287US, and the upper region 287US may include a first region 287US_1, a second region 287US_3, and a connection region 287US_2 corresponding to the first region 87US_1 (in FIG. 6B), the second region 87US_3 (in FIG. 6B), and the connection region 87US_2 (in FIG. 6B), respectively.

The semiconductor device 200 according to an example embodiment of the present disclosure may further include gate contact plugs 289. The gate contact plugs 289 may penetrate the second upper insulating layer 273, the capping layer 263, the first upper insulating layer 258, and the second structure 221', and may extend into the lower structure 203. The gate contact plugs 289 may penetrate the gate pads GP of the gate layers 227*g* and may also penetrate the gate layers 227*g* and 240*g*, and may be in contact with the gate pads GP and may be electrically connected to the gate pads GP. The gate contact plugs 289 may be electrically connected to the second peripheral circuit pads 211*p*2 in the lower structure 203.

The gate contact plugs 289 may be in contact with the gate pads GP and may be spaced apart from the other gate layers 227*g* and 240*g*. For example, one of the gate contact plugs 289 may be in contact with the gate pad GP of one of the gate layers 227*g* and 240*g*, and may be spaced apart from the gate layers 227*g* and 240*g* disposed on a level lower than a level of one of the gate layers by buffer insulating layers 227 and 240.

The gate contact plugs 289 may include protrusions 289E protruding in a horizontal direction from portions of the gate contact plugs 289 in contact with the gate pads GP. Accordingly, the protrusions 289E of the gate contact plugs 289 may be in contact with the gate pads GP.

Each of the gate contact plugs 289 may include an upper region 289US disposed on the same level as a level of the upper region 287US of the peripheral contact plug 287, and the structure of the upper region 289US of the contact plugs 289 may be substantially the same as the structure of the upper region 287US of the peripheral contact plug 287. For example, the upper region 289US of each of the gate contact plugs 289 may include a first region 289US_1, a second region 289US_3, and a connection region 289US_2 corresponding to the first region 287US_1, the second region 287US_3, and the connection region 287US_2 of the upper region 287US of the peripheral contact plug 287, respectively.

The semiconductor device 200 according to an example embodiment of the present disclosure may further include a third upper insulating layer 291 disposed on the second upper insulating layer 273.

The semiconductor device 2 according to an example embodiment of the present disclosure may further include peripheral upper plugs 295*a* and 295*b* penetrating the third upper insulating layer 291. The peripheral upper plugs 295*a* and 295*b* may include a first peripheral upper plug 295*a* electrically connected to the first peripheral contact plug 287*a*, and a second peripheral upper plug 295*b* electrically connected to the second peripheral contact plug 287*b*.

The semiconductor device 200 according to an example embodiment of the present disclosure may further include a bit line contact plug 296*a* penetrating the first to third upper insulating layers 258, 273, 271 and the capping layer 263, and electrically connected to the memory vertical structure 47.

Each of the peripheral upper plugs 295*a* and 295*b* and the bit line contact plug 296*a* may include a plug pattern 295_2 and a conductive liner 295_1 covering a side surface and a bottom surface of the plug pattern 295_2.

The semiconductor device 200 according to an example embodiment of the present disclosure may further include wirings 298*b*, 298*a*, and 298*c* disposed on the third upper insulating layer 291. The wirings 298*b*, 298*a*, and 298*c* may include bit lines 298*b* electrically connected to the bit line contact plugs 296*a*, a first peripheral wiring 298*a* electrically connected to the first peripheral upper plug 295*a*, and a second peripheral wiring 298*c* electrically connected to the second peripheral upper plug 295*b*.

Figure 13:
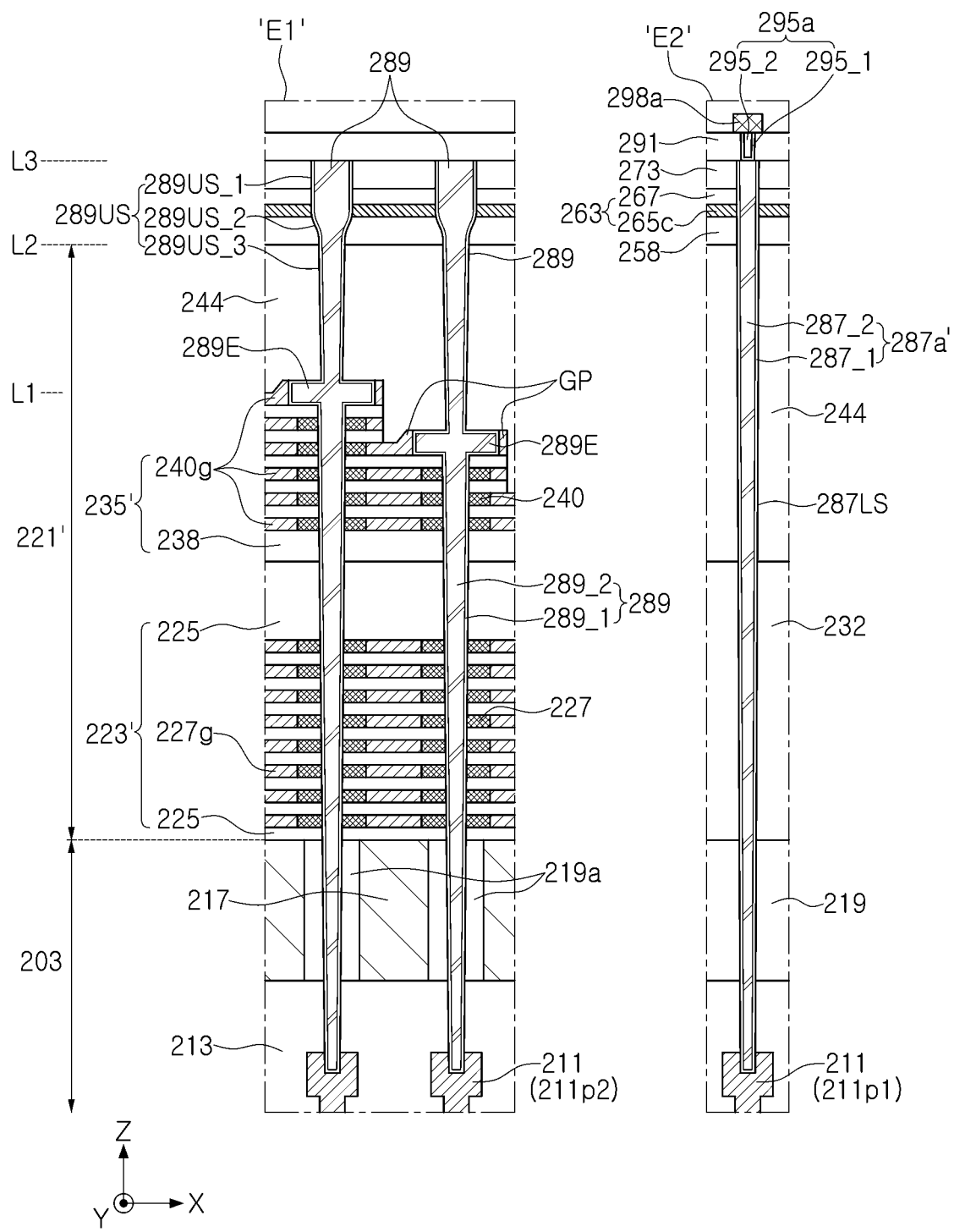
FIG. 13 is an enlarged diagram illustrating a modified example of a semiconductor device, illustrating a portion of the semiconductor device according to an example embodiment of the present disclosure.

In the description below, a modified example of the peripheral contact plug 287 described with reference to FIGS. 11A and 12 will be described with reference to FIG. 13. FIG. 13 may illustrate a modified structure of the peripheral contact plug 287 in the example in the enlarged diagram in FIG. 12.

In a modified example, referring to FIG. 13, the peripheral contact plug 287 in FIG. 12 may be modified to a peripheral contact plug 287a' having the same width or having a monotonically changing width. Accordingly, on the same level as a level of the upper region 289US of each of the gate contact plugs 289, a side-surface profile of the peripheral contact plug 287a' may be different from a side-surface profile of the upper region 289US of each of the gate contact plugs 289.

Figure 14:
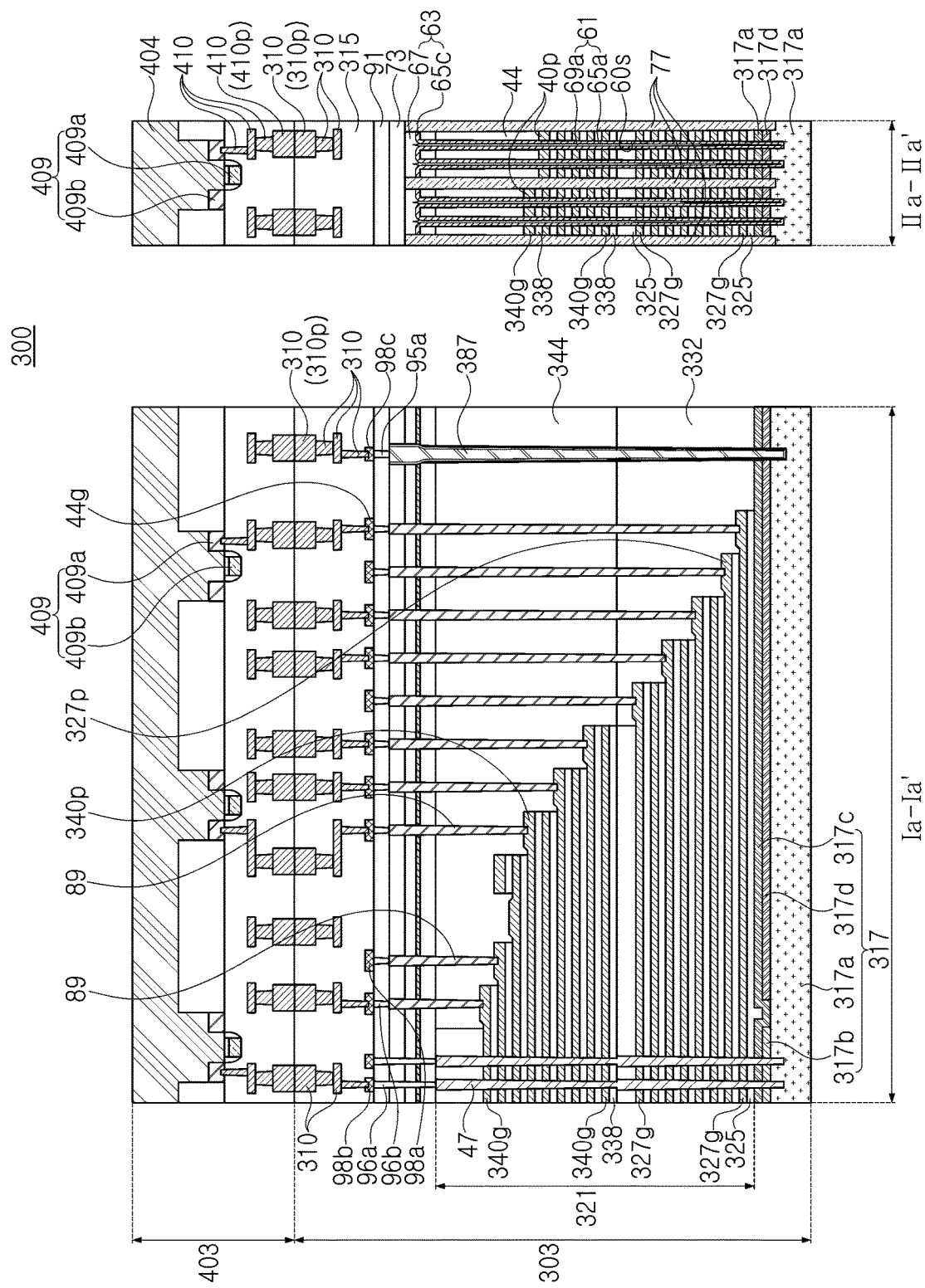
FIG. 14 is a diagram illustrating a modified example of a semiconductor device according to an example embodiment of the present disclosure.

In the description below, a modified example of a semiconductor device according to an example embodiment of the present disclosure will be described with reference to FIG. 14. In FIG. 14, region Ia-Ia' may be a cross-sectional region illustrating a region taken in a first horizontal direction, and region IIa-IIa' may be a cross-sectional region illustrating a region taken in a second horizontal direction perpendicular to the first horizontal direction.

Referring to FIG. 14, the semiconductor device 300 according to an example embodiment of the present disclosure may include a lower structure 303 and an upper structure 403 overlapping in a vertical direction. The lower structure 303 may be a memory semiconductor chip, and the upper structure 403 may be a logic semiconductor chip.

The lower structure 303 may include a pattern structure 317 and a structure 321 on the pattern structure 317. The pattern structure 317 may include first, second, third and fourth pattern layers 317a, 317b, 317c and 317d corresponding to the first to fourth pattern layers 17a to 17d described with reference to FIGS. 1 to 2C, respectively.

The structure 321 may have substantially the same structure as that of a portion of the second structure 21' other than the through regions TA, described with reference to FIGS. 1 to 2C. For example, the structure 321 may include a stack structure including gate layers 327g and 340g and interlayer insulating layers 325 and 338 alternately stacked. The gate layers 327g and 340g may include gate pads 327p and 340p substantially the same as the examples described with reference to FIGS. 1 to 2C. The structure 221 may include first and second intermediate insulating layers 332 and 344 corresponding to those described with reference to FIGS. 1 to 2C.

The lower structure 303 may further include the first upper insulating layer 58, the capping layer 63, the second upper insulating layer 73, and the third upper insulating layer 91, which may be the same as the examples described with reference to FIGS. 1 to 2C.

The lower structure 303 may include the separation structures 77, the memory vertical structure 47, the support vertical structure 61, the gate contact plugs 89, the bit line contact plug 96a, and the gate upper plug 96b, which may be the same as the examples described with reference to FIGS. 1 to 2C. The lower structure 303 may further include a peripheral contact plug 387 substantially the same as the third peripheral contact plug 87c described with reference to FIGS. 1 to 2C. The lower structure 303 may further include a peripheral upper plug 95a substantially the same as the third peripheral upper plug 95c described with reference to FIGS. 1 to 2C.

The lower structure 303 may include wirings 98b, 98a, and 98c in contact with and electrically connected to the bit line contact plug 96a, the gate upper plug 96b, and the peripheral upper plug 95a, respectively.

The lower structure 303 may include a capping insulating structure 315 on the third upper insulating layer 91 and a lower bonding wiring structure 310 electrically connected to the wirings 98b, 98a, and 98c in the capping insulating structure 315. The lower bonding wiring structure 310 may further include lower bonding pads 310p.

The upper structure 403 may include a semiconductor substrate 404, a peripheral circuit 409 disposed between the semiconductor substrate 404 and the lower structure 303, and an upper bonding wiring structure 410 disposed between the peripheral circuit 409 and the lower structure 303. The upper bonding wiring structure 410 may include upper bonding pads 410p. The peripheral circuit 409 may include peripheral devices such as a transistor including a peripheral gate 409a and a peripheral source/drain 409b. The lower bonding pads 310p of the lower bonding wiring structure 310 may be in contact with the upper bonding pads 410p of the upper bonding wiring structure 410. The lower bonding pads 310p and the upper bonding pads 410p may include a copper material.

Figure 15:
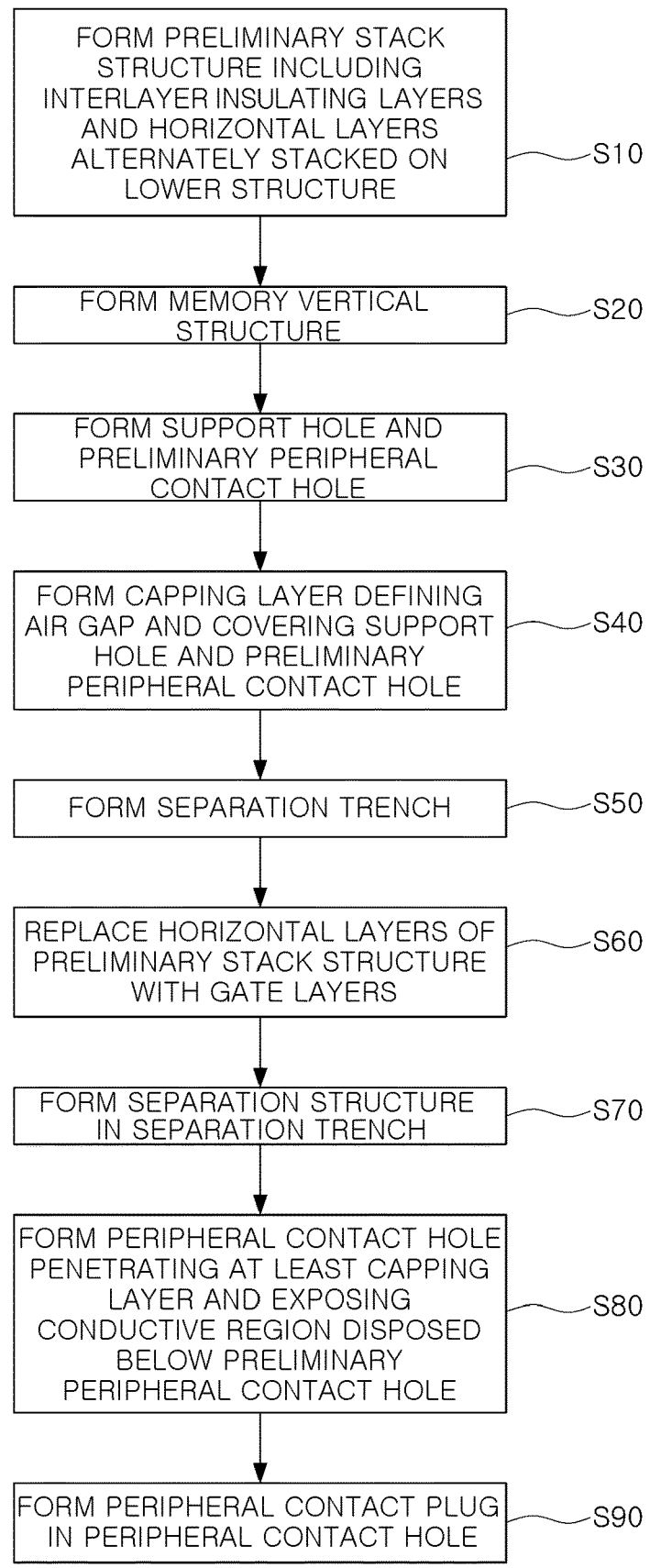
FIG. 15 is a flowchart illustrating a method of manufacturing a semiconductor device according to an example embodiment of the present disclosure.

An example of a method of forming a semiconductor device according to an example embodiment of the present disclosure will be described with reference to FIG. 15. FIG. 15 is a flowchart illustrating a method of forming a semiconductor device according to an example embodiment of the present disclosure.

Referring to FIG. 15, a preliminary stack structure including interlayer insulating layers and mold layers alternately stacked on a lower structure may be formed (S10). A memory vertical structure may be formed (S20). The memory vertical structure may penetrate the preliminary stack structure and may be in contact with the lower structure. A support hole and a lower peripheral contact hole may be formed (S30). The support hole and the lower peripheral contact hole may penetrate the preliminary stack structure and may expose the lower structure. A capping layer defining the air gap and covering the support hole and the lower peripheral contact hole may be formed (S40). A separation trench may be formed (S50). The separation trench may expose side surfaces of the mold layers of the preliminary stack structure. The mold layers of the preliminary stack structure may be replaced with gate layers (S60). A separation structure may be formed in the separation trench (S70). A peripheral contact hole penetrating at least the capping layer and exposing a conductive region disposed below the lower peripheral contact hole may be formed (S80). A peripheral contact plug may be formed in the peripheral contact hole (S90).

Figure 16A:
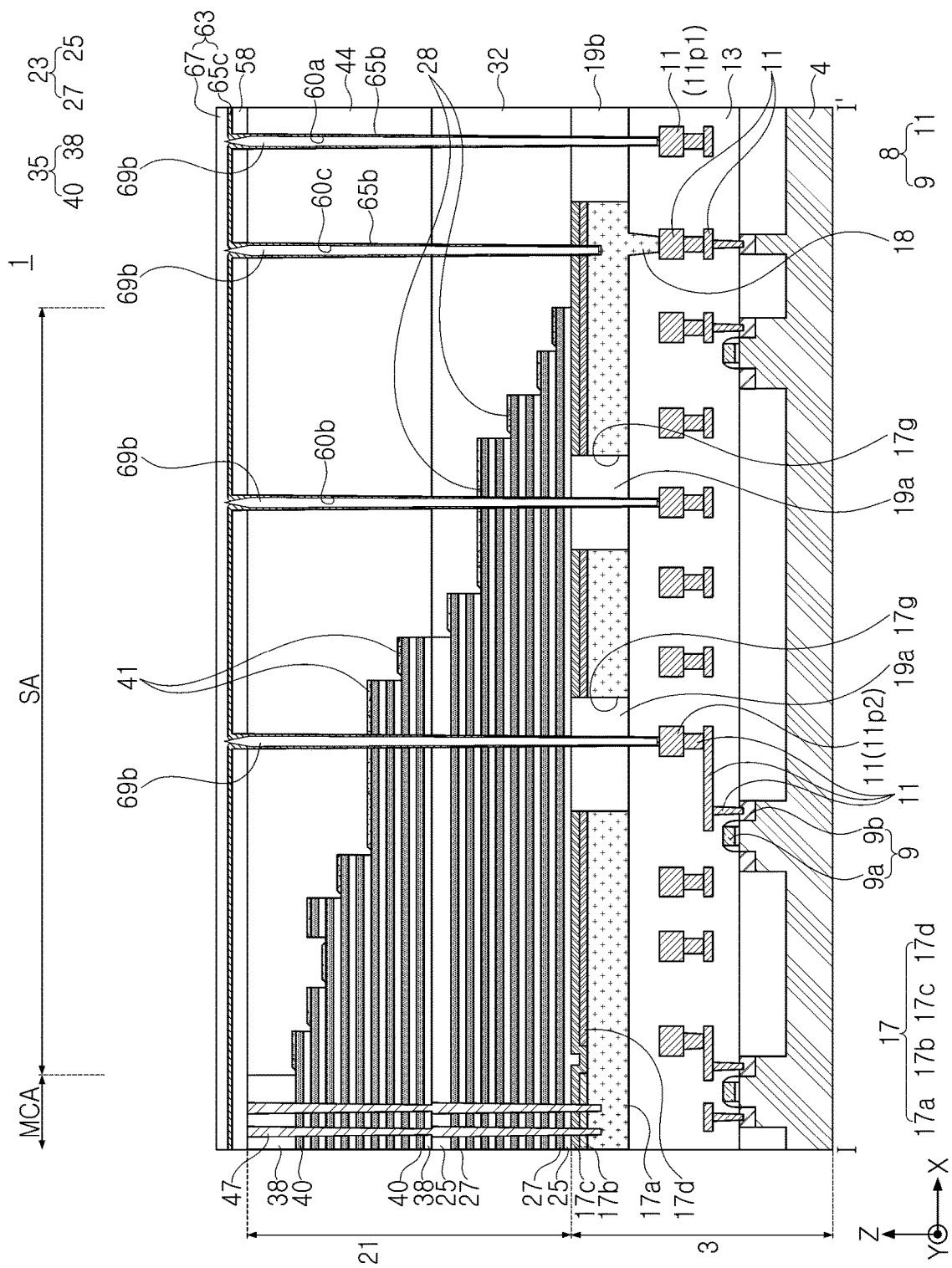
FIGS. 16A, 16B and 16C are cross-sectional diagrams illustrating a method of manufacturing a semiconductor device according to an example embodiment of the present disclosure.
Figure 16B:
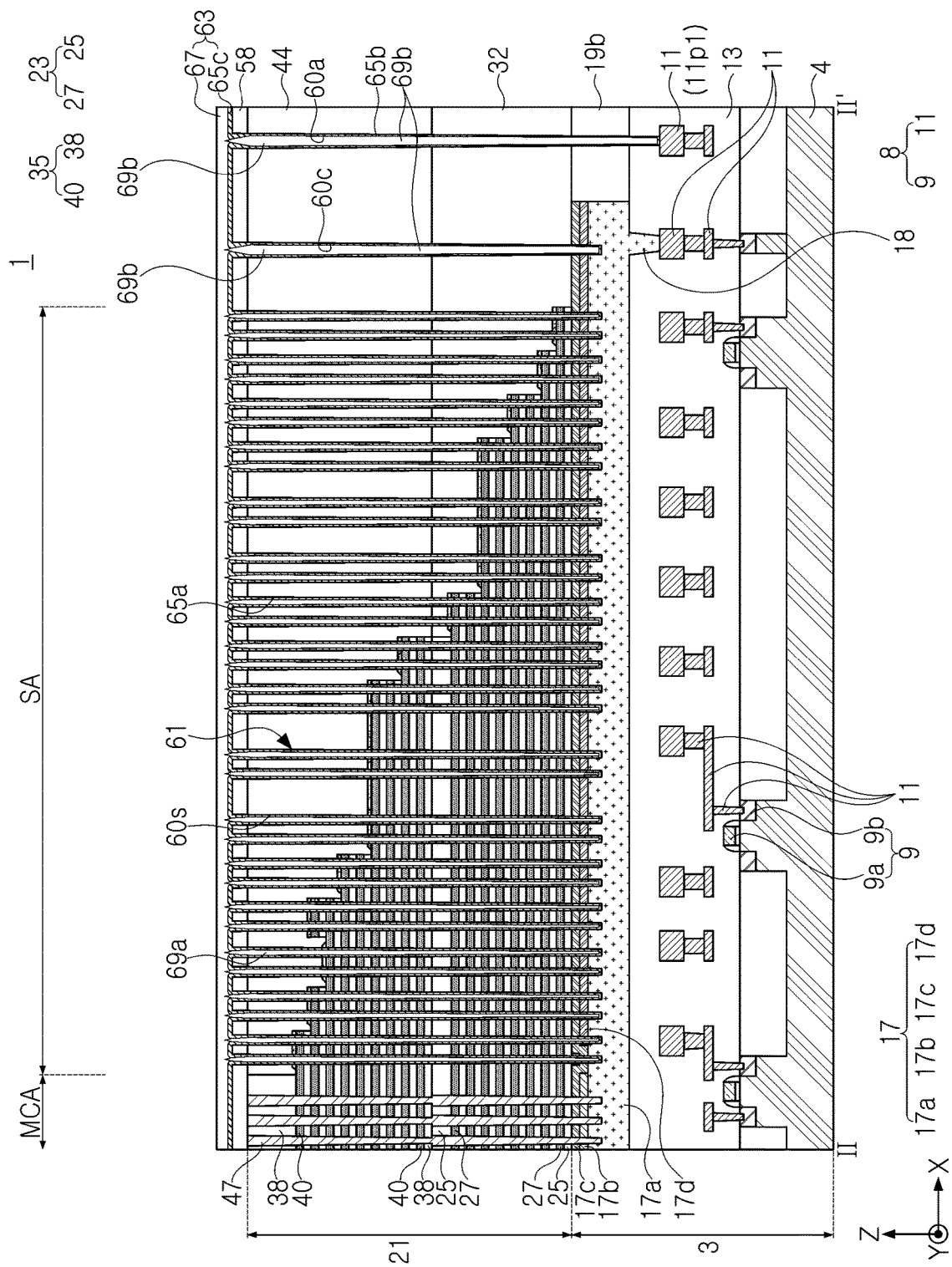
Figure 16C:
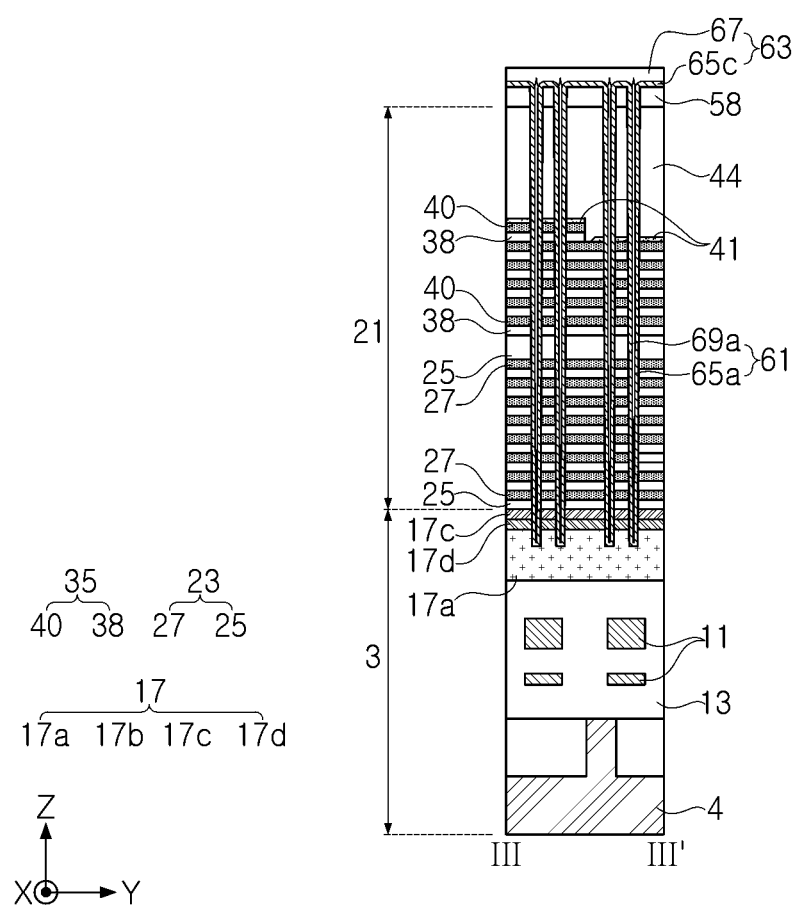

In the description below, an example of the method of forming the semiconductor device 1 described above with reference to FIGS. 1 to 2C will be described with reference to FIGS. 16A to 16C together with FIG. 15. In FIGS. 16A to 16C, FIG. 16A is a cross-sectional diagram illustrating region taken along line I-I' in FIG. 1, FIG. 16B is a cross-sectional diagram illustrating a region taken along line II-II' in FIG. 1, and FIG. 16C is a cross-sectional diagram illustrating a region taken along line III-III' in FIG. 1.

Referring to FIGS. 1, 15 and 16A to 16C, a lower structure 3 may be formed. The forming the lower structure 3 may include forming a peripheral circuit 8 on a semiconductor substrate 4 and a lower insulating layer 13 covering the peripheral circuit 8, forming a preliminary pattern structure 17 having gaps 17g on the lower insulating layer 13, and internal and external insulating layers 19a and 19b filling the gaps 17g and disposed on an external side surface of the preliminary pattern structure 17. The peripheral circuit 8 may include a circuit device 9 such as a transistor including a peripheral gate 9a and a peripheral source/drain 9b, and a circuit interconnection 11 electrically connected to the circuit device 9. A portion of the circuit interconnection 11 may be first and second peripheral circuit pads 11p1 and 11p2.

The forming the preliminary pattern structure 17 may include forming a first pattern layer 17a, forming a first preliminary intermediate pattern layer 17b and a second preliminary intermediate pattern layer 17d spaced apart from each other on the first pattern layer 17a, and forming a third pattern layer 17c covering the first preliminary intermediate pattern layer 17b and the second preliminary intermediate pattern layer 17d on the first pattern layer 17a. The first and third pattern layers 17a and 17c may be formed of a silicon layer. Each of the first preliminary intermediate pattern layer 17b and the second intermediate pattern layer 17d may include a plurality of layers stacked in order, such as, for example, a silicon oxide layer, a silicon nitride layer, and a silicon oxide layer stacked in order.

The internal and external insulating layers 19a and 19b may include an internal insulating layer 19a filling the gaps 17g and an external insulating layer 19b formed on the external side surface of the preliminary pattern structure 17.

Preliminary stack structures 23 and 35 including interlayer insulating layers 25 and 38 and horizontal layers 27 and 40 alternately stacked on the lower structure 3 may be formed (S10). An insulating structure covering at least a portion of the preliminary stack structures 23 and 35 may be formed. The preliminary stack structures 23 and 35 and the insulating structure may form the preliminary upper structure 21. The insulating structure may include first and second insulating layers 32 and 44.

The forming of the preliminary upper structure 21 may include forming a first preliminary stack structure 23 on the preliminary pattern structure 17, forming a first insulating layer 32 covering a portion of the first preliminary stack structure 23 and the external insulating layer 19b, forming a second preliminary stack structure 35 on the first preliminary stack structure 23, and forming a second insulating layer 44 covering a portion of the second preliminary stack structure 35 and the first insulating layer 32.

The first preliminary stack structure 23 may include first interlayer insulating layers 25 and first horizontal layers 27 alternately stacked. The second preliminary stack structure 35 may include second interlayer insulating layers 38 and second horizontal layers 40 alternately stacked. The first and second interlayer insulating layers 25 and 38 may be formed of silicon oxide, and the first and second horizontal layers 27 and 40 may be formed of silicon nitride.

In an example embodiment of the present disclosure, on at least one side of the first preliminary stack structure 23, the first horizontal layers 27 may include pad regions arranged in a staircase shape. On at least one side of the second preliminary stack structure 35, the second horizontal layers 40 may include pad regions arranged in a staircase shape. In the preliminary upper structure 21, a region in which pad regions of the first and second horizontal layers 27 and 40 arranged in a staircase shape are disposed may be referred to as a staircase region SA, and a region in which the first and second horizontal layers 27 and 40 are disposed in a region adjacent to the staircase region SA may be referred to as a memory cell array region MCA.

In the example embodiment of the present disclosure, before forming the first insulating layer 32, first reinforcing horizontal layers 28 may be formed on regions of the first horizontal layers 27 arranged in a staircase shape. Before forming the second insulating layer 44, second reinforcing horizontal layers 41 may be formed on pad regions of the second horizontal layers 40 arranged in a staircase shape. The first and second reinforcing horizontal layers 41 may be formed of silicon nitride.

A memory vertical structure 47 may be formed (S20). The forming the memory vertical structure 47 may include forming a sacrificial vertical portion penetrating the first preliminary stack structure 23, forming the second preliminary stack structure 35, forming an upper channel hole penetrating the second preliminary stack structure 35 and exposing the sacrificial vertical portion, forming a lower channel hole by removing the sacrificial vertical portion exposed by the upper channel hole, and forming the memory vertical structure 47 in the lower and upper channel holes, before forming the second preliminary stack structure 35.

A first upper insulating layer 58 may be formed on the preliminary upper structure 21.

A support hole 60s and lower peripheral contact holes 60a, 60b, and 60c may be formed (S30). The support hole 60s and the lower peripheral contact holes 60a, 60b, and 60c may be simultaneously formed. The lower peripheral contact holes 60a, 60b, and 60c may include a first lower peripheral contact hole 60a, a second lower peripheral contact hole 60b, and a third preliminary peripheral contact hole 60c.

The support hole 60s may penetrate the first upper insulating layer 58 and the preliminary upper structure 21, and may expose the first pattern layer 17a of the preliminary pattern structure 17. The support hole 60s may penetrate at least a portion of the preliminary stack structures 23 and 35.

The first lower peripheral contact hole 60a may penetrate the first upper insulating layer 58, the insulating structure, and the external insulating layer 19b, may extend downwardly, may expose the first peripheral circuit pad 11p1.

The second lower peripheral contact hole 60b my penetrate the first upper insulating layer 58, the preliminary upper structure 21, and the internal insulating layer 19a, may extend downwardly, and may expose the second peripheral circuit pad 11p2.

The third lower peripheral contact hole 60c may penetrate the first upper insulating layer 58 and the preliminary upper structure 21, and may expose the first pattern layer 17a of the preliminary pattern structure 17.

A capping material layer defining the air gaps 69a and 69b and covering the support holes 60s and the lower peripheral contact holes 60a, 60b, and 60c may be formed (S40). In an example embodiment of the present disclosure, the forming of the capping material layer may include forming the first capping layer and the upper capping layer 67 in order. The first capping layer may cover internal walls of the support hole 60s and the lower peripheral contact holes 60a, 60b, and 60c, defining at least a portion of the air gaps 69a and 69b in the lower peripheral contact holes 60a, 60b, and 60c, and may cover an upper portion of the first upper insulating layer 58. The upper capping layer 67 may cover the support holes 60s and the lower peripheral contact holes 60a, 60b, and 60c on the first capping layer and may limit upper portions of the air caps 69a and 69b. The air gaps 69a and 69b may include a first air gap 69a and a second air gap 69b. The first air gap 69a may be limited by the first capping layer and the upper capping layer 67, and at least a portion of the first air gap 69a may be formed in the support hole 60s. The second air gap 69b may be limited by the first capping layer and the upper capping layer 67, and at least a portion of the second air gap 69b may be formed in each of the lower peripheral contact holes 60a, 60b, and 60c.

In the first capping layer, a portion of the first capping layer covering the internal wall of the support hole 60s may be a support layer 65a, a portion covering the lower peripheral contact holes 60a, 60b, and 60c may be a spacer layer 65b, and a portion covering an upper portion of the first upper insulating layer 58 may be a lower capping layer 65c. Accordingly, the support layer 65a, the spacer layer 65b, and the lower capping layer 65c may be integrated with each other. In an example embodiment of the present disclosure, the lower capping layer 65c and the upper capping layer 67 may form the capping layer 63.

In an example embodiment of the present disclosure, the first capping layer may be formed of a single layer or two or more layers. For example, the first capping layer may include silicon oxide covering the internal wall of the support hole 60s with a minimum thickness and may be formed to have a thick thickness on the support hole 60s. The first capping layer may include silicon oxide formed by an atomic layer deposition process. In another example, the forming the first capping layer may include forming a silicon oxide layer and forming a silicon nitride layer on the silicon oxide layer.

Referring back to FIGS. 1, 15, and 2A to 2C, a preliminary separation trench and a dam trench penetrating the capping layer 63, the first upper insulating layer 58 and the preliminary upper structure 21 (in FIGS. 16A to 16C), form a preliminary separation structure and a dam structure 71 filling the preliminary separation trench and the dam trench, respectively, and form a second upper insulating layer 73 on the capping layer 63.

The preliminary separation structure and the dam structure 71 may include an insulating material layer. For example, the forming of the preliminary separation structure and the dam structure 71 may include forming an insulating material layer (e.g., a silicon oxide layer and/or a silicon nitride layer, or the like) covering internal walls of the preliminary separation trench and the dam trench, and forming a polysilicon layer on the insulating material layer.

The first and second horizontal layers 27 and 40 limited by the dam structure 71 may be referred to as the first and second insulating horizontal layers 27i and 40i as described with reference to FIGS. 1 to 2C. Regions of the upper structure 21' in which the first and second insulating horizontal layers 27i and 40i are formed may be referred to as through regions TA.

Separation trenches 75 may be formed (S50). The forming of the separation trenches 75 may include forming an upper separation trench 75b penetrating the second upper insulating layer 73 and exposing the preliminary separation structure, and forming a lower separation trench 75a by removing the preliminary separation structure. Accordingly, each of the separation trenches 75 may include the lower separation trench 75a and the upper separation trench 75b. A width of the upper separation trench 75b may be greater than a width of the lower separation trench 75a. The upper separation trench 75b may be disposed on an upper surface of the capping layer 63.

In an example embodiment of the present disclosure, the second intermediate pattern layer 17d in the staircase region SA may be disposed between the separation trenches 75 and may not be exposed by the separation trenches 75.

In an example embodiment of the present disclosure, in the memory cell array region MCA, the separation trenches 75 may penetrate the first preliminary intermediate pattern layer 17b, and may expose the first intermediate pattern layer 17b. An empty space may be formed by etching a portion of the memory vertical structure 47 while etching the first intermediate pattern layer 17b, and a first intermediate pattern layer 17b' may be formed in the empty space. The intermediate pattern layer 17b' may be formed of a silicon layer, such as, for example, a polysilicon layer having N-type conductivity. Before exposing the first preliminary intermediate pattern layer 17b, sacrificial spacers may be formed on side surfaces of the preliminary stack structures 23 and 35 exposed by the separation trenches 75, and thereafter, the intermediate pattern layer 17b' may be formed, and the sacrificial spacer may be removed to expose side surfaces of the preliminary stack structures 23 and 35 (in FIGS. 16A to 16C).

Empty spaces may be formed by etching the first and second horizontal layers 27 and 40 (in FIGS. 16A-16C) of the preliminary stack structure 23 and 35 (in FIGS. 16A to 16C) exposed by the separation trenches 75, and first and second gate layers 27g and 40g may be formed in the empty spaces. The first preliminary stack structure 23 (in FIGS. 16A to 16C) may be formed as a first stack structure 23' including the first interlayer insulating layers 25 and the first gate layers 27g, and the second preliminary stack structure 35 (in FIGS. 16A to 16C) may be formed as a second stack structure 35' including the second interlayer insulating layers 38 and the second gate layers 40g. Accordingly, the preliminary upper structure 21 (in FIGS. 16A to 16C) may be formed as the upper structure 21' including the first and second stack structures 23' and 35'.

In an example embodiment of the present disclosure, before forming the first and second gate layers 27g and 40g in the empty spaces, the dielectric layer 57 described with reference to FIG. 2C may be conformally formed.

The forming of the first and second gate layers 27g and 40g in the empty spaces may include forming conductive material layers in the empty spaces and etching the conductive material layers.

Separation structures 77 may be formed in the separation trenches 75. In one example, the separation structures 77 may be formed of silicon oxide. In another example, the separation structures 77 may be formed to include a conductive pattern and an insulating layer covering a side surface of the conductive pattern.

In an example embodiment of the present disclosure, gate contact holes penetrating the second upper insulating layer 73, the capping layer 63, and the insulating structure, and exposing gate pads 27p and 40p of the first and second gate layers 27g and 40g in the staircase region SA may be formed.

Peripheral contact holes penetrating at least the capping layer 63 and exposing conductive regions disposed below the lower peripheral contact holes 60a, 60b, and 60c may be formed (S80). The forming the peripheral contact holes may include forming upper peripheral contact holes penetrating the second upper insulating layer 73 and the capping layer 63 and overlapping the lower peripheral contact holes 60a, 60b, and 60c, and exposing the first peripheral circuit pad 11p1, the second peripheral circuit pad 11p2, and the first pattern layer 17a of the preliminary pattern structure 17 by etching at least a portion of the spacer layer 65b in the lower peripheral contact holes 60a, 60b, and 60c disposed below the upper peripheral contact holes.

The upper peripheral contact holes may include a first upper peripheral contact hole, a second upper peripheral contact hole, and a third upper peripheral contact hole. The peripheral contact holes may include a first peripheral contact hole, a second peripheral contact hole, and a third peripheral contact hole. The first peripheral contact hole may include the first lower peripheral contact hole 60a and the first upper peripheral contact hole, the second peripheral contact hole may include the second peripheral contact hole 60a and the second upper peripheral contact hole, and the third peripheral contact hole may include the third lower peripheral contact hole 60c and the third upper peripheral contact hole.

Peripheral contact plugs 87a, 87b and 87c may be formed in the peripheral contact holes (S90). The peripheral contact plugs 87a, 87b, and 87c may include a first peripheral contact plug 87a in the first peripheral contact hole, a second peripheral contact plug 87b in the second peripheral contact hole, and a third peripheral contact plug 87c in the third peripheral contact hole.

Gate contact plugs 89 filling the gate contact holes may be formed. The gate contact plugs 89 may be formed simultaneously with the peripheral contact plugs 87a, 87b, and 87c. For example, the peripheral contact plugs 87a, 87b, and 87c and the gate contact plugs 89 may include plug patterns 87_2 and 89_2 and conductive liners 87_1 and 97_1 covering a side surface and a bottom surface of the plug patterns 87_2 and 89_2, respectively.

A third upper insulating layer 91 may be formed on the second upper insulating layer 73.

A bit line contact plug 96a electrically connected to the memory vertical structure 47, gate upper plugs 96b electrically connected to the gate contact plugs 89, and the first to third peripheral upper plugs 95a, 95b, and 95c electrically connected to the first to third peripheral contact plugs 87a, 87b, and 87c may be formed simultaneously. Each of the bit line contact plug 96a, the gate upper plugs 96b, and the first to third peripheral upper plugs 95a, 95b and 95c may include a plug pattern 95_2 and conductive liner 95_1 covering a bottom surface and a side surface of the plug pattern 95_2.

A bit line 98b electrically connected to the bit line contact plug 96a, gate connection wirings 98g electrically connected to the gate upper plugs 96b and the second peripheral upper contact plug 95b, a first peripheral wiring 98a electrically connected to the first peripheral upper plug 95a, and a second peripheral wiring 98c electrically connected to the third peripheral upper plug 95c may be formed simultaneously on the third upper insulating layer 91.

In the description below, a data storage system including the semiconductor device described in an example embodiment of the present disclosure will be described with reference to FIGS. 17, 18, and 19.

Figure 17:
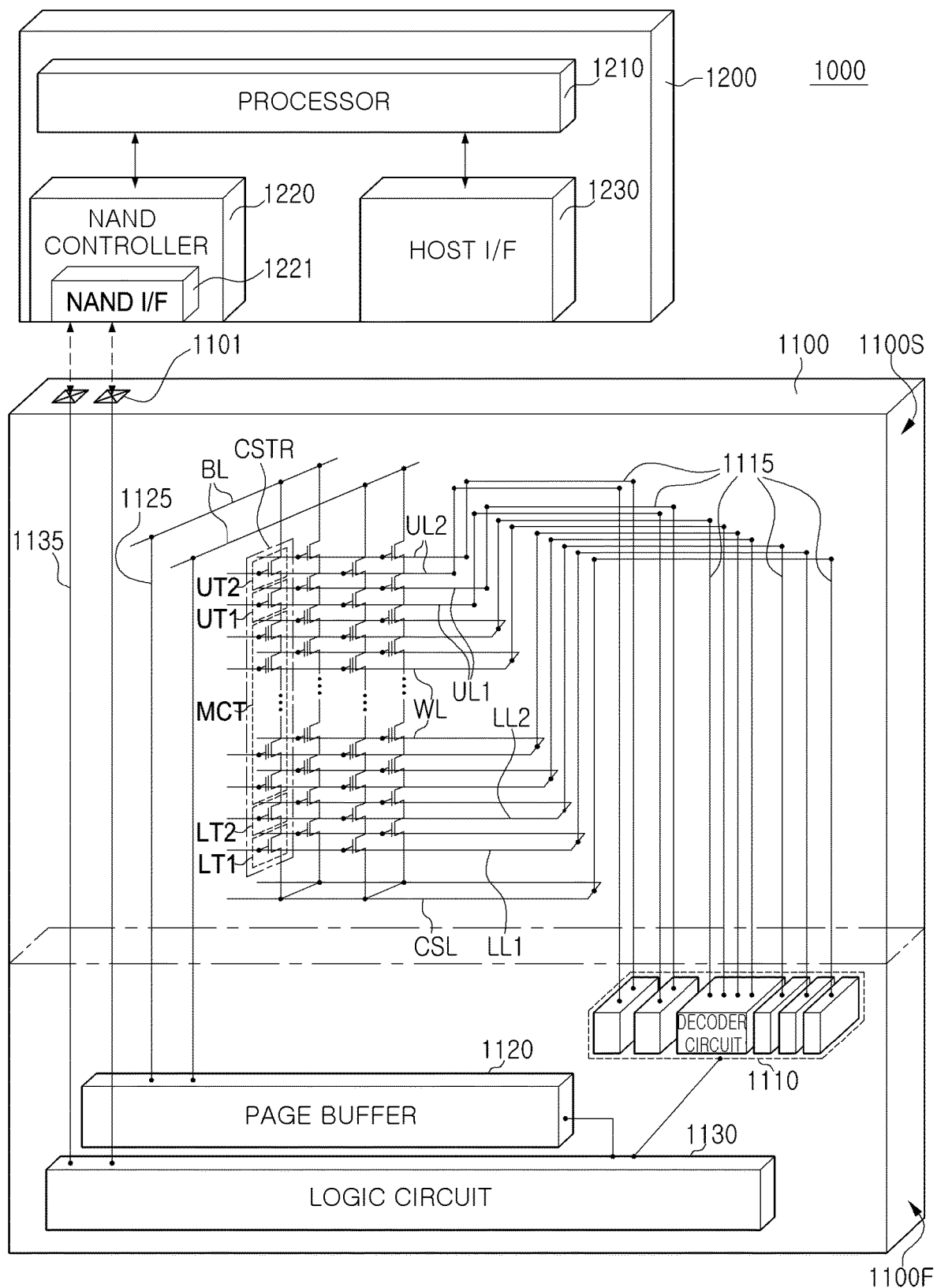
FIG. 17 is a diagram illustrating a data storage system including a semiconductor device according to an example embodiment of the present disclosure.

FIG. 17 is a diagram illustrating a data storage system including a semiconductor device according to an example embodiment of the present disclosure.

Referring to FIG. 11, a data storage system 1000 according to an example embodiment of the present disclosure may include a semiconductor device 1100 and a controller 1200 electrically connected to the semiconductor device 1100. The data storage system 1000 may be implemented as a storage device including the semiconductor device 1100 or an electronic device including a storage device. For example, the data storage system 1000 may be implemented as a solid state drive device (SSD) device including the semiconductor device 1100, a universal serial bus (USB), a computing system, a medical device, or a communication device.

In an example embodiment of the present disclosure, the data storage system 1000 may be implemented as an electronic system for storing data.

The semiconductor device 1100 may be the semiconductor device described in one of the aforementioned example embodiments described with reference to FIGS. 1 to 16C.

The semiconductor device 1100 may include a first structure 1100F and a second structure 1100S on the first structure 1100F.

The first structure 1100F may be configured as a peripheral circuit structure including a decoder circuit 1110, a page buffer 1120, and a logic circuit 1130. For example, the first structure 1100F may include the peripheral circuit 8 (in FIG. 2A).

The second structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

The pattern structure 17' (in FIGS. 2A to 2C) described above may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments. For example, only one lower transistor and only one upper transistor may be employed in an example embodiment of the present disclosure.

In example embodiments of the present disclosure, the upper transistors UT1 and UT2 may include string select transistors, and the lower transistors LT1 and LT2 may include ground select transistors. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

Among the first and second gate layers 27g and 40g described with reference to FIG. 5, the lower gate layers GL1 and GL2 may be the gate lower lines LL1 and LL2, at least a plurality of the intermediate gate layers GM may be the word lines WL, and the upper gate layers GU1 and GU2 may be the gate upper lines UL1 and UL2.

In example embodiments of the present disclosure, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation for erasing data stored in the memory cells using a gate induce drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F to the second structure 1100S.

In example embodiments of the present disclosure, lower gate layers GL1 and GL2 (in FIG. 2A) described above may be the gate lower lines LL1 and LL2, and the upper gate layers GU1 and GU2 (in FIG. 2A) may be the gate upper lines UL1 and UL2. A plurality of the intermediate gate layers GM (in FIG. 2A) may be the word lines WL.

The bit lines BL may be electrically connected to the page buffer 1120 through second connection wirings 1125 extending from the first structure 1100F to the second structure 1100S. The bit lines BL may be the bit lines 96b in FIGS. 2A and 2B described above.

In the first structure 1100F, the decoder circuit 1110 and the page buffer 1120 may perform a control operation on at least one select memory cell transistor among the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In example embodiments of the present disclosure, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communications with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 18:
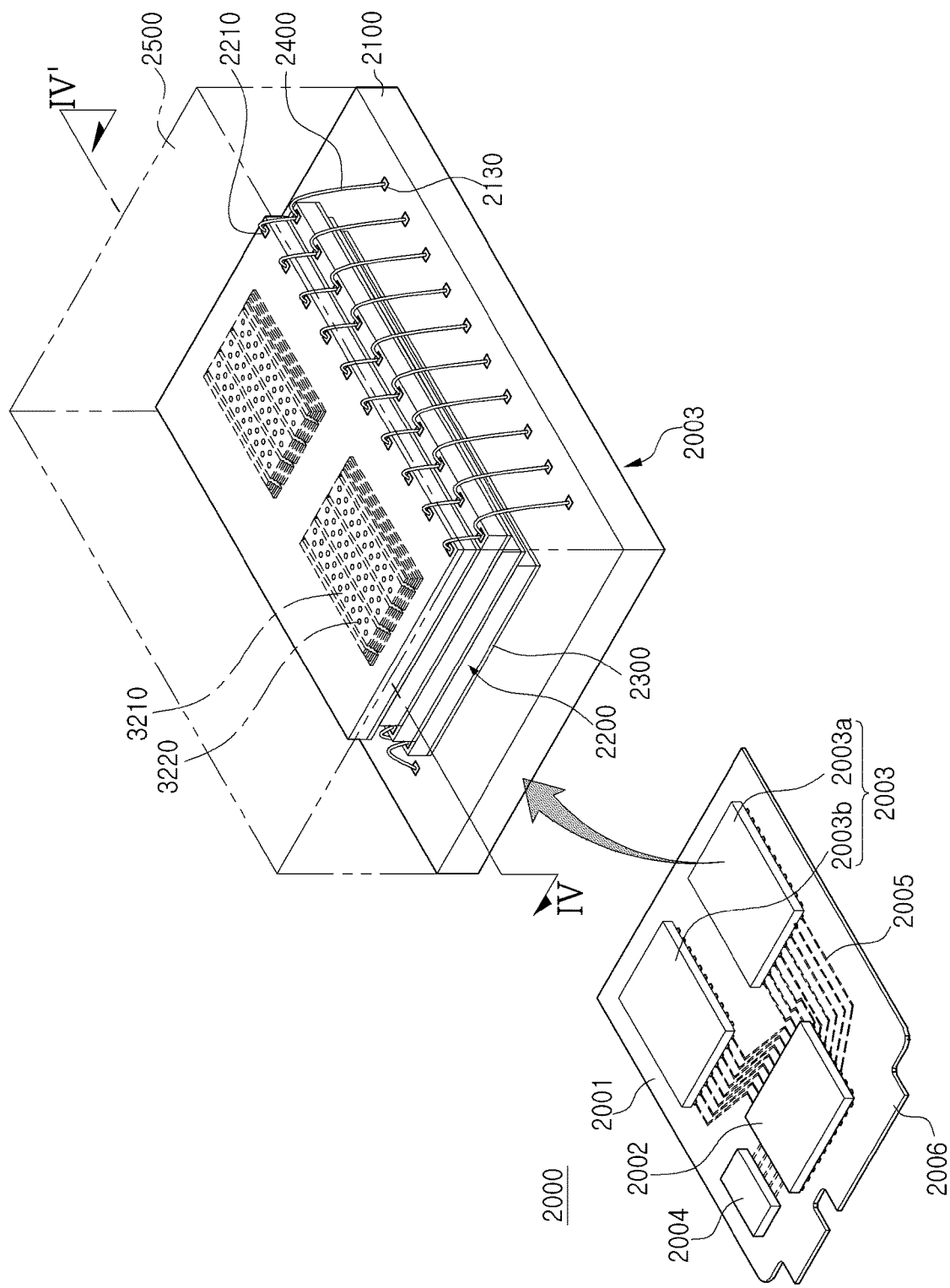
FIG. 18 is a perspective diagram illustrating a data storage system including a semiconductor device according to an example embodiment of the present disclosure.

FIG. 18 is a perspective diagram illustrating a data storage system including a semiconductor device according to an example embodiment of the present disclosure.

Referring to FIG. 18, a data storage system 2000 according to an example embodiment of the present disclosure may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main board 2001 may include a connector 2006 including a plurality of pins coupled to an external host. The number and the arrangement of the plurality of pins in the connector 2006 may be varied depending on a communication interface between the data storage system 2000 and the external host. In example embodiments of the present disclosure, the data storage system 2000 may communicate with the external host through one of interfaces such as a universal serial bus (USB), a peripheral component interconnect express (PCI-Express), a serial advanced technology attachment (SATA), and an M-phy for universal flash storage (UFS). In example embodiments of the present disclosure, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may increase an operation speed of the data storage system 2000.

The DRAM 2004 may be configured as a buffer memory for mitigating a difference in speeds between the semiconductor package 2003, which may be a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include a semiconductor device described in one of the aforementioned example embodiments described with reference to FIGS. 1 to 16C. More than two individual semiconductor packages may be included in the semiconductor package 2003.

Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input/output pad 2210.

In example embodiments of the present disclosure, the connection structure 2400 may be a bonding wiring electrically connecting the input/output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments of the present disclosure, in each of the first and second semiconductor packages 2003a and 2003b, the semiconductor chips 2200 may be electrically connected to each other by a connection structure including a through silicon via (TSV), instead of the connection structure 2400 of a bonding wire method.

In example embodiments of the present disclosure, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by wirings formed on the interposer substrate.

Figure 19:
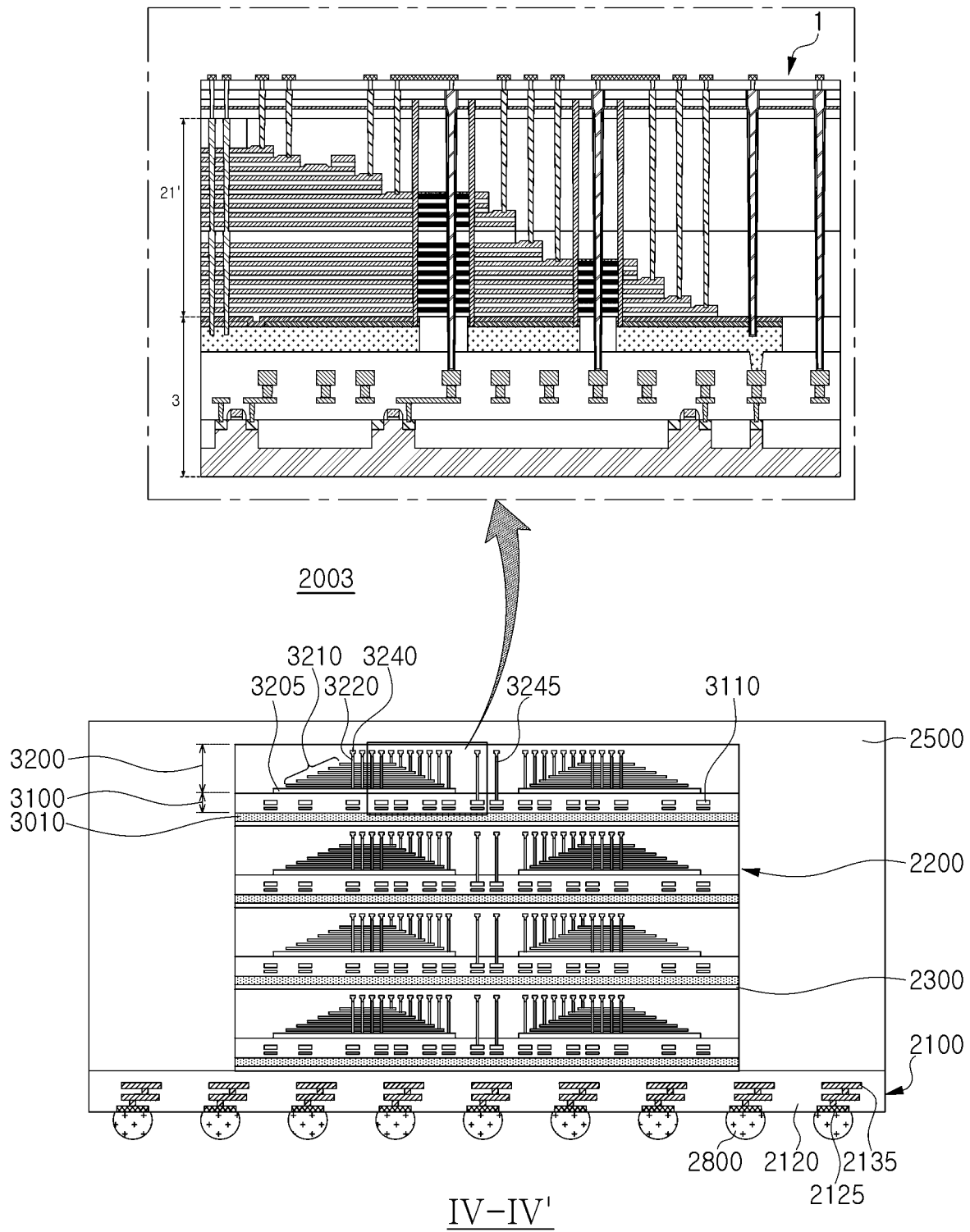
FIG. 19 is a cross-sectional diagram illustrating a data storage system including a semiconductor device according to an example embodiment of the present disclosure.

FIG. 19 is a cross-sectional diagram illustrating a data storage system including a semiconductor device according to an example embodiment of the present disclosure. FIG. 19 illustrates an example embodiment of the semiconductor package 2003 in FIG. 18, illustrating a cross-sectional region of the semiconductor package 2003 in FIG. 18 taken along line VI-VI'.

Referring to FIG. 19, in the semiconductor package 2003, the package substrate 2100 may be configured as a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000 through conductive connection portions 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures penetrating the gate stack structure 3210, bit lines 3240 electrically connected to the memory channel structures 3220, and gate connection wirings 98g (in FIG. 2A) electrically connected to the word lines WL of the gate stack structure 3210. The first structure 3100 may include the first structure 1100F in FIG. 17, and the second structure 3200 may include the second structure 1100S in FIG. 17.

Each of the semiconductor chips 2200 may include a through wiring 3245 electrically connected to the peripheral wirings 3110 of the first structure 3100 and extending into the second structure 3200. The through wiring 3245 may penetrate the gate stack structure 3210 and may be further disposed on an external side of the gate stack structure 3210.

Each of the semiconductor chips 2200 may further include an input/output connection wiring electrically connected to peripheral wirings 3110 of the first structure 3100 and extending into the second structure 3200, and an input/output pad 2210 electrically connected to the input/output connection wiring 3265.

In FIG. 19, the enlarged portion indicated by reference numeral "1" is provided to describe the example in which the semiconductor chips 2200 in FIG. 19 may be modified to have a cross-sectional structure as in FIG. 2A. Accordingly, each of the semiconductor chips 2200 may include the semiconductor device 1, 100, and 300 in one of the aforementioned example embodiments described with reference to FIGS. 1 to 16C.

According to the aforementioned example embodiments, a stable and reliable support vertical structure and a peripheral contact plug may be provided.

While the example embodiments of the present disclosure have been illustrated and described above, it will be apparent to those skilled in the art that modifications and variations could be made thereto without departing from the scope of the present disclosure as set forth by the appended claims.

What is claimed is:

1. A semiconductor device, including:
a first structure;
a second structure including a stack structure including a first stack structure on the first structure and a second stack structure on the first stack structure, and an intermediate insulating layer covering at least a portion of the stack structure;
an insulating structure on the second structure;
a memory vertical structure penetrating the second structure;
a support vertical structure penetrating the second structure and including an air gap and a support layer defining at least a lower portion and a sidewall of the air gap;
a peripheral contact plug penetrating the second structure; and
gate contact plugs,
wherein each of the first and second stack structures includes interlayer insulating layers and gate layers alternately stacked,
wherein the gate layers are spaced apart from each other in a vertical direction in a first region and include gate pads arranged in a second region adjacent to the first region,
wherein the gate contact plugs are electrically connected to the gate pads,
wherein the memory vertical structure penetrates the stack structure in the first region,
wherein the memory vertical structure includes a slope changing portion between an uppermost gate layer among the gate layers of the first stack structure and a lowermost gate layer among the gate layers of the second stack structure,
wherein the support vertical structure penetrates at least a portion of the gate layers in the second region,
wherein the air gap of the support vertical structure includes a portion disposed on the same level as the slope changing portion of the memory vertical structure,
wherein the peripheral contact plug is spaced apart from the gate layers,
wherein the peripheral contact plug includes an upper region disposed on a level higher than an upper surface of an uppermost gate layer among the gate layers of the stack structure and a lower region disposed on a level lower than the upper surface of the uppermost gate layer among the gate layers of the stack structure,
wherein the upper region of the peripheral contact plug includes a first portion, a second portion and a connection portion disposed between the first portion and the second portion, and
wherein a side of the connection portion has a slope different from a slope of at least one of a side of the first portion and a side of the second portion.

2. The semiconductor device of claim 1, wherein, among the gate contact plugs, a portion of the gate contact plug disposed on a level higher than the upper surface of the uppermost gate layer among the gate layers of the stack structure has a side-surface profile different from a side-surface profile of the upper region of the peripheral contact plug.

3. The semiconductor device of claim 2, wherein, among the gate contact plugs, a side of a portion of the gate contact plug disposed on a level higher than the upper surface of the uppermost gate layer among the gate layers of the stack structure is substantially vertical.

4. The semiconductor device of claim 1, wherein the gate contact plugs and the peripheral contact plug have upper surfaces coplanar with each other.

5. The semiconductor device of claim 1, wherein upper surfaces of the gate contact plugs are disposed on a level different from an upper surface of the peripheral contact plug.

6. The semiconductor device of claim 1,
wherein the insulating structure includes a lower capping layer extending from the support layer and an upper capping layer on the lower capping layer, and
wherein the support layer and the lower capping layer include an insulating material.

7. The semiconductor device of claim 1, wherein an upper end of the air gap is disposed on a level higher than an upper surface of the memory vertical structure.

8. The semiconductor device of claim 1, wherein an upper end of the air gap is disposed on a level lower than an upper surface of the uppermost gate layer among the gate layers of the stack structure.

9. The semiconductor device of claim 1, wherein, in the upper region of the peripheral contact plug, the first portion has a minimum width greater than a minimum width of the connection portion, and the second portion has a maximum width smaller than a maximum width of the connection portion.

10. The semiconductor device of claim 1, wherein, in the upper region of the peripheral contact plug, the first portion has a minimum width less than a maximum width of the connection portion, the second portion has a maximum width greater than a minimum width of the connection portion, and the maximum width of the second portion is greater than a maximum width of the first portion.

11. The semiconductor device of claim 1,
wherein the first structure further includes a semiconductor substrate, first and second peripheral circuit pads on the semiconductor substrate, and a pattern structure disposed on a level higher than the first and second peripheral circuit pads on the semiconductor substrate, and
wherein the memory vertical structure and the support vertical structure are in contact with the pattern structure.

12. The semiconductor device of claim 11,
wherein the pattern structure includes a first pattern layer, a second pattern layer on the first pattern layer, and a third pattern layer on the second pattern layer,
wherein the memory vertical structure penetrates the second and third pattern layers and extends into the first pattern layer;
wherein the memory vertical structure includes an insulating gap-fill layer, a channel layer covering a side and a bottom of the insulating gap-fill layer, a pad material layer in contact with the channel layer on the insulating gap-fill layer, and a data storage structure covering at least an external side of the channel layer,
wherein the data storage structure includes a first dielectric layer, a second dielectric layer, and a data storage layer between the first and second dielectric layers; and
wherein the second pattern layer penetrates the data storage structure and is in contact with the channel layer.

13. The semiconductor device of claim 12, wherein a lower surface of the peripheral contact plug is in contact with the first peripheral circuit pad.

14. The semiconductor device of claim 11,
wherein the gate contact plugs penetrate the gate pads and are in contact with the gate pads,
wherein lower surfaces of the gate contact plugs are in contact with the second peripheral circuit pads, and
wherein, among the gate contact plugs, a portion of the gate contact plug disposed on a level higher than the upper surface of the uppermost gate layer among the gate layers of the stack structure has a side profile substantially the same as a side profile of the upper region of the peripheral contact plug.

15. The semiconductor device of claim 1, further including:
a chip structure including a peripheral circuit, wherein the chip structure is disposed on the insulating structure.

16. The semiconductor device of claim 1, further including:
a bit line contact plug in contact with the memory vertical structure on the memory vertical structure,
wherein an upper surface of the bit line contact plug and an upper surface of the peripheral contact plug are coplanar with each other, and
wherein each of the bit line contact plug and the peripheral contact plug includes a plug pattern and a conductive liner covering a lower surface and a side surface of the plug pattern.

17. The semiconductor device of claim 1, wherein the peripheral contact plug includes a plug pattern, a conductive liner covering a lower surface and a side surface of the plug pattern, and a first air gap disposed in the plug pattern.

18. The semiconductor device of claim 17, further including:
a second air gap disposed on the first air gap in the plug pattern and spaced apart from the first air gap.

19. A semiconductor device, including:
a pattern structure including a silicon layer;
a stack structure including a first stack structure and a second stack structure on the first stack structure on the pattern structure, wherein each of the first and second stack structures includes interlayer insulating layers and gate layers alternately stacked, and in the first and second stack structures, the gate layers are vertically stacked and spaced apart from each other in a first region, and include gate pads arranged in a staircase shape in a second region adjacent to the first region;
an insulating structure on the stack structure;
separation structures penetrating the stack structure and extending in the insulating structure in the first region and the second region;
a memory vertical structure penetrating the stack structure between the separation structures in the first region;
a support vertical structure penetrating the stack structure and including an air gap between the separation structures in the second region;
gate contact plugs in contact with the gate pads;
a peripheral contact plug spaced apart from the gate layers; and
bit line contact plugs on the memory vertical structure,
wherein the peripheral contact plug includes an upper region disposed on a level higher than an upper surface of an uppermost gate layer among the gate layers of the stack structure and a lower region disposed on a level lower than the upper surface of the uppermost gate layer among the gate layers of the stack structure,
wherein the upper region of the peripheral contact plug includes a first portion, a connection portion disposed below the first portion, and a second portion disposed below the connection portion, wherein a side of the connection portion has a slope different from a slope of at least one of a side of the first portion and the second portion, wherein a side of the memory vertical structure includes a slope changing portion in which a slope of the side of the memory vertical structure changes on a level between an uppermost gate layer among the gate layers of the first stack structure and a lowermost gate layer among the gate layers of the second stack structure, and wherein a side of the lower region of the peripheral contact plug is substantially vertical on the level between the uppermost gate layer among the gate layers of the first stack structure and the lowermost gate layer among the gate layers of the second stack structure.

20. A data storage system, including:
a main board;
a semiconductor device on the main board; and
a controller electrically connected to the semiconductor device on the main board,
wherein the semiconductor device includes:
  a pattern structure including a silicon layer;
  a stack structure including a first stack structure and a second stack structure on the first stack structure on the pattern structure, wherein each of the first and second stack structures includes interlayer insulating layers and gate layers alternately stacked, and in the first and second stack structures, the gate layers are vertically stacked and spaced apart from each other in a first region, and include gate pads arranged in a staircase shape in a second region adjacent to the first region;
  an insulating structure on the stack structure;
  separation structures penetrating the stack structure and extending into the insulating structure in the first region and the second region;
  a memory vertical structure penetrating the stack structure between the separation structures in the first region;
  a support vertical structure penetrating the stack structure and including an air gap between the separation structures in the second region;
  gate contact plugs in contact with the gate pads;
  a peripheral contact plug spaced apart from the gate layers; and
  bit line contact plugs on the memory vertical structure,
wherein the peripheral contact plug includes an upper region disposed on a level higher than an upper surface of an uppermost gate layer among the gate layers of the stack structure and a lower region disposed on a level lower than the upper surface of the uppermost gate layer among the gate layers of the stack structure,
wherein the upper region of the peripheral contact plug includes a first portion, a connection portion disposed below the first portion, and a second portion disposed below the connection portion,
wherein a side of the connection portion has a slope different from a slope of at least one of a side of the first portion and a side of the second portion,
wherein a side of the memory vertical structure includes a slope changing portion on a level between an uppermost gate layer among the gate layers of the first stack structure and a lowermost gate layer among the gate layers of the second stack structure, and
wherein a side of the lower region of the peripheral contact plug is substantially vertical on the level between the uppermost gate layer among the gate layers of the first stack structure and the lowermost gate layer among the gate layers of the second stack structure.

* * * * *